United States Patent
Kato et al.

(10) Patent No.: US 7,928,457 B2
(45) Date of Patent: Apr. 19, 2011

(54) MEMBER FOR SEMICONDUCTOR LIGHT EMITTING DEVICE AND METHOD FOR MANUFACTURING SUCH MEMBER, AND SEMICONDUCTOR LIGHT EMITTING DEVICE USING SUCH MEMBER

(75) Inventors: Hanako Kato, Kitakyushu (JP); Yutaka Mori, Kitakyushu (JP); Hiroshi Kobayashi, Kitakyushu (JP); Tsubasa Tomura, Kitakyushu (JP); Masanori Yamazaki, Yokohama (JP); Mari Abe, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 399 days.

(21) Appl. No.: 12/067,859

(22) PCT Filed: Sep. 22, 2006

(86) PCT No.: PCT/JP2006/318868
§ 371 (c)(1),
(2), (4) Date: May 1, 2008

(87) PCT Pub. No.: WO2007/034919
PCT Pub. Date: Mar. 29, 2007

(65) Prior Publication Data
US 2009/0045422 A1 Feb. 19, 2009

(30) Foreign Application Priority Data
Sep. 22, 2005 (JP) ................. 2005-276756

(51) Int. Cl.
*H01L 29/10* (2006.01)

(52) U.S. Cl. .......................................... 257/98; 428/29

(58) Field of Classification Search ............... 257/98; 438/29
See application file for complete search history.

(56) References Cited

U.S. PATENT DOCUMENTS
2005/0022697 A1  2/2005  Benrashid et al.

FOREIGN PATENT DOCUMENTS
| JP | 4 89871 | 3/1992 |
| JP | 6 314816 | 11/1994 |
| JP | 2000 198930 | 7/2000 |
| JP | 2000 299503 | 10/2000 |

(Continued)

OTHER PUBLICATIONS
U.S. Appl. No. 11/816,640, filed Aug. 20, 2007, Kato, et al.

*Primary Examiner* — Howard Weiss
*Assistant Examiner* — Steven H Rao
(74) *Attorney, Agent, or Firm* — Oblon, Spivak, McClelland, Maier & Neustadt, L.L.P.

(57) ABSTRACT

To provide novel semiconductor light-emitting device member superior in transparency, light resistance, and heat resistance and capable of sealing semiconductor light-emitting device and holding phosphor without generating cracks or peelings even after use for a long time, the member meets the following requirements: (1) comprising functional group forming hydrogen bond with hydroxyl group or oxygen in a metalloxane bond, on the surface of ceramic or metal, (2) maintenance rate of transmittance at 400 nm wavelength before and after left at 200° C. for 500 hours is between 80% to 110%, (3) no change is observed by visual inspection after irradiated with light having 380 nm to 500 nm wavelength, whose center wavelength is between 400 nm and 450 nm both inclusive, for 24 hours with 4500 W/m² illumination intensity at 436 nm wavelength, and (4) refractive index at 550 nm wavelength is 1.45 or larger.

19 Claims, 17 Drawing Sheets

FOREIGN PATENT DOCUMENTS

| | | |
|---|---|---|
| JP | 2001-279178 | 10/2001 |
| JP | 2002 33517 | 1/2002 |
| JP | 2002 203989 | 7/2002 |
| JP | 2003 197976 | 7/2003 |
| JP | 2004 231947 | 8/2004 |
| JP | 2004 359756 | 12/2004 |
| WO | WO 2004/107458 A2 | 12/2004 |

FIG. 48
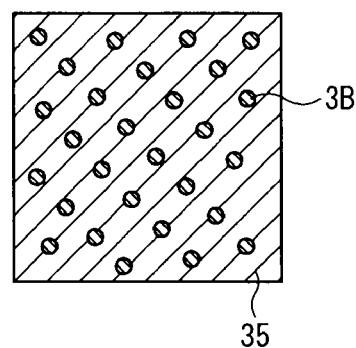
FIG. 49(a)
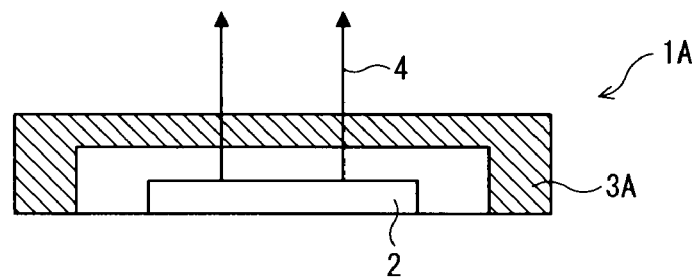
FIG. 49(b)
FIG. 50
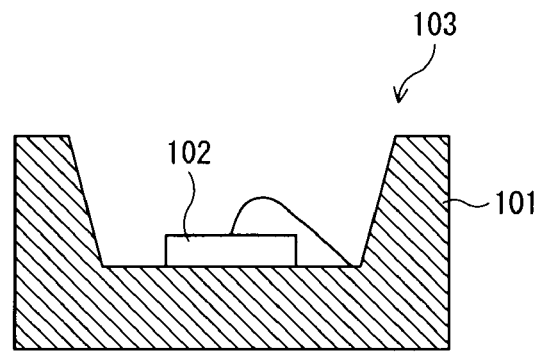

MEMBER FOR SEMICONDUCTOR LIGHT EMITTING DEVICE AND METHOD FOR MANUFACTURING SUCH MEMBER, AND SEMICONDUCTOR LIGHT EMITTING DEVICE USING SUCH MEMBER

TECHNICAL FIELD

The present invention relates to a novel semiconductor light-emitting device member, a producing method thereof, and a semiconductor light-emitting device using the same. More particularly, the present invention relates to a semiconductor light-emitting device member having high ultraviolet ray and heat resistance, as well as high refractive index, and excellent in transparency, adhesion, and also efficiency of extracting light, a producing method thereof, and a semiconductor light-emitting device using the same.

BACKGROUND ART

In a semiconductor light-emitting device such as a light-emitting diode (hereinafter abbreviated as "LED" when appropriate) and semiconductor laser, a semiconductor luminous element is generally sealed by a member (semiconductor light-emitting device member) made of transparent resin or the like.

Epoxy resin, for example, is used as the semiconductor light-emitting device member. It is also known that a luminous wavelength of the light emitted from the semiconductor luminous element is converted by making the sealing resin contain a pigment such as a phosphor.

However, due to high hygroscopicity of epoxy resin, there have been problems of cracks caused by heat from the semiconductor luminous element when the semiconductor light-emitting device is used for a long time and degradation of the phosphor and luminous element caused by moisture infiltration.

Also in recent years, as the luminous wavelength is shortened, there has been a problem of dramatic decrease in brightness of the semiconductor light-emitting device because epoxy resin degrades and colors when the device is turned on for a long time or used at a high output level.

In view of these problems, silicone resin, which is superior in heat resistance and ultraviolet ray resistance, has been used as a substitute for epoxy resin. However, silicone resin tends to be scratched because it is soft, and does not yet have sufficient adhesion, transparency, and light resistance. Meanwhile, inorganic sealants and semiconductor light-emitting devices using such sealants have been proposed as materials that excel in heat resistance and ultraviolet ray resistance (Refer, for example, to Patent Documents 1 to 5).

Patent Document 1: Japanese Patent No. 3275308
Patent Document 2: Japanese Patent Application Laid-Open No. 2003-197976
Patent Document 3: Japanese Patent Application Laid-Open No. 2004-231947
Patent Document 4: Japanese Patent Application Laid-Open No. 2002-33517
Patent Document 5: Japanese Patent Application Laid-Open No. 2002-203989

DISCLOSURE OF THE INVENTION

Problems to be Solved by the Invention

However, inorganic material such as molten glass has not been industrially realized because the treatment temperature is as high as 350° C. or more and thus luminous elements may be damaged.

Also, glass produced by a sol gel method has a problem of crack generation and peeling due to cure shrinkage when formed as a semiconductor light-emitting device member and no such kind of glass whose thick film state is stable for a long period of time has not yet been obtained.

For example, a technology for forming a glass material using tetrafunctional alkoxysilane is described in Patent Documents 1 and 2. However, as regards inorganic material obtained from the technology described in Patent Documents 1 and 2, a glass material obtained by coating a semiconductor light-emitting device with a hydrolyzing liquid of tetrafunctional alkoxysilane and curing for several hours at a mild cure temperature of about 150° C. that does not damage performance of the semiconductor light-emitting device was an incomplete glass body that usually contains 10 and several weight % or more of silanol. Thus, it has been impossible to obtain a glass body consisting entirely of the siloxane bond like molten glass, by the technology described in Patent Documents 1 and 2.

The reason is considered that, in contrast to general organic resin, inorganic material used in Patent Documents 1 and 2 has quite a lot of crosslinking points and therefore, constraints by structure are considerable and reactive ends cannot be condensed due to isolation. Since such a glass body is not fine and the surface thereof is in a very highly hydrophilic state like silica gel, the glass body does not have sufficient sealing properties.

Such less reactive silanol generally starts to decrease very slightly when heated up to 250° C. or higher and, by burning the inorganic material at a high temperature of normally 350° C. or higher and preferably 400° C. or higher, the amount of silanol can actively be reduced. However, even if an attempt is made to remove silanol from the inorganic material described in Patent Documents 1 and 2 using the above process, its realization is difficult because the heat-resistant temperature of a semiconductor light-emitting device is normally 260° C. or lower.

Further, since tetrafunctional alkoxysilane eliminates a large amount of components during dehydration/dealcoholization condensation, the rate of shrinkage during curing is substantially large. Moreover, tetrafunctional alkoxysilane has a tendency to start its curing, in the drying process, at a surface portion from which part of the diluent solvent has evaporated and form a hard gel body including the solvent before the internal solvent is discharged because it has high degree of crosslinking, leading to its large shrinkage amount accompanying the solvent evaporation. Thus, inorganic material described in Patent Documents 1 and 2 results in frequent crack generations due to large internal stress caused by shrinkage. Therefore, it has been difficult to obtain a large bulk body or thick film that is useful as a semiconductor light-emitting device member using only tetrafunctional alkoxysilane as a material.

Also, for example, a technology for producing a three-dimensional phosphor layer with good dimensional accuracy by sol gel method using a silane compound containing organic groups as a material is described in Patent Document 3. However, there is no detailed description of the degree of crosslinking in Patent Document 3, and high-concentration phosphor particles are required to obtain the inorganic material described in Patent Document 3. Moreover, if no phosphor is contained in the inorganic material, no thick-film glass-shape coating substance that is transparent and contains no cracks has been obtainable because these phosphor particles act substantially as an aggregate to maintain the three-dimensional shape.

Further, acetic acid is used as catalyst in the technology in Patent Document 3, but because acetic acid is not removed from the resultant inorganic material, acetic acid affects a semiconductor luminous element adversely. Also, when forming the inorganic material described in Patent Document 3, it is practically impossible to heat the inorganic material together with a semiconductor light-emitting device because a high temperature of 400° C. is needed for curing, and also distortion in its structure is accumulated due to impractical condensation at a high temperature and thus crack generation is not suppressed.

Also, for example, a technology for obtaining a semiconductor light-emitting device member by means of coating with an inorganic coating agent obtained by mixing an inorganic sol having silica or siloxane as its main component with an inorganic light scattering agent is described in Patent Document 4. However, the inorganic material described in Patent Document 4 requires an inorganic light scattering agent and further, Patent Document 4 provides no detailed description of the material and producing method thereof and thus it is impossible to correctly reproduce the technology.

Further, for example, a technology for obtaining a semiconductor light-emitting device member by means of coating with a sol gel method glass is described in Patent Document 5. However, as in Patent Document 3, a phosphor is required to obtain the inorganic material described in Patent Document 5. This phosphor acts as an aggregate and a resultant inorganic material is a thick film, but the film thickness does not exceed 100 μm. Further, Patent Document 5 provides no detailed description of the material and manufacturing method thereof and thus it is impossible to steadily reproduce the technology using general alkoxysilane.

Furthermore, high refractive index is another desired characteristics for a semiconductor light-emitting device member. A semiconductor illuminant has usually high refractive index (refractive index n of around 2.5) and most of its luminescence is totally reflected at the interface with the air (its n=1.0). Therefore, only a small portion of the luminescence can be taken to the outside because it is mostly absorbed in the illuminant. Here, as a transparent layer having refractive index that is intermediate between them is provided on the illuminant, the total reflection is eased and the light output is enhanced, which makes possible to realize a semiconductor light-emitting device with high brightness.

Conventionally, epoxy resin has been used for a semiconductor light-emitting device member because it excels in light extracting characteristics with refractive index n of around 1.55. However, since epoxy resin is likely to deteriorate due to shorter wavelength and higher output level of the luminous wavelength in recent years, it came to be difficult to be used and other resin that can substitute for epoxy resin has been desired.

However, if silicone resin or inorganic sealant such as glass made by the sol gel method is used, their refractive indexes n are as low as around 1.41 and therefore sufficient brightness can not be obtained. Meanwhile, a silicone resin having high refractive index n of around 1.53 has been developed by means of introducing a phenyl group. However, such type of resin is likely to suffer a degradation of the phenyl group or yellowing due to the interaction with curing catalyst, namely it is inferior in heat resistance. Though the glass made by the conventional sol gel method, in which the degree of crosslinking is not controlled, is relatively easy to heighten the refractive index, it is likely to suffer crack generations and peelings and therefore it can be usually formed just into a thin film, which can not lead to realize a useful semiconductor light-emitting device member.

As described above, attempts have been made to realize high-refractive index by introducing organic groups or inorganic oxide particles having high refractive indexes. However, a semiconductor light-emitting device member having not only high refractive index but high transparency, resistance to crack generations, adhesion, heat resistance and UV resistance in a well-balanced manner has not yet been found. With circumstances described above as a background, a semiconductor light-emitting device member having high refractive index and durability has been demanded.

The present invention has been made in view of the above problems. Namely, an object of the present invention is to provide a high-brightness semiconductor light-emitting device that is high in refractive index and thus excellent in efficiency of extracting light, a novel semiconductor light emitting device member which is superior in transparency, light resistance, and heat resistance, and in addition capable of sealing a semiconductor light-emitting device and holding a phosphor without causing cracks and peeling even after using the semiconductor light-emitting device for a long period of time.

Means for Solving the Problem

As a result of intensive investigation to achieve the above object, the inventors made a finding that a polymer that has a specific peak in the solid Si-nuclear magnetic resonance (hereinafter called "NMR" when appropriate) spectrum, whose total content of specific elements such as silicon is equal to or larger than a specific value and whose refractive index is within a specific range under a predetermined condition can be enhanced in efficiency of extracting light when used as a semiconductor light-emitting device member, be a thick film, make crack generation suppressed also in a thick film portion, and be superior in adhesion, heat resistance, and transparency. The finding led to the completion of the present invention.

Namely, the subject matter of the present invention lies in a semiconductor light-emitting device member, wherein (1) the semiconductor light-emitting device member comprises a functional group capable of forming a hydrogen bond with a hydroxyl group or an oxygen in a metalloxane bond, (2) the maintenance rate of transmittance with respect to the light having a wavelength of 400 nm before and after being left at temperature of 200° C. for 500 hours is 80% or more and 110% or less, (3) no change is observed by visual inspection after being irradiated with light having a wavelength range of longer than 385 nm and 500 nm or less, whose center wavelength is located at between 400 nm and 450 nm both inclusive, for 24 hours with illumination intensity of 4500 W/m$^2$ with respect to the wavelength of 436 nm, and (4) the refractive index with respect to the light having 550 nm wavelength is 1.45 or larger (claim 1).

Another subject matter of the present invention lies in a semiconductor light-emitting device member, wherein (5) in the solid Si-nuclear magnetic resonance spectrum, the semiconductor light-emitting device member comprises at least one peak selected from a group consisting of (i) a peak whose peak top position is in an area of a chemical shift of −40 ppm or more and 0 ppm or less, and whose half width is 0.3 ppm or more and 3 ppm or less, and (ii) a peak whose peak top position is in an area of a chemical shift of −80 ppm or more and less than −40 ppm, and whose half width is 0.3 ppm or more and 5 ppm or less, (4) the refractive index with respect to the light having 550 nm wavelength is 1.45 or larger, and (2) the maintenance rate of transmittance with respect to the light having a wavelength of 400 nm before and after being left at temperature of 200° C. for 500 hours is 80% or more and 110% or less (claim 2).

Still another subject matter of the present invention lies in a semiconductor light-emitting device member, wherein (5) in the solid Si-nuclear magnetic resonance spectrum, the semiconductor light-emitting device member comprises at least one peak selected from a group consisting of (i) a peak whose peak top position is in an area of a chemical shift of −40 ppm or more and 0 ppm or less, and whose half width is 0.3 ppm or more and 3 ppm or less, and (ii) a peak whose peak top position is in an area of a chemical shift of −80 ppm or more and less than −40 ppm, and whose half width is 0.3 ppm or more and 5 ppm or less, (4) the refractive index with respect to the light having 550 nm wavelength is 1.45 or larger, and (6) the silanol content is 0.01 weight % or more and 10 weight % or less (claim 3).

Still another subject matter of the present invention lies in a semiconductor light-emitting device member, wherein (5) in the solid Si-nuclear magnetic resonance spectrum, the semiconductor light-emitting device member comprises at least one peak selected from a group consisting of (i) a peak whose peak top position is in an area of a chemical shift of −40 ppm or more and 0 ppm or less, and whose half width is 0.3 ppm or more and 3 ppm or less, and (ii) a peak whose peak top position is in an area of a chemical shift of −80 ppm or more and less than −40 ppm, and whose half width is 0.3 ppm or more and 5 ppm or less, (4) the refractive index with respect to the light having 550 nm wavelength is 1.45 or larger, and (7) the total content of Pt and Rh is 0.1 ppm or less (claim 4).

In this case, the semiconductor light-emitting device member preferably comprises a plurality of the peaks (claim 5).

Also in the semiconductor light-emitting device member, (8) the total content of Si, Al, Zr, Ti, Y, Nb and B is preferably 20 weight % or more (claim 6).

Also in the semiconductor light-emitting device member, the light transmittance with respect to a luminous wavelength of a semiconductor light-emitting device, when the film thickness is 1.0 mm, is preferably 60% or more (claim 7).

Also, the semiconductor light-emitting device member preferably comprises inorganic particles (claim 8).

Still another subject matter of the present invention lies in a producing method of the above-mentioned semiconductor light-emitting device member, comprising: a process of drying a polycondensate obtained by performing hydrolysis and polycondensation of a compound represented by the following formula (1) and/or an oligomer thereof (claim 9).

[Chemical Formula 1]

$$M^{m+}X^n Y^1_{m-n} \quad (1)$$

wherein M represents at least one element selected from silicon, aluminum, zirconium, and titanium, X represents a hydrolyzable group, $Y^1$ represents a monovalent organic group, m represents an integer of 1 or larger representing the valence of M, and n represents an integer of 1 or larger representing the number of X groups, where m≧n.

Still another subject matter of the present invention lies in a producing method of the above-mentioned semiconductor light-emitting device member, comprising: a process of drying a polycondensate obtained by performing hydrolysis and polycondensation of a compound represented by the following formula (2) and/or an oligomer thereof (claim 10).

[Chemical Formula 2]

$$(M^{s+}X_t Y^1_{s-t-1})_u Y^2 \quad (2)$$

wherein M represents at least one element selected from silicon, aluminum, zirconium, and titanium, X represents a hydrolyzable group, $Y^1$ represents a monovalent organic group, $Y^2$ represents a u-valent organic group, s represents an integer of 1 or larger representing the valence of M, t represents an integer of 1 or larger and s-1 or smaller, and u represents an integer of 2 or larger.

In this producing method of the above-mentioned semiconductor light-emitting device member, the ratio of hydrolysis is preferably 80% or more and 500% or less (claim 11).

Also, in the producing method of the above-mentioned semiconductor light-emitting device member, the process of drying the obtained polycondensate preferably has a first drying process in which a solvent is substantially removed at a temperature below the boiling point of the solvent and a second drying process in which the polycondensate is dried at a temperature equal to or above the boiling point of the solvent (claim 12).

Also, the producing method of the above-mentioned semiconductor light-emitting device member preferably comprises a process of distilling off the solvent from the polycondensate before the polycondensate is dried (claim 13).

Also, in the producing method of the above-mentioned semiconductor light-emitting device member, the hydrolysis and polycondensation are preferably performed in the presence of a metal complex catalyst (claim 14).

Still another subject matter of the present invention lies in a semiconductor light-emitting device comprising at least the above-mentioned semiconductor light-emitting device member (claim 15).

Advantageous Effect of the Invention

A semiconductor light-emitting device member according to the present invention can be coated as a thick film compared with a conventional inorganic member for a semiconductor light-emitting device member, and is easily capable of sealing a semiconductor light-emitting device and holding a phosphor only by being coated on the semiconductor light-emitting device and dried. In addition, because the semiconductor light-emitting device member is high in refractive index and transparent, a semiconductor light-emitting device having high brightness can be obtained. Furthermore, because the semiconductor light-emitting device member comprises mainly inorganic component, it is superior in light resistance and heat resistance, leading to no generation of cracks or peelings even after a long-time use.

BRIEF DESCRIPTION OF THE DRAWINGS

FIG. 3 shows Embodiment B-1.

FIG. 48 is an explanatory drawing of another configuration example of a substantial part of each Embodiment;
FIG. 49(*a*) and FIG. 49(*b*) are respectively explanatory drawings of basic concepts of each Embodiment;
and
FIG. 50 is a sectional view showing schematically a semiconductor light-emitting device for explaining the measurement of brightness improvement ratio, carried out in Examples and Comparative Examples of the present invention.

EXPLANATION OF LETTERS OR NUMERALS

Figure 1:
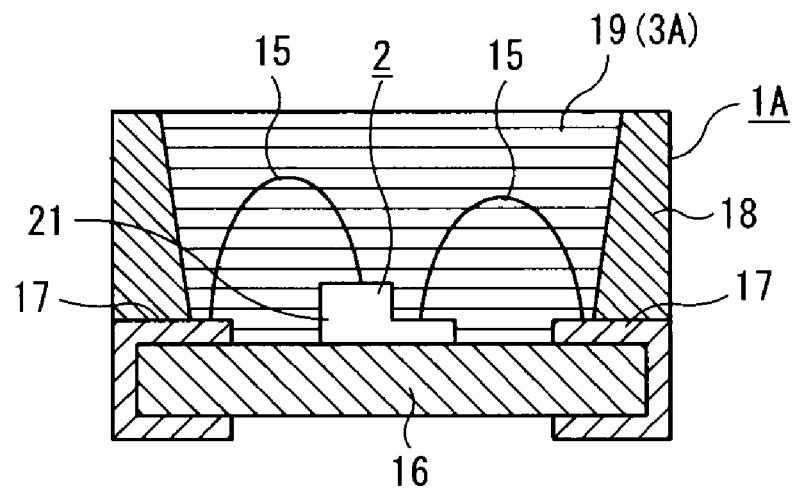
FIG. 1 is a schematic sectional view showing Embodiment A-1.

1, 1A, 1B Light emitting device (semiconductor light-emitting device)
2 Luminous element
3A Transparent member (semiconductor light-emitting device member)
3B Phosphor part (semiconductor light-emitting device member)
4*a*, 4*b* Part of light emitted from a luminous element
5 Light of wavelengths specific to light-emitting ions doped in a phosphor part
11 Mold part
12, 13 Lead terminal
14 Mirror (cup part)
15 Conductive wire
16 Insulating substrate
16*a* Hollow
17 Printed wiring
18 Frame
19 Sealing part
19*a* Sealing function part
19*b* Lens function part
19*c* Recess
19*d* Through-hole
21 Luminous layer part
23 Reflecting layer
24 Bump
33, 34 Phosphor part
35 Solid medium
101 Cup
102 LED chip
103 LED element

BEST MODES FOR CARRYING OUT THE INVENTION

The present invention will be described in detail below, but it is to be understood that the present invention is not limited to the embodiments shown below and any modification can be added thereto insofar as they do not depart from the scope of the present invention.

[I. Semiconductor Light-emitting Device Member]
A first semiconductor light-emitting device member of the present invention has features (1) to (4) shown below:

(1) The semiconductor light-emitting device member comprises a functional group capable of forming a hydrogen bond with a hydroxyl group or an oxygen in a metalloxane bond.

(2) The maintenance rate of transmittance of light having a wavelength of 400 nm before and after being left at temperature of 200° C. for 500 hours is 80% or more and 110% or less.

(3) No change is observed by visual inspection after being irradiated with light having a wavelength range of longer than 385 nm and 500 nm or less, whose center wavelength is located at between 400 nm and 450 nm both inclusive, for 24 hours with illumination intensity of 4500 W/m$^2$ with respect to the wavelength of 436 nm.

(4) The refractive index with respect to the light having 550 nm wavelength is 1.45 or larger.

A second semiconductor light-emitting device member of the present invention has features (2) and (4) shown above and (5) shown below:

(5) in the solid Si-NMR spectrum, the semiconductor light-emitting device member comprises at least one peak selected from a group consisting of
  (i) a peak whose peak top position is in an area of a chemical shift of −40 ppm or more and 0 ppm or less, and whose half width is 0.3 ppm or more and 3 ppm or less, and
  (ii) a peak whose peak top position is in an area of a chemical shift of −80 ppm or more and less than −40 ppm, and whose half width is 0.3 ppm or more and 5 ppm or less.

A third semiconductor light-emitting device member of the present invention has features (4) and (5) shown above and (6) shown below:

(6) The silanol content is 0.01 weight % or more and 10 weight % or less.

A fourth semiconductor light-emitting device member of the present invention has features (4) and (5) shown above and (7) shown below:

(7) The total content of Pt and Rh is 0.1 ppm or less.

Hereinafter, the features of first to fourth semiconductor light-emitting device members of the present invention will be explained, focusing on mainly the above features (1) to (7). In the following explanation, first to fourth semiconductor light-emitting device members of the present invention will be referred to simply as "semiconductor light-emitting device members of the present invention" when no distinction is made between them.

[I-1. Functional Group]

The semiconductor light-emitting device member of the present invention comprises a functional group capable of forming a hydrogen bond with a hydroxyl group or an oxygen in a metalloxane bond (feature (1)). A hydroxyl group and a metalloxane bond, listed above, are usually present on the surface of a ceramic or a metal. A container (such as a cup described later, hereinafter referred to as "container of semiconductor light-emitting device" as appropriate) for a semiconductor light-emitting device with high output level is usually formed of a ceramic or a metal. Also, a hydroxyl groups or a metalloxane bond usually exists on the surface of a ceramic and a metal. On the other hand, the semiconductor light-emitting device member of the present invention usually comprises a functional group capable of forming a hydrogen bond with that hydroxyl group or an oxygen in that metalloxane bond. Therefore, the semiconductor light-emitting device member of the present invention is superior in adhesion to the container of semiconductor light-emitting device due to the hydrogen bond.

Functional groups of the semiconductor light-emitting device member of the present invention that can be bound to the hydroxyl group or oxygen in the metalloxane bond through hydrogen bond include, for example, silanol and an alkoxy group. In this context, only one functional group or two or more types of functional groups may be used.

Whether the semiconductor light-emitting device member of the present invention has any functional group that can be bound to the hydroxyl group or oxygen in the metalloxane bond through hydrogen bond can be checked by a technique of spectroscopy such as the solid Si-NMR, solid $^1$H-NMR, infrared absorption spectrum (1R), and Raman spectrum.

[I-2. Heat Resistance]

The semiconductor light-emitting device member of the present invention is superior in heat resistance. That is, the semiconductor light-emitting device member of the present invention has a property that transmittance thereof with respect to light having a predetermined wavelength hardly varies when left under high temperature conditions. Specifically, before and after being left for 500 hours at temperature of 200° C., the semiconductor light-emitting device member of the present invention has the maintenance rate of transmittance with respect to the light having a wavelength of 400 nm of usually 80% or more, preferably 90% or more, and more preferably 95% or more, and usually 110% or less, preferably 105% or less, and more preferably 100% less (feature (2)).

The above ratio of variation can be calculated from the measurement value of the light transmittance, which can be measured in the same manner as the method of measuring the transmittance to be described later in [I-3. UV resistance] by means of measuring the light transmittance using an ultraviolet/visible spectrophotometer.

[I-3. Uv Resistance]

The semiconductor light-emitting device member of the present invention is superior in light resistance (UV (ultra violet rays) resistance). That is, the semiconductor light-emitting device member of the present invention has a property that no change is observed by visual inspection after being irradiated with light having a wavelength range of longer than 385 nm and 500 nm or less, whose center wavelength is located at between 400 nm and 450 nm both inclusive, for 24 hours with illumination intensity of 4500 W/m$^2$ with respect to the wavelength of 436 nm (feature (3)). "No change is observed by visual inspection" means that no change that can be recognized as a deterioration by ultraviolet rays, such as white turbidity, carbonization, yellowing and crack, by visual inspection. In addition, the semiconductor light-emitting device member of the present invention has a property that transmittance thereof with respect to the light having a predetermined wavelength hardly varies when irradiated with UV (ultraviolet rays). Specifically, before and after being irradiated with light whose center wavelength is 380 nm and radiant intensity is 0.4 kW/m$^2$ for 72 hours, the semiconductor light-emitting device member of the present invention has the maintenance rate of transmittance with respect to light whose wavelength is 400 nm of usually 80% or more, preferably 90% or more, and more preferably 95% or more, and usually 110% or less, preferably 105% or less, and more preferably 100% or less.

The above maintenance rate can be calculated from the measurement value of the light transmittance of the semiconductor light-emitting device member, which can be measured by the method described below.

Light transmittance of a semiconductor light-emitting device member can be measured by an ultraviolet spectrophotometer by a technique such as described below using a sample of singly cured film with a smooth surface, which is formed into a film shape having a thickness of 1 mm.

[Measurement of Transmittance]

Transmittance was measured using a singly cured film of a semiconductor light-emitting device member, with a smooth surface of about 1 mm in thickness and without scattering by defects or unevenness, by an ultraviolet spectrophotometer (UV-3100 manufactured by Shimadzu Corporation) at wavelengths of 200 nm to 800 nm.

[I-4. Refractive Index]

The refractive index of the semiconductor light-emitting device member of the present invention with respect to the light having 550 nm wavelength is usually 1.45 or higher, preferably 1.5 or higher, more preferably 1.55 or higher, still more preferably 1.6 or higher (feature (4)). There is no particular upper limit, but, since the refractive index of a general light-emitting device is about 2.5, it is usually 2.5 or lower. It is preferably 2.0 or lower from the standpoint of making the adjustment of refractive index easier. When the refractive index of the semiconductor light-emitting device member is too low, the efficiency of extracting light may not be improved in comparison with existing semiconductor light-emitting device member. On the other hand, when the refractive index of the semiconductor light-emitting device member is higher than that of the light-emitting device, the efficiency of extracting light is not improved, either.

[Method of Refractive Index Measurement]

Refractive index can be measured by known methods such as liquid immersion method (used for solid), method using Pulflich's refractometer or Abbe refractometer, prism coupler method, interference method and minimum declination angle method. The wavelength of refractive index measurement of the present invention is 550 nm, which is in the central region of visible light. Sodium D line (589 nm), which is used generally when the measurement is made with an instrument such as Abbe refractometer, can also be adopted. Although refractive index varies depending on wavelength, the variation in refractive index of transparent substances between 550 nm and 589 nm is as small as 0.002 independently of individual substances, and measurements at 589 nm and at 550 nm, of wavelength of a light source, give equivalent results.

[I-5. Solid Si-nmr Spectrum]

A compound having silicon as its main component is represented by a rational formula of $SiO_2 \cdot nH_2O$ and has a structure in which an oxygen atom O is bound to each vertex of a tetrahedron of a silicon atom Si and further another silicon atom Si is bound to each of these oxygen atoms O to spread like a network. Pattern diagrams shown below represent the network structure of Si—O without showing the above tetrahedron structure and part of oxygen atoms O is substituted by other components (for example, —H and —$CH_3$) in a repetitive unit of Si—O—Si—O—. If focused on one silicon atom Si, there is a silicon atom Si ($Q^4$) having four —OSi as shown in the pattern diagram (A), a silicon atom Si ($Q^3$) having three —OSi as shown in the pattern diagram (B) and the like. Then, in solid Si-NMR measurement, peaks based on each of the above silicon atoms Si are in order called a $Q^4$ peak, $Q^3$ peak, and so on.

[Chemical Formula 3]

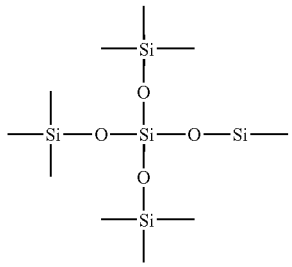

(A)

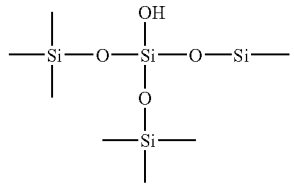

(B)

These silicon atoms with four bound oxygen atoms are generally called a Q site. In the present invention, each peak of $Q^0$ to $Q^4$ originating from a Q site will be called a $Q''$ peak group. A $Q''$ peak group of a silica membrane containing no organic substituent is usually observed as a continuous multimodal peak in an area of a chemical shift of −80 to −130 ppm.

In contrast, a silicon atom having three bound oxygen atoms and one other bound atom (usually a carbon atom) is generally called a T site. Like a peak originating from a Q site, a peak originating from a T site is observed as each peak of $T^0$ to $T^3$. In the present invention, each peak originating from a T site will be called a $T''$ peak group. A $T''$ peak group is generally observed as a continuous multimodal peak in an area on a higher magnetic field side (usually a chemical shift of −80 to −40 ppm) than a $Q''$ peak group.

Further, a silicon atom with two bound oxygen atoms and two other bound atoms (normally carbon atoms) is generically called a D site. Like a peak group originating from a Q site or T site, a peak originating from a D site is observed as each polymodal peak ($D''$ peak group) of $D^0$ to $D''$ in a still higher magnetic field area (usually an area of a chemical shift of 0 to −40 ppm) than a $Q''$ and $T''$ peak groups. Each peak group of $D''$, $T''$, and $Q''$ has an area proportional to a molar ratio of silicon atoms placed in an environment corresponding to each peak group and therefore, if the area of all peaks is set to a molar quantity of all silicon atoms, a total area of the $D''$ peak group and $T''$ peak group usually corresponds to a molar quantity of all silicon atoms directly bound to carbon atoms.

If the solid Si-NMR spectrum of the semiconductor light-emitting device member of the present invention is measured, a $D''$ peak group and $T''$ peak group originating from silicon atoms directly bound to carbon atoms of an organic group and a $Q''$ peak group originating from silicon atoms not bound to carbon atoms of the organic group appear in different areas respectively. Among these peaks, peaks of less than −80 ppm correspond to the $Q''$ peak, as described above, and peaks of −80 ppm or more correspond to the $D''$ and $T''$ peaks. Though a $Q''$ peak is not essential for the semiconductor light-emitting device member of the present invention, at least one and preferably a plurality of peaks are observed in the $D''$ and $T''$ peak areas.

The value of chemical shift for the semiconductor light-emitting device member can be calculated, for example, based on a measurement result of solid Si-NMR measurement, which is carried out according to the method to be described later in the explanation of Examples. Also, measured data (the half width, silanol content) is analyzed, for example, by a method in which each peak is divided and extracted by the waveform separation analysis using the Gauss function or Lorentz function.

A reason why the above future (5) is desirable, when the semiconductor light-emitting device member of the present invention can be obtained, which is cured finely without causing cracks even in thick film portions, and a cured product, superior in adhesion to a case, chip sealing characteristics and light/heat resistance after curing, has not been clarified, but is assumed to be as follows.

A semiconductor light-emitting device member comprising inorganic glass can be obtained either by a melt process in which low-melting glass is melted and then sealed or by the sol gel method in which a liquid obtained by performing hydrolysis and polycondensation of alkoxysilane or the like at a relatively low temperature is coated and then dried/cured. Only the $Q''$ peak is mainly observed from members obtained by the melt process, but this method is not practical because a high temperature of at least 350° C. is required for melting, leading to thermal degradation of the semiconductor light-emitting device.

A hydrolysis and polycondensation product obtained from a tetrafunctional silane compound by the sol gel method, on the other hand, becomes totally inorganic glass and is vastly superior in heat resistance and light resistance, but the curing reaction thereof is accompanied by weight loss and volume reduction for the portion of the dehydration because crosslinking proceeds due to a condensation (dehydration/dealcoholization) reaction of silanol. Thus, if only tetrafunctional silane having the $Q''$ peak is selected as a material, the degree of shrinkage on curing becomes too large and cracks are likely to appear in the coating, making it impossible to form a thick film. Attempts to increase film thickness have been made in such a system by adding inorganic particles as an aggregate or recoating, but 10 μm or so is generally a limit thickness. If a sol gel glass is used as a semiconductor light-emitting device member, there has been a problem that the film thickness of 500 to 1000 μm must be secured because molding on wiring portions of complicated shape is needed.

In contrast, in the semiconductor light-emitting device member of the present invention, trifunctional silane having the $T''$ peak and/or bifunctional silane having the $D''$ peak are introduced to adjust the crosslink density to make the film have flexibility.

At the same time, hydrolysis and polycondensation, in order to reduce the volume reduction resulting from dehydration condensation and the crosslink density appropriately within a range that does not affect the function, are performed, controlling the hydrolysis/condensation process and the drying process. Consequently, in the semiconductor light-emitting device member of the present invention, a transparent glass film-like member with the film thickness of up to 1000 μm can be obtained. Therefore, in the present invention, the $T''$ peak and/or $D''$ peak observed in an area of −80 ppm or more is desirable.

A technology of a hard coat film for eyeglasses and the like is known as a method of making a film thicker using bifunctional or trifunctional material as main component, but its film thickness is several μm or less. Such a hard coat film is thin and thus can be cured uniformly by volatilizing a solvent easily, and differences in adhesion and linear expansion coefficient characteristic with the substance have been considered as the main cause for cracks. In the semiconductor light-emitting device member of the present invention, on the other hand, the film is thick like a paint and has itself a certain level of strength so that a small difference in linear expansion coefficient can be accommodated, but generation of internal stress different from that in a thin film caused by volume reduction due to solvent drying arises as a new problem. That is, when a deep container with a small opening area such as an LED cup is molded, if the deep container is heated for curing while a film deep part is not sufficiently dried up, solvent volatilization occurs after crosslinking and the volume decreases, leading to large cracks and foaming. Large internal stress is applied to such a film and measurement of solid Si-NMR of the film shows broader distribution of a siloxane bond angle of the detected $D''$, $T''$, and $Q''$ peak groups than when the internal stress is smaller, creating a broader peak for each. This fact implies that a bond angle represented by two —OSi with respect to Si has large distortion. That is, a film having a narrower half width of peak will be a higher-quality film in which cracks are more unlikely to appear, even though the film is made of the same material.

Such phenomenon, in which the half width increases in accordance with the distortion, is observed more sensitively as the degree of constraint of molecular motion of Si atoms increases. The frequencies of appearance of the phenomenon are given by $D''<T''<Q''$.

The semiconductor light-emitting device member of the present invention is characterized in that the half width of the peak measured in an area of −80 ppm or more is smaller (narrower) than the range of a half width of semiconductor light-emitting device members conventionally known by the sol gel method.

Summarizing in terms of chemical shifts, in the present invention, the half width of the $T''$ peak group whose peak top position is observed in an area of a chemical shift of −80 ppm or more and less than −40 ppm is in the range of usually 5 ppm or less, preferably 4 ppm or less, and usually 0.3 ppm or more, preferably 1 ppm or more, more preferably 1.5 ppm or more.

Similarly, the half width of the $D''$ peak group whose peak top position is observed in an area of a chemical shift of −40 ppm or more and 0 ppm or less is generally smaller than that of the $T''$ peak group due to smaller constraints of molecular motion. Namely, it is in the range of usually 3 ppm or less, preferably 2 ppm or less, and usually 0.3 ppm or more, preferably 0.5 ppm or more.

If the half width of a peak observed in the above chemical shift areas is larger than the above ranges, a state in which constraints of molecular motion is large and thus distortion is large is created, leading possibly to a member inferior in heat resistance, light resistance and durability, and of which cracks are more likely to appear. When, for example, a lot of tetrafunctional silane is used or large internal stress is generated by drying rapidly in the drying process, the range of the half width may be larger than the above range.

If the half width of the peak is smaller than the above ranges, Si atoms existing in its environment are not involved in siloxane crosslinking. In such a case, for example, when the crosslinking is formed of Si—C bond and only D2 peaks of dimethylsiloxane chain are observed like silicone resin and when trifunctional silane remains in a non-crosslinked state, the obtained member may be inferior in heat resistance, light resistance and durability to materials formed mainly of siloxane bonds.

Further, as described above, at least one, preferably a plurality of peaks are observed in the $D''$ and $T''$ peak areas, in the solid Si-nuclear magnetic resonance spectrum of the semiconductor light-emitting device member of the present invention. Therefore, it is preferable that the semiconductor light-emitting device member of the present invention comprises, in the solid Si-nuclear magnetic resonance spectrum, at least one, preferably two or more peaks selected from a group consisting of the $D''$ peak group and $T''$ peak group having a half width within the above-mentioned ranges (feature (5)).

[I-6. Silanol Content]

When the semiconductor light-emitting device member of the present invention has siloxane skeleton as main component, the silanol content is in the range of usually 0.01 weight % or more, preferably 0.1 weight % or more and more preferably 0.3 weight % or more, and usually 10 weight % or less, preferably 8 weight % or less and more preferably 6 weight % or less (feature (6)).

A glass body produced by the sol gel method from alkoxysilane as its material usually does not completely polymerize to become an oxide under such mild curing conditions as 150° C. and about three hours, and a certain amount of silanol remains. A glass body obtained exclusively from tetraalkoxysilane has high hardness and high light resistance, but a large amount of residual silanol remains because a molecular chain has a low degree of freedom due to a high degree of crosslinking and thus no complete condensation occurs. Also, when a hydrolyzed/condensed liquid is dried and cured, thickening is swift due to a large number of crosslinking points and drying and curing proceed simultaneously, resulting in a bulk body with large distortion. If such a member is used as a semiconductor light-emitting device member, additional internal stress arises due to condensation of residual silanol when the member is used for a long period of time, making a malfunction such as cracks, peeling and breaking of wire be more likely to occur. Also, more silanol is found in a fractured surface of the member and moisture infiltration is likely to result because, though moisture permeability is low, surface hygroscopicity is high. The silanol content can be reduced by high-temperature burning at 400° C. or higher, but this is not practical because the heat-resistant temperature of most semiconductor light-emitting devices is 260° C. or lower.

The semiconductor light-emitting device member of the present invention, on the other hand, varies little over time due to low silanol content, is superior in long-term performance stability, and has superior capabilities of low hygroscopicity. However, if a member does not contain silanol at all, the member has poor adhesion to the semiconductor light-emitting device. Therefore, such appropriate range of the silanol content as described above exists for the present invention.

Since the semiconductor light-emitting device member of the present invention contains an appropriate amount of silanol, silanol is bound to a polar portion existing on the device surface through hydrogen bond so that adhesion develops. The polar portion includes, for example, a hydroxyl group and oxygen in a metalloxane bond.

The semiconductor light-emitting device member of the present invention forms, due to dehydration condensation, a covalent bond with a hydroxyl group on the device surface when heated in the presence of an appropriate catalyst, leading to a development of still firmer adhesion.

If too much silanol is contained, on the other hand, thickening in the system, as described above, may make the coating difficult, and also, with increased reaction activity, the occurrence of curing before light-boiling components volatilize by heating may induce a foaming and an increase in internal stress, which may result in crack generations or the like.

The silanol content of a semiconductor light-emitting device member can be decided by the method to be described below, for example. In such method, the ratio (%) of silicon atoms in silanol to all silicon atoms is determined from the ratio of peak areas originating from silanol to all peak areas, by means of the solid Si-NMR spectrum measurement, and then, by comparing the determined silicon ratio with the silicon content analyzed separately, the silanol content can be calculated.

[Solid Si-NMR Spectrum Measurement and Calculation of the Silanol Content]

When measuring the solid Si-NMR spectrum of a semiconductor light-emitting device member, the solid Si-NMR spectrum measurement and the data analysis are first performed under the following conditions. Then, the ratio (%) of silicon atoms in silanol to all silicon atoms is determined from the ratio of peak areas originating from silanol to all peak areas and, by comparing the determined silicon ratio with the silicon content analyzed separately, the silanol content is calculated.

In this context, the analysis of the measured data (namely, the analysis of the silanol amount) is carried out by, for example, a method in which each peak is divided and extracted by the waveform separation analysis or the like utilizing the Gauss function or Lorentz function.

[Example of Device Conditions]

Device: Infinity CMX-400 nuclear magnetic resonance spectroscope manufactured by Chemagnetics Co.

$^{29}$Si resonance frequency: 79.436 MHz

Probe: 7.5 mm φ CP/MAS probe

Temperature: Room temperature

Rotational frequency of sample: 4 kHz

Measurement method: Single pulse method $^1$H decoupling frequency: 50 kHz $^{29}$Si flip angle: 90°

$^{29}$Si 90° pulse width: 5.0 µs

Repetition time: 600 s

Total count: 128 times

Observation width: 30 kHz

Broadening factor: 20 Hz

[Example of Data Processing]

For the semiconductor light-emitting device member, 512 points are taken in as measured data and zero-filled to 8192 points and Fourier transformation is performed.

[Example of Waveform Separation Analysis]

For each peak after Fourier transformation, an optimization calculation is performed by the nonlinear least square method using the center position, height, and half width of a peak shape, created by a Lorentz waveform, Gauss waveform, or a mixture of both, as variable parameters.

For identification of a peak, refer to AIChE Journal, 44(5), p. 1141, 1998 or the like.

The silanol content of a semiconductor light-emitting device member can also be determined by IR measurement as described below. In the IR measurement, identification of a silanol peak is easy, but the shape of the peak is broad and, therefore, error in estimating the area is likely to occur. Further, in quantitative measurement, it is necessary to prepare a sample of constant thickness accurately, which is a cumbersome work. For accurate quantitative measurement, therefore, use of solid Si-NMR is preferable. In measurement based on solid Si-NMR, IR measurement can be used complementarily to determine silanol content in such cases that silanol content is too small for detection, or isolation of silanol peak is difficult because of overlapping of several peaks, or chemical shift of silanol peak is unknown because of an unknown sample or the like.

[Calculation of Silanol Content by IR Measurement]

Fourier Transform Infrared Spectroscopy

Instrument: NEXUS670 and Nic-Plan manufactured by Thermo Electron

Limit of resolution: 4 cm$^{-1}$

Total count: 64 times

Purge: N$_2$

Example of measurement: A thin-film sample of 200 µm in thickness was coated on a Si wafer, and an infrared absorption spectrum was measured by the transmission method together with the Si wafer. The total area of silanol peaks at wave numbers of 3751 cm$^{-1}$ and 3701 cm$^{-1}$ was determined. A trimethylsilanol, as a sample of known concentration, was diluted with anhydrous carbon tetrachloride and its infrared absorption spectrum was measured by the transmission method using a liquid cell of 200 μm in light path, and the ratio of the area of the peak was compared with that of the actual sample to obtain the silanol concentration of the actual sample. Since a peak due to water adsorbed on the sample appears in the background of the silanol peak in an infrared absorption spectrum, the thin-film sample should be heated at 150° C. for 20 min or longer at normal pressure or at 100° C. for 10 min or longer in vacuum to remove adsorbed water before measurement.

[I-7. Total Content Of Pt And Rh]

The total content of Pt and Rh of the semiconductor light emitting device member of the present invention is usually 0.1 ppm or less, preferably 0.05 ppm or less, more preferably 0.01 ppm or less (feature (7)). There is no lower limit, but it is usually to be 0 ppm, in other words, it is preferable that Pt and Rh are not contained at all. Pt and Rh can be contained in the semiconductor light emitting device member of the present invention when a monomer, oligomer or prepolymer corresponding to compound (1) or compound (2) to be described later is synthesized by means of hydrosilylation mechanism using hydrosilylation catalyst. Examples of platinum-containing catalyst used as hydrosilylation catalyst includes particulate platinum, chloroplatinic acid, platinum diolefin complex, platinum diketone complex, platinum phosphine complex and platinum divinyltetradisiloxane complex. Rodium can be used in a similar context. These catalysts are converted into particulate material after participation in hydrosilylation reaction and show plasmon absorption. Further, in a high temperature environment, oxidation of catalyst ligand or catalyst itself may cause yellow coloration of the members, and, in members in which phenyl group is introduced to achieve high refractive index, denaturation of phenyl group by heat or UV light can be accelerated resulting in forming a chromophore group such as biphenyl. However, in the semiconductor light emitting device member of the present invention, since the total content of Pt and Rh is controlled as described above, a decrease in transmittance in the near ultraviolet region in long-term use can be advantageously suppressed. The total content of Pt and Rh in the semiconductor light emitting device member of the present invention can be measured by ICP spectrometry method.

As described above, the first semiconductor light-emitting device member of the present invention comprises features (1) to (4) mentioned above. Also, the second semiconductor light-emitting device member of the present invention comprises features (2), (4) and (5) mentioned above. The third semiconductor light-emitting device member of the present invention comprises features (4), (5) and (6) mentioned above. The fourth semiconductor light-emitting device member of the present invention comprises features (4), (5) and (7) mentioned above. However, it is preferable that each of the first to fourth semiconductor light-emitting device members of the present invention comprises non-essential features from among features (1) to (7), in addition to the above essential features to each. Particularly, a semiconductor light-emitting device member comprising all the above-mentioned features (1) to (7) is more preferable because it meets all the requirements of the first to fourth semiconductor light-emitting device members of the present invention.

[I-8. Other Physicochemical Properties]

The semiconductor light-emitting device member of the present invention has the above-mentioned major features, but it is preferable that it has also additional structures and features described in the following.

[I-8-1. Contents Of Specific Metal Elements]

It is preferable that the semiconductor light-emitting device member of the present invention comprises Si atom bound to an organic group directly and a metal element giving an oxide having high refractive index. The examples of metal elements giving oxides having high refractive indexes include Si (silicon), Al (aluminium), Zr (zirconium), Ti (titanium), Y (yttrium), Nb (niobium) and B (boron). They can be used as a single kind thereof or as two or more kinds.

More specifically, it is preferable that the semiconductor light-emitting device member of the present invention is mainly constituted by metalloxane bonds of which components are one or more kinds of elements selected from a group consisting of Si (silicon), Al (aluminium), Zr (zirconium), Ti (titanium), Y (yttrium), Nb (niobium) and B (boron). More specifically, the total content of Si, Al, Zr, Ti, Y, Nb and B (hereinafter, these are referred to as "specific metal element" as appropriate) is usually 20 weight % or more (feature (8)). The basic skeleton of a conventional semiconductor light-emitting device member is an organic resin such as an epoxy resin having carbon-carbon and carbon-oxygen bonds as its basic skeleton. In contrast, the basic skeleton of the semiconductor light-emitting device member of the present invention is an inorganic metalloxane bond like glass (silicate glass). As is evident from a chemical bond comparison table in Table 1 shown below, the metalloxane bond, represented by siloxane bond, has the following superior features as a semiconductor light-emitting device member.

(I) Light resistance is superior because the bond energy is large and thus pyrolysis and photolysis rarely occur.
(II) Electrically polarized slightly.
(III) The chain structure has a high degree of freedom so that highly flexible structures can be formed and are freely rotatable about a metalloxane chain such as siloxane chain.
(IV) Highly oxidized so that further oxidization is impossible.
(V) High electrical insulating properties.

TABLE 1

Chemical bond comparison table

| Bond | Bond distance (Å) | Bond energy (kcal/mol) | Bond angle (°) |
| --- | --- | --- | --- |
| Si—O—Si | 1.64 | 108 | 130 to 160 |
| C—O—C | 1.43 | 86 | 110 |
| C—C—C | 1.54 | 85 | 109 |

From these features, it is understood that a semiconductor light-emitting device member, based on silicon or the like and formed by a skeleton in which metalloxane bonds such as siloxane bonds are connected three-dimensionally with a high degree of crosslinking, can become a protective film that is similar to minerals such as glass and rock and excellent in heat resistance and light resistance, in contrast to a conventional semiconductor light-emitting device member based on resin such as epoxy resin. Particularly, a semiconductor light-emitting device member, based on silicon or the like and with a methyl group as a substituent, is superior in light resistance, because such member does not have an absorption region in the ultraviolet region and therefore photolysis is unlikely to occur.

The total content of the specific metal elements (Si, Al, Zr, Ti, Y, Nb and B) of the semiconductor light-emitting device member of the present invention is 20 weight % or more, as described above, but preferably 25 weight % or more, and more preferably 30 weight % or more. On the other hand, the upper limit thereof is usually set to 70 weight % or less in order to secure the flexibility of the semiconductor light-emitting device member and prevent the crack generations and defective adhesions.

The semiconductor light-emitting device member of the present invention usually comprises at least Si, among the above specific metal elements, as is evident from the fact that it has the above-described feature (5) regarding the solid Si-NMR spectrum. The other elements, Al, Zr, Ti, Y, Nb and B are not essential. However, it is preferable that Al or B is contained from the standpoint of improvement in heat resistance, and that Zr, Ti, Y or Nb, from the standpoint of higher refractive index. Of these elements, it is particularly preferable that Al, Zr, Y or B is contained in order to be used as the member for the semiconductor light-emitting device having a luminous wavelength from the blue to ultraviolet region, because these elements are less in ultraviolet absorption.

The state of existence of the specific metal elements (Si, Al, Zr, Ti, Y, Nb and B) may be either a glass layer that is uniform as metalloxane bond or particles existing in the semiconductor light-emitting device member, insofar as they are transparent in the semiconductor light-emitting device member toward the luminous wavelength of the semiconductor light-emitting device. When the specific metal elements are present in a state of particles, the structure inside the particle may be either amorphous or crystal structure. However, for higher refractive index, the crystal structure is preferable. In such a case, the particle diameter is usually equal to or smaller than the luminous wavelength of a semiconductor light-emitting device, and preferably 100 nm or smaller, more preferably 50 nm or smaller, particularly preferably 30 nm or smaller, in order not to impair the transparency of the semiconductor light-emitting device member. One of the most preferable example of the state of existence is such that oxide particles of Al, Zr, Ti, Y or Nb, which are high-crystallinity elements, are dispersed, as nano particles of refractive index improvement agent, in an amorphous binder with flexibility, in which Al, Zr, Ti, Y, Nb or B, functioning as refractive index improvement agent or crosslinking degree adjustment agent, is connected, by means of metalloxane bond, to Si that is bound to organic groups, which is the main component.

The total content of the specific metal element of a semiconductor light-emitting device member can be calculated from an analysis result, which can be obtained by performing the inductively coupled plasma spectrometry (hereinafter abbreviated as "ICP" when appropriate) analysis according to, for example, a method described later in the description of Examples.

The composition of the semiconductor light-emitting device member of the present invention is limited to the case in which crosslinkings in the system are mainly formed of inorganic bond (particularly, bond of the above-mentioned specific metal element) including siloxane bond. That is, even if a peak within the above-mentioned half width is observed in an area of −80 ppm or more in a semiconductor light-emitting device member containing a small amount of inorganic component in a large amount of organic components, excellent heat resistance, light resistance and coating properties, defined in the present invention, cannot be obtained. A semiconductor light-emitting device member, defined in the present invention, with which total content of the specific metal element is 20 weight % or more, contains $SiO_2$ of 43 weight % or more in terms of silica ($SiO_2$) on the assumption that only Si is contained.

[I-8-2. Uv Transmittance]

The semiconductor light-emitting device member of the present invention preferably has light transmittance of usually 60% or more, among others 70% or more, and further 80% or more with respect to the luminous wavelength of a semiconductor light-emitting device with the film thickness of 1.0 mm. The efficiency of extracting light from the semiconductor light-emitting device has been enhanced by various technologies. However, if the transparency of a translucent member for sealing a chip or holding a phosphor is low, the brightness of a semiconductor light-emitting device using the translucent member will be reduced, making it difficult to obtain a high-brightness semiconductor light-emitting device product.

In this context, a "luminous wavelength of a semiconductor light-emitting device" varies depending on the type of semiconductor light-emitting device and generally refers to wavelengths in a range of usually 300 nm or more, preferably 350 nm or more, and usually 900 nm or less, preferably 500 nm or less. If the light transmittance is low with respect to the wavelengths in this range, the semiconductor light-emitting device member absorbs light and the efficiency of extracting light decreases, making it impossible to obtain a high-brightness device. Further, such a low light transmittance is undesirable because energy for the reduced efficiency of extracting light is converted into heat, leading to the thermal degradation.

Sealing members tend to degrade due to light in the region from near ultraviolet to blue (350 nm to 500 nm). Therefore, the semiconductor light-emitting device member of the present invention, which is superior in durability, is preferably used for a semiconductor light-emitting device having the luminous wavelengths in this region because, in such a case, a more effect will be achieved.

Light transmittance of a semiconductor light-emitting device member can be measured by an ultraviolet spectrophotometer by, for example, a technique described in Examples using a sample of singly cured film with a smooth surface, which is formed into a film shape having a thickness of 1 mm.

The shape of semiconductor light-emitting device is diverse, but mostly it is used in a thick-film state having thickness exceeding 0.1 mm. However, it is sometimes used as thin film, in such cases as providing a thin-film phosphor layer (for example, a layer containing nanometer-size phosphor particles or fluorescent ions, having thickness of several μm) at the position apart from an LED chip (luminous element) and providing a high refractive index light extracting thin-film, right above an LED chip. In such cases, it is important that the transmittance, of this film thickness, is 60% or more. Even when such a thin-film form is applied, the semiconductor light-emitting device member of the present invention is superior in light resistance, heat resistance and sealing properties, as well as capable of being formed into a film steadily without generating cracks or the like.

[I-8-3. Others]

In general, when inorganic oxide particles or glass components other than silica are contained into a conventional semiconductor light-emitting device member such as epoxy resin or silicone resin to increase refractive index, the semiconductor light emitting device member obtained tend to become opaque because of a phenomenon such as aggregation of particles and, therefore, uniformity at nano level is important to achieve the above transmittance.

In contrast, in the semiconductor light-emitting device member of the present invention, various metal elements can be introduced utilizing the sol-gel reaction, and therefore, a higher-refractive index technology can be realized to some extent without depending on the metal oxide particles or organic groups having high refractive indexes. Furthermore, the coating liquid before the curing is low in molecular weight and a little hydrophilic, compared with the conventional resin, and therefore it has an advantageous effect that nano particles of metal oxides having high refractive indexes, which are difficult to be dispersed in the conventional resins, can be dispersed easily therein. It has also an outstanding advantageous effect that not only nano particles in powder form, which are likely to aggregate, but also transparent nano particle sol, dispersing in a hydrophilic solvent such as methanol which is smaller of particle diameter, can be adopted as material particle having high refractive index.

Certain level of high refractive index of base material can be achieved by adjusting degree of crosslinking by means of organic groups with high light resistance and introducing specific metal elements other than silicon. By containing nano particles with still higher refractive index, it is possible to obtain a transparent semiconductor light-emitting device member having high refractive index with excellent heat resistance and light resistance, which is used in place of conventional epoxy resin.

When the intended refractive index is not high, it is not always necessary to contain a metal element other than silicon in the base material. It is possible to use only matrix portion with high refractive index without containing nano particles with high refractive index.

The semiconductor light-emitting device member of the present invention can be coated in a thick-film state and is superior not only in transparency, but also in sealing properties, heat resistance, and UV resistance, and thus can be applied as a semiconductor light-emitting device member in various forms. Particularly, the semiconductor light-emitting device member can be used for semiconductor light-emitting devices whose luminous wavelength is in the blue to ultraviolet region usefully with less degradation.

[II. Producing method of semiconductor light-emitting Device member]

The method of producing the semiconductor light-emitting device member of the present invention is not particularly limited. It can be produced, for example, by performing hydrolysis and polycondensation of compounds represented by general formulas (1) and/or (2), to be described later, and drying the obtained polycondensate (hydrolyzate/polycondensate). In order for the semiconductor light-emitting device member of the present invention to contain the specific metal element, hydrolysis and polycondensation may be performed using compounds, represented by general formulas (1) and/or (2) and containing the specific metal element, as part of the material, or otherwise, before or after performing hydrolysis and polycondensation, particles having high refractive index (hereinafter referred to as "specific metal oxide particles having high refractive index" as material.

[Chemical Formula 4]

$$M^{m+}X_nY^1_{m-n} \quad (1)$$

In the general formula (1), M represents at least one element selected from a group consisting of silicon, aluminum, zirconium, and titanium. Of these, silicon is preferable.

In the general formula (1), m represents the valence of M and is an integer of 1 or larger and 4 or smaller. "m+" indicates that it is a positive valence.

n represents the number of X groups and is an integer of 1 or greater and 4 or smaller. However, m≧n holds.

In the general formula (1), X is a hydrolyzable group that generates a highly reactive hydroxyl group after being hydrolyzed by such as water in a solution and moisture in the air. As X, any conventionally known one can arbitrarily be used. For example, a low-grade alkoxy group of C1 to C5, acetoxy group, butanoxy group, and chlorine group can be cited. In this context, an expression Ci (i is an integer) indicates that the number of carbon atoms is i. Furthermore, X may be a hydroxyl group. One hydrolyzable group may be used alone or two or more hydrolyzable groups may be used together in any combination at any ratio.

Of these, since components liberated after the reaction are neutral, the low-grade alkoxy group of C1 to C5 is preferable. Particularly, a methoxy group or ethoxy group is preferable because these groups are highly reactive and a liberated solvent is low-boiling point.

Further, if X in the general formula (1) is an acetoxy group or chlorine group, it is preferable to add a process of removing acid components when used as a semiconductor light-emitting device member for which insulating properties are needed because acetic acid or hydrochloric acid is liberated after the hydrolysis reaction.

In general formula (1), for $Y^1$, any known monovalent organic group of the so-called silane coupling agent can optionally be selected and used. In this context, when two or more $Y^1$s are contained in the formula, those may be the same as or different from each other. Among others, in the present invention, organic groups particularly useful as $Y^1$ in the general formula (1) are those selected from a group (group of useful organic groups) represented by $Y^0$ below.

<Group of Useful Organic Groups $Y^0$>

$Y^0$: Monovalent or higher organic groups derived from aliphatic compounds, alicyclic compounds, aromatic compounds, and aliphatic-aromatic compounds.

The number of carbon atoms of organic groups belonging to the group $Y^0$ is usually 1 or more, and usually 1000 or less, preferably 500 or less, more preferably 100 or less, and still more preferably 50 or less.

Further, at least a part of hydrogen atoms in the organic group belonging to the group $Y^0$ may be substituted by atoms and/or substituents such as organic functional groups exemplified below. In this context, a plurality of hydrogen atoms in the organic group belonging to the group $Y^0$ may be substituted by the following substituents. In such a case, one substituent or a combination of two or more substituents may be selected for substitution.

Examples of substituents that can be substituted for the hydrogen atoms in the organic groups belonging to the group $Y^0$ include: atoms such as F, Cl, Br, and I; and organic functional groups such as the vinyl group, methacryloxy group, acryloxy group, styryl group, mercapto group, epoxy group, epoxy cyclohexyl group, glycidoxy group, amino group, cyano group, nitro group, sulfonic acid group, carboxy group, hydroxy group, acyl group, alkoxy group, imino group, and phenyl group.

Among substituents that can be substituted for hydrogen atoms in the organic groups belonging to the group $Y^0$, the organic functional groups may have a substituted halogen atom, such as F, Cl, Br, and I, for at least a part of hydrogen atoms in the organic functional groups, in all the cases described above.

In this context, among the substituents exemplified as substitutable for hydrogen in the organic groups belonging to the group $Y^0$, the above-listed organic functional groups are examples of substituents which can be introduced easily. Other organic functional groups having various physicochemical functionalities may be introduced in accordance with purposes of use.

In addition, organic groups belonging to the group $Y^0$ may also have therein various atoms such as O, N, and S or atomic groups as connecting groups.

As $Y^1$ in the general formula (1), various groups can be selected, for example from the organic groups belonging to the above group of useful organic groups $Y^0$, in accordance with the purposes. However, in terms of superiority in UV resistance and heat resistance, it is preferable to select $Y^1$ principally from methyl group and phenyl group. In addition, other kinds of groups may be used as appropriate for the purpose of enhancing the compatibility or adhesion to each member that constitutes the semiconductor light-emitting device or adjusting the refractive index of the semiconductor light-emitting device member of the present invention.

Concrete examples of the above compound (1) where M is silicon include: dimethyldimethoxysilane, dimethyldiethoxysilane, diphenyldimethoxysilane, diphenyldiethoxysilane, vinyl trimethoxysilane, vinyl triethoxysilane, vinyl triacethoxysilane, γ-aminopropyl trimethoxysilane, γ-glycidoxypropyl trimethoxysilane, γ-glycidoxypropyl triethoxysilane, β-(3,4-epoxy cyclohexyl) ethyltrimethoxysilane, γ-(3,4-epoxy cyclohexyl) ethyltriethoxysilane, γ-(meth)acryloxypropyl trimethoxysilane, phenyl trimethoxysilane, phenyl triacethoxysilane, γ-mercaptopropyl trimethoxysilane, γ-chloropropyl trimethoxysilane, β-cyanoethyl triethoxysilane, methyltrimethoxysilane, methyltriethoxysilane, methyltripropoxysilane, methyltributoxysilane, ethyltrimethoxysilane, ethyltriethoxysilane, tetramethoxysilane, tetraethoxysilane, tetrapropoxysilane, tetrabutoxysilane, dimethyldichlorosilane, diphenyldichlorosilane, methylphenyl dimethoxysilane, trimethylmethoxysilane, trimethylethoxysilane, trimethylchlorosilane, methyltrichlorosilane, γ-aminopropyl triethoxysilane, 4-aminobutyl triethoxysilane, p-aminophenyl trimethoxysilane, N(2-aminoethyl)-3-aminopropyl trimethoxysilane, aminoethyl aminomethylphenethyl trimethoxysilane, 3-glycidoxypropyl trimethoxysilane, 2-(3,4-epoxy cyclohexyl) ethyltrimethoxysilane, 3-aminopropyl trimethoxysilane, 3-aminopropyl triethoxysilane, 4-aminobutyl triethoxysilane, N-(6-aminohexyl) aminopropyl trimethoxysilane, 3-chloropropyl trimethoxysilane, 3-chloropropyltrichlorosilane, (p-chloromethyl) phenyltrimethoxysilane, 4-chlorophenyl trimethoxysilane, 3-methacryloxypropyl trimethoxysilane, 3-methacryloxypropyl triethoxysilane, 3-acryloxypropyl trimethoxysilane, styrylethyl trimethoxysilane, 3-mercaptopropyl trimethoxysilane, vinyl trichlorosilane, vinyl tris (2-methoxyethoxy) silane, and trifluoropropyl trimethoxysilane.

Concrete examples of the compounds (1) where M is aluminum include: aluminum triisopropoxide, aluminum tri-n-butoxide, aluminum tri-t-butoxide, and aluminum triethoxide.

Concrete examples of the compounds (1) where M is zirconium include: zirconium tetramethoxide, zirconium tetraethoxide, zirconium tetra-n-propoxide, zirconium tetra-1-propoxide, zirconium tetra-n-butoxide, zirconium tetra-1-butoxide, zirconium tetra-t-butoxide, and zirconium dimethacrylate dibutoxide.

Concrete examples of the compounds (1) where M is titanium include: titanium tetraisopropoxide, titanium tetra-n-butoxide, titanium tetra-1-butoxide, titanium methacrylate triisopropoxide, titanium tetramethoxypropoxide, titanium tetra-n-propoxide, and titanium tetraethoxide.

However, these compounds exemplified above are only a part of coupling agents easily available on the market. More detailed list thereof can be shown, for example, by the list of coupling agents and the related products in Chapter 9 of "Technology of Maximum Usage of Coupling Agents" issued by Institute for Science and Technology. Naturally, however, coupling agents that can be used for the present invention are not limited to these exemplified coupling agents.

A compound (hereinafter called "compound (2)" when appropriate) represented by the general formula (2) and/or its oligomer can also be used in the same manner as the above compound (1) and/or its oligomers.

[Chemical Formula 5]

$$(M^{s+}X_tY^1_{s-t-1})_uY^2 \qquad (2)$$

In general formula (2), M, X, and $Y^1$, independently of each other, represent the same things as those in general formula (1). Particularly as $Y^1$, just as in the case of general formula (1), various groups can be selected, for example from the organic groups belonging to the above group of useful organic groups $Y^0$ in accordance with the purposes. However, in terms of superiority in UV resistance and heat resistance, it is preferable to select $Y^1$ principally from methyl group.

In general formula (2), s and s+, independently of each other, represent the same things as m and m+ in general formula (1).

Further, in general formula (2), $Y^2$ represents a u-valent organic group. u represents an integer of 2 or larger. Therefore, in general formula (2), for $Y^2$, any known bivalent or higher organic group of the so-called silane coupling agent can arbitrarily be selected and used.

Also, in general formula (2), t represents an integer of 1 or larger and s−1 or smaller, where t≦s.

Examples of the above compound (2) include various organic polymers and oligomers to which a plurality of hydrolytic silyl groups are bound as side chains and molecules to which hydrolytic silyl groups are bound at the position of plural ends of the molecules.

Concrete examples of the above compound (2) and its product names are listed below:

Bis(triethoxysilylpropyl) tetrasulfide
(Manufactured by Shin-Etsu Chemical Co., Ltd., KBE-846)
2-diethoxymethyl ethylsilyldimethyl-2-furanylsilane
(Manufactured by Shin-Etsu Chemical Co., Ltd., LS-7740)
N,N'-bis[3-(trimethoxysilyl)propyl]ethylenediamine
(Manufactured by Chisso Corporation, Sila-Ace XS1003)
N-glycidyl-N,N-bis[3-(methyldimethoxysilyl)propyl] amine
(Manufactured by Toshiba Silicones Co., Ltd., TSL8227)
N-glycidyl-N,N-bis[3-(trimethoxysilyl)propyl]amine
(Manufactured by Toshiba Silicones Co., Ltd., TSL8228)
N,N-bis[(methyldimethoxysilyl)propyl]amine
(Manufactured by Toshiba Silicones Co., Ltd., TSL8206)
N,N-bis[3-(methyldimethoxysilyl)propyl]ethylenediamine
(Manufactured by Toshiba Silicones Co., Ltd., TSL8212)
N,N-bis[(methyldimethoxysilyl)propyl]methacrylamide
(Manufactured by Toshiba Silicones Co., Ltd., TSL8213)
N,N-bis[3-(trimethoxysilyl)propyl]amine
(Manufactured by Toshiba Silicones Co., Ltd., TSL8208)
N N-bis[3-(trimethoxysilyl)propyl]ethylenediamine
(Manufactured by Toshiba Silicones Co., Ltd., TSL8214)
N,N-bis[3-(trimethoxysilyl)propyl]methacrylamide
(Manufactured by Toshiba Silicones Co., Ltd., TSL8215)
N,N',N"-tris[3-(trimethoxysilyl)propyl] isocyanurate
(Manufactured by Hydrus Chemical Inc., 12267-1)

As the material, compound (1), compound (2), and/or their oligomers can be used. That is, in the producing method of the present invention, compound (1), oligomer of the compound (1), compound (2), oligomer of the compound (2), or oligomer of the compound (1) and compound (2) may be used as the material. If oligomer of compound (1) or oligomer of compound (2) is used as the material, the molecular weight of the oligomer is arbitrary as long as the semiconductor light-emitting device member of the present invention can be obtained, but it is usually 400 or more.

In this context, if compound (2) and/or oligomer thereof are used as main material, a main chain structure in its system will consist principally of organic bonds, leading possibly to the low durability. Thus, it is desirable to use a minimum amount of compound (2) in order to provide mainly functionality such as adhesion addition, refractive index adjustment, reactivity control, and inorganic particle dispersibility addition. If compound (1) and/or oligomer (compound (1) derived component) thereof, and compound (2) and/or oligomer (compound (2) derived component) thereof are used simultaneously, it is desirable that the ratio of usage of compound (2) derived component to the total weight of the material is usually 30 weight % or less, preferably 20 weight % or less, and more preferably 10 weight % or less.

If, in the producing method of the liquid for forming the semiconductor light-emitting device member and the semiconductor light-emitting device member of the present invention, an oligomer of compound (1) or compound (2) is used as material, the oligomer may be prepared in advance, but may also be prepared during the producing process. That is, it is possible to use a monomer such as compound (1) or compound (2) as material in order to form an oligomer during the producing process, after that the subsequent reactions are allowed to proceed using the oligomer.

As oligomer, the one having, as a result, similar structure to the oligomer that can be obtained from a monomer such as compound (1) or compound (2) can be used. A commercially available oligomer having such a structure can also be used. Concrete examples of such oligomer include the following.
<Example of Oligomers Consisting Only of Bifunctional Silicon>

As example of dimethyl polysiloxane with terminal hydroxyl group (manufactured by GE Toshiba Silicones Co., Ltd.) can be cited XC96-723, XF3905, YF3057, YF3800, YF3802, YF3807 and YF3897.

As example of methyl phenyl polysiloxane with terminal hydroxyl group (manufactured by GE Toshiba Silicones Co., Ltd.) can be cited YF3804.

As example of double-ended silanol polydimethylsiloxane (manufactured by Gelest) can be cited DMS-S12 and DMS-S14.

As example of double-ended silanol diphenylsiloxane-dimethylsiloxane copolymer (manufactured by Gelest) can be cited PDS-1615.

As example of double-ended silanol polydiphenylsiloxane (manufactured by Gelest) can be cited PDS-9931.
<Example of Oligomers Containing Trifunctional or More of Silicon>

As example of silicon alkoxyoligomer (methyl/methoxy type, manufactured by Shin-Etsu Chemical Co, Ltd.) can be cited KC-89S, KR-500, X-40-9225, X-40-9246 and X-40-9250.

As example of silicon alkoxyoligomer (phenyl/methoxy type, manufactured by Shin-Etsu Chemical Co, Ltd.) can be cited KR-217.

As example of silicon alkoxyoligomer (methylphenyl/methoxy type, manufactured by Shin-Etsu Chemical Co, Ltd.) can be cited KR-9218, KR-213, KR-510, X-40-9227 and X-40-9247.

Of these, oligomers consisting only of bifunctional silicon are instrumental in giving plasticity to the semiconductor light emitting device member of the present invention, but their mechanical strength tends to be insufficient only with bifunctional silicon. Therefore, through copolymerization with an monomer having trifunctional or more silicon or with an oligomer having trifunctional or more silicon, the semiconductor light emitting device member of the present invention can be equipped with mechanical strength necessary as sealant. Compounds having silanol group as reactive group need not be hydrolyzed beforehand and are advantageous in that the use of such solvent as alcohol as miscible solvent for adding water is not necessary. When oligomers having alkoxyl group are used as material, water for hydrolyzing is needed, as is the case of monomers having alkoxyl group.

Further, as the material, any single one of compound (1), compound (2) and their oligomer may be used, or otherwise, two or more of them may be mixed to be used in an arbitrary combination and composition. Further, compound (1), compound (2) and their oligomer that are hydrolyzed in advance (namely, X in general formulas (1) and (2) is OH group) may also be used.

However, in the present invention, at least one of compound (1), compound (2) and their oligomers (including those hydrolyzed), containing silicon as M and having at least one of the organic group $Y^1$ or organic group $Y^2$, is usually used. Since it is preferable that crosslinkings in the system are formed mainly by inorganic components including siloxane bond, when both compound (1) and compound (2) are used, it is preferable that compound (1) is mainly used.

To obtain a semiconductor light-emitting device member consisting principally of siloxane bond, compound (1) and/or an oligomer thereof are preferably used as main component of the material. Further, it is more preferable that an oligomer of compound (1) and/or that of compound (2) are mainly composed of bifunctional components. Particularly, the bifunctional unit of an oligomer of compound (1) and/or that of compound (2) is preferably used as a bifunctional oligomer.

Further, if the bifunctional component (hereinafter called "bifunctional component oligomer" when appropriate) of an oligomer of compound (1) and/or that of compound (2) are mainly used, the ratio of usage of the bifunctional component oligomers to the total weight of the material (that is, the sum of the weights of compound (1), compound (2) and their oligomers) is usually 50 weight % or more, preferably 60 weight % or more, and more preferably 70 weight % or more. The upper limit of the above ratio is usually 97 weight %. This is because using a bifunctional component oligomer as main component of the material is one of the factors that make it easy to produce the semiconductor light-emitting device member of the present invention by the producing method of the semiconductor light-emitting device member of the present invention.

Advantages of using a bifunctional component oligomer as main component of the material will be described below in detail.

In a semiconductor light-emitting device member produced by conventional sol gel method, hydrolyzate/polycondensate (including hydrolyzate/polycondensate contained in the coating liquid (hydrolyzing liquid)) obtained by hydrolysis and polycondensation of its material showed high reaction activity. Thus, unless the hydrolyzate/polycondensate was diluted by a solvent such as alcohol, polymerization in the system would proceed, and cured immediately, making molding and handling difficult. For example, if not diluted by a solvent, hydrolyzate/polycondensate was sometimes cured even at 40° C. to 50° C. Therefore, it was essential to cause a solvent to exist with the hydrolyzate/polycondensate in order to ensure handleability of the hydrolyzate/polycondensate obtained after the hydrolysis.

If a hydrolyzate/polycondensate is dried and cured with the solvent coexisting with the hydrolyzate/polycondensate, shrinkage by desolvation (desolvation shrinkage) is added to the shrinkage caused by dehydration condensation, during the curing. Accordingly, in a conventional semiconductor light-emitting device, the cured product tended to have large internal stress, and therefore, crack generations, peeling, and breaking of wire, caused by the internal stress, were more likely to occur.

Further, if more bifunctional component monomers are used as material for the purpose of softening a semiconductor light-emitting device member in order to relieve the above internal stress, there was a possibility of increasing low-boiling point cyclic material in the polycondensation product. Since the low-boiling point cyclic material is volatilized during curing, the increase of low-boiling point cyclic material will lead to lower yield by weight. The low-boiling point cyclic material is also volatilized from the cured product, leading possibility to generation of stress. Further, heat resistance of a semiconductor light-emitting device member, containing a large amount of low-boiling point cyclic material, may decrease. For the above reasons, it has been difficult to produce a semiconductor light-emitting device member as a cured product in an elastomer state with a good performance.

In contrast, in the producing method of the semiconductor light-emitting device member of the present invention, bifunctional components are oligomerized in advance in another system (that is, in a system not involved in the hydrolysis and polycondensation process), so that low-boiling point impurities without reactive ends can be distilled off, and then used as material. Therefore, even if a large amount of bifunctional component (that is, the above bifunctional component oligomer) is used, low-boiling point impurities thereof will not be volatilized, enabling realization of improvement in yield by weight of the cured product and producing a cured product in an elastomer state with a good performance.

Further, reaction activity of the hydrolyzate/polycondensate can be suppressed by using a bifunctional component oligomer as main material. This phenomenon can be considered to be caused by steric hindrance and electron effect of the hydrolyzate/polycondensate, as well as by reduction of an amount of silanol end due to the use of the bifunctional component oligomer. Since the reaction activity is suppressed, the hydrolyzate/polycondensate is not cured even without a coexisting solvent, and thus, the hydrolyzate/polycondensate can be made both one-component type and a non-solvent system.

Also, since the reaction activity of the hydrolyzate/polycondensate is reduced, the curing start temperature can be set higher than before. Thus, when a solvent whose temperature is lower than the curing start temperature of the hydrolyzate/polycondensate coexists, the solvent will be volatilized before the curing of the hydrolyzate/polycondensate starts in the drying process of the hydrolyzate/polycondensate. This makes it possible to suppress the generation of internal stress caused by a desolvation shrinkage even if a solvent is used.

[II-2. Hydrolysis And Polycondensation Process]

In the present invention, the above compound (1) and/or compound (2), and/or oligomers thereof are first subjected to the hydrolysis and polycondensation reaction (namely, the hydrolysis and polycondensation process). This hydrolysis and polycondensation reaction can be performed by a known method. Hereinafter, the compound (1), compound (2) and oligomers thereof are referred to as "material compounds" as appropriate, when they are not specially distinguished.

A theoretical amount of water, used for performing the hydrolysis and polycondensation reaction of the material compounds, is based on a reaction formula shown in the following formula (3) and it turns out to be half the molar ratio of the total amount of the hydrolyzable groups in the system.

[Mathematical Formula 1]

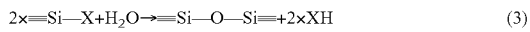

$$2 \times \equiv Si-X + H_2O \rightarrow \equiv Si-O-Si \equiv + 2 \times XH \qquad (3)$$

The above formula (3) represents a case in which M is silicon in general formulas (1) and (2) as an example. "$\equiv Si$" and "$Si \equiv$" represent the one with abbreviated manner in three of four bonds held by a silicon atom.

In the present description, the theoretical amount of water required for the hydrolysis, that is, the amount of water corresponding to half the molar ratio of the total amount of the hydrolizable groups is selected as a reference (ratio of hydrolysis: 100%). And therefore, the amount of water used for the hydrolysis is represented as a percentage to this reference value, that is, it is represented as "ratio of hydrolysis."

In the present invention, the amount of water used for performing the hydrolysis and polycondensation reaction is, when expressed by the above ratio of hydrolysis, in the range of usually 80% or more and preferably 100% or more. If the ratio of hydrolysis is lower than this range, the hydrolysis/polymerization may be insufficient, and consequently, the material may volatilize during curing or the strength of the cured product may be insufficient. If the ratio of hydrolysis exceeds 200%, on the other hand, liberated water always remains in the system in the course of curing. This fact may cause the chip or phosphor to degrade due to water or the cup part to absorb water, which may lead to a cause of the foaming, cracks or peeling during curing. What is important in hydrolysis reaction is to perform the hydrolysis and polycondensation with water of the ratio of hydrolysis close to 100% or more (for example, 80% or more). However, by adding a process in which liberated water is removed before the coating process, the ratio of hydrolysis even exceeding 200% can be applied. However, in this case, using too much water will increase the amounts of water to be removed and solvent to be used as compatibilizer, which may complicate the concentration process or lower the coating properties of the member with excessive polycondensation. Thus, it is preferable that the upper limit of the ratio of hydrolysis is usually set to 500% or less, among others, 300% or less, and preferably 200% or less.

It is preferable that a catalyst coexists during the hydrolysis and polycondensation of the material compounds, in order to promote the hydrolysis and polycondensation. In this case, the examples of the catalyst to be used include: organic acids such as acetic acid, propionic acid and butyric acid; inorganic acids such as nitric acid, hydrochloric acid, phosphoric acid and sulfuric acid; and an organometallic compound catalyst. Catalysts may be used either as a single kind thereof or as a mixture of more than one kind in any combination and in any ratio. For a member to be used for portions directly in contact with the semiconductor light-emitting device, an organometallic compound catalyst that does not have much effect on the insulating property is preferable. In this context, organometallic compound catalyst indicates not only a catalyst comprised of a narrolly-defined organometallic compound, in which organic groups are directly bound to metal elements, but also a catalyst comprised of broadly-defined organometallic compound including organometallic complexes, metal alkoxides, salts of organic acids and metals or the like.

Among the organometallic compound catalysts, those containing at least one element selected from the group consisting of zirconium, tin, zinc and titanium are preferable. Of these, organometallic compound catalysts containing zirconium are more preferable.

As concrete example of organometallic compound catalyst containing zirconium can be cited zirconium tetraacetylacetonate, zirconium tributoxyacetylacetonate, zirconium dibutoxydiacetylacetonate, zirconium tetranormalpropoxide, zirconium tetraisopropoxide, zirconium tetranormalbutoxide, zirconium acylate and zirconium tributoxystearate.

As example of organometallic compound catalyst containing titanium can be cited titanium tetraisopropoxide, titanium tetranormalbutoxide, butyltitanate dimmer, tetraoctyltitanate, titanium acetylacetonate, titanium octyleneglycolate and titanium ethylacetoacetate.

As example of organometallic compound catalyst containing zinc can be cited zinc triacetylacetonate.

As example of organometallic compound catalyst containing tin can be cited tetrabutyl tin, monobutyl tin trichloride, dibutyl tin dichloride, dibutyl tin oxide, tetraoctyl tin, dioctyl tin dichloride, dioctyl tin oxide, tetramethyl tin, dibutyl tin laurate, dioctyl tin laurate, bis(2-ethylhexanoate)tin, bis(neodecanoate)tin, di-n-butylbis(ethylhexylmalate)tin, di-normalbutylbis(2,4-pentanedionate)tin, di-normalbutylbutoxychlorotin, di-normalbutyldiacetoxytin, di-normalbutyldilaurylic acid tin, and dimethyldineodecanoate tin.

These organometallic compound catalysts can be used either as a single kind thereof or as a mixture of two or more kinds in any combination and in any ratio.

By using the above-mentioned preferable organometallic compound catalyst, it is possible to suppress the formation of by-products, low-molecular-weight cyclic siloxane, at the time of hydrolysis and polycondensation of material compound, and to prepare with high yield the liquid for forming the semiconductor light-emitting device member.

Furthermore, by using the organometallic compound catalyst, the semiconductor light emitting device member of the present invention can be equipped with excellent heat resistance. The reason is not clear. It is thought that the above organometallic compound catalyst not only accelerates hydrolysis and polycondensation reaction of material compounds as catalyst but is capable of attaching to and dissociating from silanol end of hydrolyzate/polycondensate and its cured product temporarily. This mechanism is considered to be instrumental in adjusting reactivity of silanol-containing polysiloxane, and brings about, under high temperature conditions, (i) prevention of oxidation of organic groups, (ii) prevention of the formation of unnecessary crosslinking among polymers, (iii) prevention of cleavage of the main chain or the like. In the following, these (i) to (iii) will be explained.

(i) Prevention of oxidation of organic groups is thought to be achieved as follows. When a heat-induced radical is formed on, for example, a methyl group, a transition metal in the organometallic compound catalyst is capable of capturing the radical. The transition metal itself loses its ionic valency as a result of the radical capture and thus prevents oxidation of organic groups through interaction with oxygen. It is inferred that deterioration of the semiconductor light-emitting device member is thus suppressed.

(ii) Prevention of the formation of unnecessary crosslinking among polymers is thought to be achieved as follows. For example, a methyl group is oxidized by oxygen molecules to be formaldehyde, leading to formation of a hydroxyl group bonded to a silicon atom. When hydroxyl groups thus formed are subjected to dehydration condensation, crosslinking points generate among polymers. When this crosslinking increases, a semiconductor light-emitting device member, which is originally rubber-like, may become hard and fragile. However, organometallic compound catalysts combine with silanol groups and thus prevent progress of crosslinkings due to pyrolysis.

(iii) Prevention of cleavage of the main chain or the like is thought to be achieved as follows. Organometallic compound catalysts combine with silanol and prevents the cleavage of the main chain of the polymer caused by intramolecular attack by silanol and suppresses loss of weight at the time of heating caused by formation of cyclic siloxane. These mechanisms are considered to lead to improvement in heat resistance.

The proportion of organometallic compound catalyst used is selected appropriately depending on the kind of catalyst used. The proportion in the total weight of materials subjected to hydrolysis and polycondensation is usually 0.01 weight % or more, preferably 0.05 weight % or more, more preferably 0.1 weight % or more, and usually 5 weight % or less, preferably 2 weight % or less, particularly preferably 1 weight % or less. When the proportion of the organometallic compound catalyst is too small, it is possible that curing takes too much time, or mechanical strength or durability is not enough because of insufficient curing. On the other hand, when the proportion is too large, it is possible that the control of physicochemical property of the cured product, namely semiconductor light-emitting device member becomes difficult because of too rapid curing, the transparency of the semiconductor light-emitting device member is impaired because of precipitation of the catalyst due to inability to be dissolved or dispersed, the semiconductor light-emitting device member becomes colored when used at high temperature because the amount of organic material incorporated in the form of the catalyst is large.

These organometallic compound catalysts can be added to the material system in one portion at the time of hydrolysis and polycondensation, or they can be added in several divided portions. It is possible that a solvent is used to dissolve the catalysts at the time of hydrolysis and polycondensation, or the catalysts may be dissolved directly in the reaction solution. However, for the liquid for forming the semiconductor light-emitting device member, it is desirable that the solvent is distilled off completely after the process of hydrolysis and polycondensation in order to prevent foaming or coloration caused by heat at the time of curing.

The hydrolyzate/polycondensate (polycondensate) of the above material compounds is preferably liquid. However, if a solid hydrolyzate/polycondensate can be made liquid using a solvent, such a hydrolyzate/polycondensate can also be used.

If liquid separation occurs in the system during the hydrolysis and polycondensation reaction and a non-uniform state is generated, a solvent may be used. As the solvent, lower alcohols of C1 to C3, dimethylformamide, dimethylsulfoxide, acetone, tetrahydrofuran, methylcellosolve, ethylcellosolve, methylethylketone, and any other solvents that can be mixed homogeneously with water can be used. Of these, however, solvents that are neither strongly acidic nor strongly basic are preferable for reasons of not affecting the hydrolysis and polycondensation adversely. One kind of solvent may be used alone or one or more kinds of solvents may be used together. The amount of solvent to be used may be freely selected, but it is preferable to use a minimum amount of it because the solvent should be removed in the coating process on the semiconductor light-emitting device. It is also preferable to select a solvent whose boiling point is 100° C. or lower, preferably 80° C. or lower to facilitate the removal of the solvent. In some cases, the initial non-uniform state becomes uniform during the reaction because a solvent such as alcohol is generated by the hydrolysis reaction without adding a solvent from outside.

The hydrolysis and polycondensation reaction of the above material compounds is performed, in the case of under normal pressure, in the temperature range of usually room temperature or higher, preferably 40° C. or higher, and usually 120° C. or lower, preferably 100° C. or lower. A higher temperature may also be allowed by maintaining the liquid phase under increased pressure, but it is preferable that the temperature does not exceed 150° C.

The reaction time of the hydrolysis and polycondensation reaction depends on the reaction temperature. But the reaction proceeds for usually 0.1 hour or more, preferably 1 hour or more, more preferably 3 hours or more, and usually 100 hours or less, preferably 20 hours or less, more preferably 15 hours or less.

Under the above hydrolysis and polycondensation conditions, if the reaction time is too short or the reaction temperature is too low, the hydrolysis and polycondensation may be insufficient, leading possibly to the volatilization of the material during curing or insufficient strength of the cured product. On the other hand, if the reaction time is too long or the reaction temperature is too high, the molecular weight of the polycondensate may become high and the silanol amount in the system may decrease, leading possibly to defective adhesion in the coating process or crack generations due to a non-uniform structure of the cured product caused by too rapid curing. Taking the above tendencies into consideration, it is preferable to select appropriate conditions in accordance with the desired physical property values.

After the above hydrolysis and polycondensation reaction terminates, the resultant hydrolyzate/polycondensate is stored at or below room temperature until the time of use. However, polycondensation slowly proceeds also in the meantime and thus it is preferable that the hydrolyzate/polycondensate is usually used within 60 days of storage at room temperature, after the heated hydrolysis and polycondensation reaction described above terminates, especially when it is used as a thick-film member, preferably within 30 days, and more preferably within 15 days. The above period can be prolonged if necessary by storing the hydrolyzate/polycondensate in a low temperature range in which the hydrolyzate/polycondensate does not freeze.

[II-3. Addition Of Specific Metal Oxide Particles Having High Refractive Index]

When specific metal oxide particles having high refractive index are added, there is no special limitation on the kind thereof insofar as the particles contain one or more kinds of the specific metal element mentioned above. Usually, particles consisting of oxide of the specific metal element (metal oxide particle) are used.

An example of the method of adding the specific metal oxide particles having high refractive index includes addition singly to the hydrolysis and polycondensation reaction solution in the form of simple powder, or addition to the hydrolysis and polycondensation reaction solution as sol in an aqueous or a solvent, together with the solvent. Any of these methods can be adopted. In order to obtain a transparent semiconductor light-emitting device member, it is most convenient to add in the form of a sol in a solvent with small particle size and high dispersibility.

When dispersion of crystals is stable, the specific metal oxide particles having high refractive index can be introduced into the semiconductor light-emitting device member as such, with the preferable effect of high refractive index exhibited markedly. On the other hand, when the dispersion is unstable, ligands may be introduced to enhance stability of the dispersion. When the surface of the specific metal oxide particles having high refractive index has catalytic activity and heat resistance or light resistance of organic group part of the semiconductor light-emitting device member may be impaired, or affinity with the matrix part is low and thus aggregation is liable to occur, a known coating layer may be formed as appropriate on the surface of the specific metal oxide particles having high refractive index. In these cases, it is preferable that the ligand or coating layer themselves is excellent in heat resistance and light resistance. Usually, these ligands or coating layers have low refractive indexes, and therefore, the use of the ligand or the coating layer should be held to the minimum necessary.

There is no special limitation on the timing of the addition of the specific metal oxide particles having high refractive index. The addition may be before hydrolysis and polycondensation reaction of the above material compound (pre-addition method) or after the reaction (post-addition method). When, in case of post-addition method, the affinity between the hydrolyzed/polycondensated reaction solution and the specific metal oxide particles having high refractive index is poor and thus aggregation of the specific metal oxide particles having high refractive index occurs during the curing, the pre-addition method is preferable. When hydrolysis and polycondensation of material compound are performed in the presence of specific metal oxide particles having high refractive index, a coating layer consisting of the semiconductor light-emitting device member itself is formed on the surface of the particles, making the coating and curing processes stable.

The refractive index of the specific metal oxide particles having high refractive index is usually 1.6 or higher, preferably 1.8 or higher, more preferably 1.9 or higher, from the standpoint of enhancing the refractive index of the semiconductor light-emitting device member with a small amount.

[II-4. Solvent Distillation]

When a bifunctional oligomer is used as main component of the material compound and a solvent is used in the above hydrolysis and polycondensation process, it is preferable to distill off, usually before the curing process, the solvent (solvent distillation process). In this case, the hydrolyzate/polycondensate obtained after the solvent distillation is usually liquid. It has been difficult to handle the hydrolyzate/polycondensate because the solvent distillation makes the hydrolyzate/polycondensate cured. However, when a bifunctional component oligomer is used, the solvent can be distilled off because the reactivity of the hydrolyzate/polycondensate is suppressed and thus the hydrolyzate/polycondensate is not cured even with the solvent distillation before the curing process. By distilling off the solvent before the curing process, crack generation, peeling and breaking of wire due to the desolvation shrinkage can be prevented.

Usually, water used for the hydrolysis is also distilled off when the solvent is distilled off. Also, solvents to be distilled off include a solvent represented by XH or the like, which is generated by the hydrolysis and polycondensation reaction of the material compounds represented by the general formulas (1) and (2).

Any method of the solvent distillation may be used as long as advantageous effects of the present invention are not seriously damaged. However, distillation of the solvent at a temperature equal to or higher than the curing start temperature of the hydrolyzate/polycondensate should be avoided.

A concrete range of the temperature conditions for distilling off the solvent is usually 60° C. or higher, preferably 80° C. or higher, and more preferably 100° C. or higher, and usually 150° C. or lower, preferably 130° C. or lower, and more preferably 120° C. or lower. If the temperature falls below the lower limit of this range, the solvent distillation may be insufficient. If the temperature exceeds the upper limit of this range, the hydrolyzate/polycondensate may gelate.

A pressure condition for the solvent distillation is usually normal pressures. Further, the pressure is reduced when necessary so that the boiling point of the reaction liquid during the solvent distillation should not reach the curing start temperature (usually 120° C. or higher). The lower limit of the pressure is a level at which the main components of the hydrolyzate/polycondensate are not distilled off.

In general, low-boiling point component can be distilled off efficiently under conditions of high temperature and high vacuum. When the amount of low-boiling point component is very small and its complete removal is difficult depending on the type of apparatus, polymerization reaction may proceed too far in a high temperature operation and the molecular weight of the product may become too large. Further, the catalyst, selected appropriately, may become inactive under conditions of high temperature for a long period, and the liquid for forming the semiconductor light-emitting device member may become difficult to be cured. In those instances, it is possible to distill off low-boiling point component by nitrogen gas blowing-in or by steam distillation at low temperature and normal pressures, as appropriate. In the case of distillation under reduced pressure or nitrogen gas blowing-in, it is preferable to moderately increase the molecular weight in the former process, hydrolysis and polycondensation reaction, in order not to distill off the main component of the hydrolyzate/polycondensate. When the low-boiling point component such as solvent, water, low-molecular-weight cyclic siloxane formed as by-product or dissolved air is removed sufficiently by these means from the liquid for forming the semiconductor light-emitting device member, the semiconductor light-emitting device member prepared is, due to less by foaming during the curing due to vaporization of low-boiling point component, or by peeling from the device at the time of use at high temperature, and, therefore, is desirable.

However, the solvent distillation is not an essential operation. Particularly when a solvent whose boiling point is equal to or lower than the curing temperature of the hydrolyzate/polycondensate is used, the solvent will be volatilized before the curing of the hydrolyzate/polycondensate starts in the curing process of the hydrolyzate/polycondensate, and thus the generation of cracks and the like due to the desolvation shrinkage can be prevented without specially performing the solvent distillation process. However, since the volume of the hydrolyzate/polycondensate may change due to the volatilization of the solvent, it is preferable to perform solvent distillation, from the viewpoint of accurate control of the dimension and shape of the semiconductor light-emitting device member.

[II-5. Drying]

By drying (drying process) the hydrolyzate/polycondensate obtained by the above hydrolysis and polycondensation reaction, the semiconductor light-emitting device member of the present invention can be obtained. The hydrolyzate/polycondensate before being dried is usually liquid, as described above. By drying the liquid hydrolyzate/polycondensate in a mold of the desired shape, the semiconductor light-emitting device member of the present invention in the desired shape can be formed. Also, by drying the hydrolyzate/polycondensate after coating it on the desired region, the semiconductor light-emitting device member of the present invention can be formed directly on the desired region. The liquid hydrolyzate/polycondensate will be called "hydrolyzed/polycondensed liquid" or "liquid for forming the semiconductor light-emitting device member" in the present description when appropriate. Though the solvent does not necessarily evaporate in the drying process, the drying process, in this context, is assumed to include a phenomenon in which a hydrolyzate/polycondensate having fluidity is cured by losing the fluidity. Therefore, the above "drying" may be interpreted as "curing" when evaporation of the solvent is not involved.

In the drying process, the metalloxane bond is formed by further polymerizing the hydrolyzate/polycondensate and the polymers are cured, so as to obtain the semiconductor light-emitting device member of the present invention.

During the drying process, the hydrolyzate/polycondensate is heated to a predetermined curing temperature for curing. The concrete temperature range can be decided arbitrarily as long as the hydrolyzate/polycondensate can be dried. But it is preferably 120° C. or higher and more preferably 150° C. or higher because the metalloxane bond is usually formed efficiently at 100° C. or higher. However, if the hydrolyzate/polycondensate is heated together with the semiconductor light-emitting device, it is preferable to perform the drying process usually at a temperature equal to or below the heat-resistant temperature of the device components, and preferably at 200° C. or lower.

The time for which the curing temperature maintained (namely, curing time) for drying the hydrolyzate/polycondensate is not unconditionally determined because it depends on the concentration of a catalyst used, thickness of the member or the like. But the drying process is performed for usually 0.1 hour or more, preferably 0.5 hour or more, more preferably 1 hour or more, and usually 10 hours or less, preferably 5 hours or less, more preferably 3 hours or less.

The condition of rising temperature in the drying process is not specially limited. That is, the temperature may be either maintained at a constant level during the drying process or changed continuously or intermittently. Also, the drying process may be performed as a plurality of steps. Further, the temperature may be changed stepwise in the drying process. By changing the temperature stepwise, an advantage of being able to prevent foaming caused by a residual solvent or dissolved water vapor can be obtained. Particularly, when an additional curing at higher temperature is performed after a curing at lower temperature, internal stress is not likely to be generated in the obtained semiconductor light-emitting device member, leading to a further advantage of generating less cracks or peelings.

However, when the above hydrolysis and polycondensation reaction is performed in the presence of a solvent, if no solvent distillation process is performed or a solvent remains in the hydrolyzate/polycondensate even after performing the solvent distillation process, it is preferable that the drying process is divided into a first drying process in which the solvent is substantially removed at a temperature equal to or below the boiling point of the solvent and a second drying process in which the hydrolyzate/polycondensate is dried at a temperature equal to or above the boiling point of the solvent. The "solvent" in this context includes a solvent represented by XH or the like, which is generated by the above hydrolysis and polycondensation reaction of the material compound. The "drying" in the present description refers to a process in which the above-mentioned hydrolyzate/polycondensate of the material compound loses the solvent and further the metalloxane bond is formed by further polymerization and curing.

The first drying process substantially removes the contained solvent at a temperature equal to or below the boiling point of the solvent without actively promoting further polymerization of the hydrolyzate/polycondensate of the material compound. That is, the product obtained from this process is the hydrolyzate/polycondensate, which is in the state of viscous liquid or soft film, due to hydrogen bonds, formed by concentrating the hydrolyzate/polycondensate before the drying process, or in the liquid state with the solvent removed.

However, usually the first drying process is preferably performed at a temperature below the boiling point of the solvent. If the first drying process is performed at a temperature equal to or above the boiling point of the solvent, the resultant film is foamed by vapor of the solvent, making it difficult to produce a uniform film without defects. This first drying process may be performed as a single step, if the evaporation of the solvent is efficient, for example when the member is formed into a thin film. However, the first drying process may also be performed as a plurality of steps, if the evaporation efficiency is low, for example when the member is molded in a cup. For a shape for which evaporation efficiency is extremely low, the hydrolyzate/polycondensate may be coated, after the drying/concentration is performed in a separate, more efficient container in advance, in a state still with the fluidity, before further drying is performed. If the evaporation efficiency is low, it is preferable to contrive to dry a whole member uniformly without taking a means to promote the concentration only at the surface of the member, such as means of forced air drying with a large air flow.

In the second drying process, after the solvent of the above hydrolyzate/polycondensate has substantially removed in the first drying process, the hydrolyzate/polycondensate is heated at a temperature equal to or above the boiling point of the solvent to form the metalloxane bonds, and thus it becomes a stable cured product. If a large amount of solvent remains during this process, the volume reduction occurs due to the proceeding crosslinking reaction and solvent evaporation and thus large internal stress is generated, leading to peelings and cracks caused by a shrinkage. Since the metalloxane bond is usually formed efficiently at 100° C. or higher, the second drying process is performed preferably at 100° C. or higher and more preferably at 120° C. or higher. However, if the hydrolyzate/polycondensate is heated together with the semiconductor light-emitting device, it is preferable to perform drying usually at a temperature equal to or below the heat-resistant temperature of the device components, and preferably at 200° C. or lower. The curing time in the second drying process is not unconditionally determined because it depends on the concentration of a catalyst used, thickness of the member and the like. But the drying process is performed for usually 0.1 hour or more, preferably 0.5 hour or more, more preferably 1 hour or more, and usually 10 hours or less, preferably 5 hours or less, more preferably 3 hours or less.

By separating the process of solvent removal (the first drying process) and the curing process (the second drying process) clearly, as described above, the semiconductor light-emitting device member, having physical properties of the present invention and superior in light resistance and heat resistance, can be obtained without inducing crack generations or peelings.

However, it is still possible that the curing may proceed in the first drying process and the removal of the solvent may proceed in the second drying process, but curing in the first drying process and the solvent removal in the second drying process are usually too small to affect the advantageous effects of the present invention.

The condition of rising temperature in each process are not particularly limited, as long as the above first drying process and second drying process are substantially realized as described above. That is, the temperature may be either maintained at a constant level during each drying process or changed continuously or intermittently. Also, each of the drying processes may be performed as a plurality of steps. Further, the range of the present invention is assumed to include such a case that the first drying process has a period when the temperature temporarily rises to or above the boiling point of the solvent or the temperature during the second drying process falls to or below the boiling point of the solvent, as long as the above process of the solvent removal (the first drying process) and the curing process (the second drying process) are substantially accomplished independently.

Further, in the case a solvent whose boiling point is equal to or below the curing temperature, preferably below the curing temperature, of the hydrolyzate/polycondensate, is used, the solvent coexisting with the hydrolyzate/polycondensate will be distilled off during the drying process at the moment that the temperature reaches the boiling point, even if the hydrolyzate/polycondensate is heated up to the curing temperature without specific temperature adjustments. Namely, in this case, the process (the first drying process) of substantially removing the solvent at a temperature equal to or below the boiling point of the solvent is performed before the hydrolyzate/polycondensate is cured in a process where the temperature of the hydrolyzate/polycondensate rises up to its curing temperature in the drying process. In this case, if a bifunctional oligomer is used as main component of the material compound, the hydrolyzate/polycondensate obtained after the solvent distillation will be usually liquid. Then, after that process, the process (the second drying process) in which the hydrolyzate/polycondensate is drying and curing at a temperature (that is, the curing temperature) equal to or above the boiling point of the solvent will be performed. Therefore, if a solvent whose boiling point is equal to or below the curing temperature of the hydrolyzate/polycondensate is used, the above first drying process and second drying process will be performed without even intending to perform both processes. Consequently, it is preferable to use a solvent whose boiling point is equal to or below the curing temperature, preferably below the curing temperature, of the hydrolyzate/polycondensate, because the quality of the semiconductor light-emitting device member will not be significantly affected even if the hydrolyzate/polycondensate contains a solvent when performing the drying process.

[II-6. Others]

After the above drying process, various types of post-treatments may be added on the resultant semiconductor light-emitting device member if necessary. Examples of the post-treatment include a surface treatment to improve the adhesion to the mold parts, preparation of antireflection coating, and preparation of a fine uneven surface to improve the efficiency of extracting light.

[III. Uses of the Semiconductor Light-Emitting Device Member]

The semiconductor light-emitting device member of the present invention is not particularly limited in its use and can be used for various purposes represented by a member for sealing (namely, a sealant) a semiconductor light-emitting device and the like. Among others, by using phosphor particles and/or inorganic particles in combination, the semiconductor light-emitting device member of the present invention can be more suitably used for specific purposes. The combined use of phosphor particles and inorganic particles will be described below.

[III-1. Combined Use of Phosphor]

The semiconductor light-emitting device member of the present invention can be used, for example, as a member for wavelength conversion by dispersing a phosphor in the semiconductor light-emitting device member, which is molded inside a cup of a semiconductor light-emitting device or coated as a thin film on an appropriate transparent support. A single kind of phosphor can be used alone or as a mixture of two or more kinds in any combination and in any ratio.

[III-1-1. Type Of Phosphor]

There is no special limitation on the composition of the phosphor. Preferable examples are: metal oxides (which are host crystals) represented by $Y_2O_3$ and $Zn_2SiO_4$; phosphates represented by $Ca_5(PO_4)_3Cl$; and sulfides represented by ZnS, SrS and CaS, to which are added rare earth metal ions of Ce, Pr, Nd, Pm, Sm, Eu, Tb, Dy, Ho, Er, Tm or Yb, or metal ions of Ag, Cu, Au, Al, Mn or Sb, as activator or coactivator.

As preferable examples of host crystal can be cited: sulfides such as (Zn, Cd)S, $SrGa_2S_4$, SrS and ZnS; oxysulfides such as $Y_2O_2S$; salt aluminates such as $(Y,Gd)_3Al_5O_{12}$, $YAlO_3$, $BaMgAl_{10}O_{17}$, (Ba,Sr) (Mg,Mn) $Al_{10}O_{17}$, (Ba, Sr, Ca) (Mg, Zn,Mn) $Al_{10}O_{17}$, $BaAl_{12}O_{19}$, $CeMgAl_{11}O_{19}$, (Ba, Sr,Mg)O $Al_2O_3$, $BaAl_2Si_2O_8$, $SrAl_2O_4$, $Sr_4Al_{14}O_{25}$ and $Y_3Al_5O_{12}$; salt silicates such as $Y_2SiO_5$ and $Zn_2SiO_4$; oxides such as $SnO_2$ and $Y_2O_3$; salt borates such as $GdMgB_5O_{10}$ and $(Y,Gd)BO_3$; salt halophosphates such as $Ca_{10}(PO_4)_6(F,Cl)_2$ and $(Sr,Ca,Ba,Mg)_{10}(PO_4)_6Cl_2$; salt phosphates such as $Sr_2P_2O_7$ and (La, Ce) $PO_4$.

No particular limitation is imposed on the element composition of the above host crystal and activator/coactivator. Partial substitution with the element of the same group is possible. Any phosphor obtained can be used so long as it absorbs light in the near ultraviolet to visible region and emits visible light.

More concretely, those listed below can be used as phosphor. The list shown below serves as an example and phosphors that can be used in the present invention are not limited to these examples. In the following examples, phosphors with different partial structure are shown abbreviated as a group for the sake of convenience. For example, 3 compounds of "$Y_2SiO_5:Ce^{3+}$", "$Y_2SiO_5:Tb^{3+}$" and "$Y_2SiO_5:Ce^{3+},Tb^{3+}$" are combined as "$Y_2SiO_5:Ce^{3+}, Tb^{3+}$" and 3 compounds of "$La_2O_2S:Eu$", "$Y_2O_2S:Eu$" and "$(La,Y)_2O_2S:Eu$" are combined as "$(La, Y)_2O_2S:Eu$". Abbreviated part is indicated by comma-separation.

[III-1-1-1. Red Phosphor]

An example of the wavelength range of fluorescence emitted by a phosphor which emits red fluorescence (hereinafter referred to as "red phosphor" as appropriate) is as follows. Its peak wavelength is usually 570 nm or longer, preferably 580 nm or longer, and usually 700 nm or shorter, preferably 680 nm or shorter.

As examples of red phosphor can be cited europium-activated alkaline earth silicon nitride phosphors represented by $(Mg,Ca,Sr,Ba)_2Si_5NB:Eu$, which is constituted by fractured particles having red fractured surface and emit light in the red region, and europium-activated rare earth oxychalcogenide phosphors represented by $(Y,La,Gd,Lu)_2O_2S:Eu$, which is constituted by growing particles having a nearly spherical shape as a shape of typical regular crystal growth and emit light in the red region.

Also applicable in the present embodiment is an phosphor containing oxynitride and/or oxysulfide which contains at least one element selected from the group consisting of Ti, Zr, Hf, Nb, Ta, W and Mo, as described in Japanese Patent Laid-Open Publication (Kokai) No. 2004-300247, which is containing an oxynitride having an α-sialon structure in which all or part of Al element is replaced by Ga element. These are phosphors which contain oxynitride and/or oxysulfide.

Other examples of red phosphors include: Eu-activated oxysulfide phosphor such as $(La,Y)_2O_2S:Eu$; Eu-activated oxide phosphor such as $Y(V,P)O_4:Eu$ and $Y_2O_3:Eu$; Eu,Mn-activated salt silicate such as $(Ba,Sr,Ca,Mg)_2SiO_4:Eu,Mn$ and $(Ba,Mg)_2SiO_4:Eu,Mn$; Eu-activated sulfide phosphor such as (Ca,Sr)S:Eu; Eu-activated salt aluminate phosphor such as $YAlO_3:Eu$; Eu-activated salt silicate phosphor such as $LiY_9(SiO_4)_6O_2:Eu$, $Ca_2Y_8(SiO_4)_6O_2:Eu$, $(Sr,Ba,Ca)_3SiO_5:Eu$ and $Sr_2BaSiO_5:Eu$; Ce-activated salt aluminate phosphor such as $(Y,Gd)_3Al_5O_{12}:Ce$ and $(Tb,Gd)_3Al_5O_{12}:Ce$; Eu-activated nitride phosphor such as $(Ca,Sr,Ba)_2Si_5N_8:Eu$, $(Mg,Ca,Sr,Ba)SiN_2:Eu$ and $(Mg,Ca,Sr,Ba)AlSiN_3:Eu$; Ce-activated nitride phosphor such as $(Mg,Ca,Sr,Ba)AlSiN_3:Ce$; Eu,Mn-activated salt halophosphate phosphor such as $(Sr,Ca,Ba,Mg)_{10}(PO_4)_6Cl_2:Eu,Mn$; Eu,Mn-activated salt silicate phosphor such as $(Ba_3Mg)Si_2O_8:Eu,Mn$ and $(Ba,Sr,Ca,Mg)_3(Zn,Mg)Si_2O_8:Eu,Mn$; Mn-activated salt germanate phosphor such as $3.5MgO\cdot0.5MgF_2\,GeO_2:Mn$; Eu-activated oxynitride phosphor such as Eu-activated α-sialon; Eu,Bi-activated oxide phosphor such as $(Gd,Y,Lu,La)_2O_3:Eu,Bi$; Eu,Bi-activated oxysulfide phosphor such as $(Gd,Y,Lu,La)_2O_2S:Eu,Bi$; Eu,Bi-activated salt vanadate phosphor such as $(Gd,Y,Lu,La)VO_4:Eu,Bi$; Eu, Ce-activated sulfide phosphor such as $SrY_2S_4:Eu, Ce$; Ce-activated sulfide phosphor such as $CaLa_2S_4:Ce$; Eu,Mn-activated salt phosphate phosphor such as $(Ba, Sr, Ca)MgP_2O_7:Eu,Mn$ and $(Sr,Ca,Ba,Mg,Zn)_2P_2O_7:Eu,Mn$; Eu,Mo-activated salt tungstate phosphor such as $(Y,Lu)_2WO_6:Eu,Mo$; Eu, Ce-activated nitride phosphor such as $(Ba,Sr,Ca)_xSi_yN_z:Eu, Ce$ (x, y, z being an integer of 1 or larger); Eu,Mn-activated salt halophosphate phosphor such as $(Ca,Sr,Ba,Mg)_{10}(PO_4)_6(F,Cl,Br,OH):Eu,Mn$; Ce-activated salt silicate phosphor such as $((Y,Lu,Gd,Tb)_{1-x}Sc_xCe_y)_2(Ca,Mg)_{1-r}(Mg,Zn)_{2+r}Si_{z-q}Ge_qO_{12+\delta}$.

Also applicable as red phosphor are the following examples: red organic phosphor consisting of rare earth ion complex containing anions such as β-diketonate, β-diketone, aromatic carboxylic acid or Bronsted acid as ligand, perylene pigment (for example, dibenzo {[f,f']-4,4',7,7'-tetraphenyl}diindeno[1,2,3-cd:1',2',3'-1m]perylene), anthraquinone pigment, lake pigment, azo pigment, quinacridone pigment, anthracene pigment, isoindoline pigment, isoindolinone pigment, phthalocyanine pigment, triphenylmethane basic dye, indanthrone pigment, indophenol pigment, cyanine pigment and dioxazine pigment.

Also, among red phosphors, those whose peak wavelength is 580 nm or longer, preferably 590 nm or longer, and 620 nm or shorter, preferably 610 nm or shorter can be suitably used as an orange phosphor. Examples of such orange phosphors include: $(Sr, Ba)_3SiO_5:Eu$, $(Sr,Mg)_3(PO_4)_2:Sn^{2+}$, $SrCaAlSiN_3:Eu$, and Eu-activated oxynitride phosphor such as Eu-activated α-sialon.

[III-1-1-2. Green Phosphor]

An example of the wavelength range of fluorescence emitted by a phosphor which emits green fluorescence (hereinafter referred to as "green phosphor" as appropriate) is as follows. Its peak wavelength is usually 490 nm or longer, preferably 500 nm or longer, and usually 570 nm or shorter, preferably 550 nm or shorter.

As examples of green phosphor can be cited europium-activated alkaline earth silicon oxynitride phosphors represented by $(Mg,Ca,Sr,Ba)Si_2O_2N_2:Eu$, which is constituted by fractured particles having a fractured surface and emit light in the green region, and europium-activated alkaline earth silicate phosphors represented by $(Ba,Ca,Sr,Mg)_2SiO_4:Eu$, which is constituted by fractured particles having a fractured surface and emit light in the green region.

Other examples of green phosphors include: Eu-activated salt aluminate phosphor such as $Sr_4Al_{14}O_{25}:Eu$ and $(Ba,Sr,Ca)Al_2O_4:Eu$; Eu-activated salt silicate phosphor such as $(Sr,Ba)Al_2Si_2O_8:Eu$, $(Ba,Mg)_2SiO_4:Eu$, $(Ba,Sr, Ca,Mg)_2SiO_4:Eu$ and $(Ba,Sr, Ca)_2(Mg,Zn)Si_2O_7:Eu$; Ce,Tb-activated salt silicate phosphor such as $Y_2SiO_5:Ce,Tb$; Eu-activated salt borophosphate phosphor such as $Sr_2P_2O_7$—$Sr_2B_2O_5:Eu$; Eu-activated salt halosilicate phosphor such as $Sr_2Si_3O_8\text{-}2SrCl_2:Eu$; Mn-activated salt silicate phosphor such as $Zn_2SiO_4:Mn$; Tb-activated salt aluminate phosphor such as $CeMgAl_{11}O_{19}:Tb$ and $Y_3Al_5O_{12}:Tb$; Tb-activated salt silicate phosphor such as $Ca_2Y_8(SiO_4)_6O_2:Tb$ and $La_3Ga_5SiO_{14}:Tb$; Eu,Tb,Sm-activated thiogalate phosphor such as $(Sr,Ba,Ca)Ga_2S_4:Eu,Tb,Sm$; Ce-activated salt aluminate phosphor such as $Y_3(Al,Ga)_5O_{12}:Ce$ and $(Y,Ga,Tb,La,Sm,Pr,Lu)_3(Al,Ga)_5O_{12}:Ce$; Ce-activated salt silicate phosphor such as $Ca_3Sc_2Si_3O_{12}:Ce$ and $Ca_3(Sc,Mg,Na,Li)_2Si_3O_{12}:Ce$; Ce-activated oxide phosphor such as $CaSc_2O_4:Ce$; Eu-activated oxynitride phosphor such as $SrSi_2O_2N_2:Eu$, $(Sr,Ba,Ca)Si_2O_2N_2:Eu$ and Eu-activated β-sialon; Eu,Mn-activated salt aluminate phosphor such as $BaMgAl_{10}O_{17}:Eu,Mn$; Eu-activated salt aluminate phosphor such as $SrAl_2O_4:Eu$; Tb-activated oxysulfide phosphor such as $(La,Gd,Y)_2O_2S:Tb$; Ce,Tb-activated salt phosphate phosphor such as $LaPO_4:Ce,Tb$; sulfide phosphor such as $ZnS:Cu,Al,ZnS:Cu,Au,Al$; Ce,Tb-activated salt borate phosphor such as $(Y,Ga,Lu,Sc,La)BO_3:Ce,Tb$, $Na_2Gd_2B_2O_7:Ce,Tb$ and $(Ba,Sr)_2(Ca,Mg,Zn)B_2O_6:K,Ce,Tb$; Eu,Mn-activated salt halosilicate phosphor such as $Ca_8Mg(SiO_4)_4Cl_2:Eu,Mn$; Eu-activated thioaluminate phosphor or thiogallate phosphor such as $(Sr,Ca,Ba)(Al,Ga,In)_2S_4:Eu$; Eu,Mn-activated salt halosilicate phosphor such as $(Ca,Sr)_8(Mg,Zn)(SiO_4)_4Cl_2:Eu,Mn$.

Also applicable as green phosphor are fluorescent dye such as pyridine-phthalimide condensation product, benzoxadinone compound, quinazoline compound, coumarine compound, quinophthalone compound and naphtalate imide compound, and organic phosphor such as terbium complex having hexylsalicylate as a ligand.

[III-1-1-3. Blue Phosphor]

An example of the wavelength range of fluorescence emitted by a phosphor which emits blue fluorescence (referred to as "blue phosphor" as appropriate) is as follows. Its peak wavelength is usually 420 nm or longer, preferably 440 nm or longer, and usually 480 nm or shorter, preferably 470 nm or shorter.

As examples of blue phosphor can be cited europium-activated barium magnesium aluminate phosphors represented by $BaMgAl_{10}O_{17}:Eu$, which is constituted by growing particles having a nearly hexagonal shape as a shape of typical regular crystal growth and emit light in the blue region, europium-activated calcium halphosphate phosphors represented by $(Ca,Sr,Ba)_5(PO_4)_3Cl:Eu$, which is constituted by growing particles having a nearly spherical shape as a shape of typical regular crystal growth and emit light in the blue region, europium-activated alkaline earth chloroborate phosphors represented by $(Ca,Sr,Ba)_2B_5O_9Cl:Eu$, which is constituted by growing particles having a nearly cubic shape as a shape of typical regular crystal growth and emit light in the blue region, and europium-activated alkaline earth aluminate phosphors represented by $(Sr,Ca,Ba)Al_2O_4:Eu$ or $(Sr,Ca,Ba)_4Al_{14}O_{25}:Eu$, which is constituted by fractured particles having fractured surface and emit light in the blue region.

Other examples of blue phosphors include: Sn-activated salt phosphate phosphor such as $Sr_2P_2O_7:Sn$; Eu-activated salt aluminate phosphor such as $Sr_4AL_{14}O_{25}:Eu$, $BaMgAl_{10}O_{13}:Eu$ and $BaAl_8O_{13}:Eu$; Ce-activated thiogallate phosphor such as $SrGa_2S_4:Ce$ and $CaGa_2S_4:Ce$; Eu-activated salt aluminate phosphor such as $(Ba,Sr,Ca)MgAl_{10}O_{17}:Eu$ and $BaMgAl_{10}O_{17}:Eu,Tb,Sm$; Eu,Mn-activated salt aluminate phosphor such as $(Ba,Sr,Ca)MgAl_{10}O_{17}:Eu,Mn$; Eu-activated salt halophosphate phosphor such as $(Sr,Ca,Ba,Mg)_{10}(PO_4)_6Cl_2:Eu$ and $(Ba,Sr,Ca)_5(PO_4)_3(Cl,F,Br,OH):Eu,Mn,Sb$; Eu-activated salt silicate phosphor such as $BaAl_2Si_2O_8:Eu$, $(Sr,Ba)_3MgSi_2O_8:Eu$; Eu-activated salt phosphate phosphor such as $Sr_2P_2O_7:Eu$; sulfide such as $ZnS:Ag,ZnS:Ag,Al$; Ce-activated salt silicate phosphor such as $Y_2SiO_5:Ce$; salt tungstate phosphor such as $CaWO_4$; Eu,Mn-activated salt borophosphate phosphor such as $(Ba,Sr,Ca)BPO_5:Eu,Mn$, $(Sr,Ca)_{10}(PO_4)_6*nB_2O_3:Eu$ and $2SrO.0.84P_2O_5.0.16B_2O_3:Eu$; Eu-activated salt halosilicate phosphor such as $Sr_2Si_3O_8.2SrCl_2:Eu$.

Also applicable as blue phosphor are fluorescent dyes such as naphtalate imide compound, benzoxazole compound, styryl compound, coumarine compound, pyrazoline compound and triazole compound, and organic phosphor such as thallium complex.

[III-1-1-4. Yellow Phosphor]

An example of the wavelength range of fluorescence emitted by a phosphor which emits yellow fluorescence (hereinafter referred to as "yellow phosphor" as appropriate) is as follows. It is preferable that it is usually 530 nm or longer, preferably 540 nm or longer, more preferably 550 nm or longer, and usually 620 nm or shorter, preferably 600 nm or shorter, more preferably 580 nm or shorter. If the emission peak wavelength of yellow phosphor is too short, yellow components may be not enough and the semiconductor light-emitting device may be inferior in color rendering. If it is too long, the brightness of semiconductor light-emitting device may be lowered.

As examples of yellow phosphor can be cited various phosphors of such as oxide, nitride, oxynitride, sulfide and oxysulfide. As particularly preferable examples can be cited garnet phosphors represented by such as $RE_3M_5O_{12}:Ce$ (here, RE indicates at least one element from Y, Tb, Gd, Lu and Sm, M indicates at least one element from Al, Ga and Sc) and $M^2{}_3M^3{}_2M^4{}_3O_{12}:Ce$ (here, $M^2$, $M^3$ and $M^4$ are divalent, trivalent and tetravalent metal element respectively), having garnet structures; orthosilicate phosphors represented by such as $AE_2M^5O_4:Eu$ (here, AE indicates at least one element from Ba, Sr, Ca, Mg and Zn, $M^5$ indicates at least one element from Si and Ge); oxynitride phosphors in which a part of oxygen, which is constituent element of the above types of phosphors, is substituted by nitrogen; and Ce-activated nitride phosphors having $CaAlSiN_3$ structures such as $AEAlSiN_3:Ce$ (here, AE indicates at least one element from Ba, Sr, Ca, Mg and Zn).

Also applicable as yellow phosphor are Eu-activated sulfide phosphor such as $CaGa_2S_4:Eu$ $(Ca,Sr)Ga_2S_4:Eu$, $(Ca,Sr)(Ga,Al)_2S_4:Eu$; and Eu-activated oxynitride phosphor having SiAlON structure such as $Cax(Si,Al)_{12}(O,N)_{16}:Eu$.

[III-1-1-5. Other Phosphors]

The semiconductor light-emitting device member of the present invention may contain phosphors other than those cited above. For example, the semiconductor light-emitting device member of the present invention may be a fluorescent glass in which an ionic-state phosphor material or an organic/inorganic phosphor component is dissolved or dispersed uniformly and transparently.

[III-1-2. Particle Diameter of Phosphor]

No particular limitation is imposed on the particle diameter of phosphors used in the present invention. However, the median particle diameter ($D_{50}$) thereof is usually 0.1 μm or larger, preferably 2 μm or larger, more preferably 5 μm or larger, and usually 100 μm or smaller, preferably 50 μm or smaller, more preferably 20 μm or smaller. When the median particle diameter ($D_{50}$) of the phosphors is within the above range, the light emitted from the semiconductor luminous element can be scattered sufficiently, in the semiconductor light-emitting device to be described later. In addition, in such a case, the light emitted from the semiconductor luminous element is absorbed in the phosphor particles sufficiently, and therefore, not only the wavelength conversion can be performed highly efficiently but also the light emitted from the phosphors can be radiated in all directions. With this structure, a white light can be obtained by mixing primary lights from the plural kinds of phosphors, as well as a synthesized light emitted from the semiconductor light-emitting device can be obtained, having uniform whiteness and illumination intensity. On the other hand, when the median particle diameter ($D_{50}$) of the phosphors is larger than the above range, the phosphors can not fill the space of illuminant portion sufficiently, and therefore, the light emitted from the semiconductor luminous element may not be absorbed in the phosphors sufficiently, in the semiconductor light-emitting device to be described later. When the median particle diameter ($D_{50}$) of the phosphors is smaller than the above range, emission efficiency of the phosphors will be reduced, and therefore, illumination intensity of the semiconductor light-emitting device may be reduced.

It is preferable that the particle size distribution (QD) of the phosphor particles is smaller for the purpose of equalizing the dispersion state of the particles in the semiconductor light-emitting device member. However, the smaller the particle size distribution, the lower the classification efficiency will be and therefore the higher the cost will be. For that reason, it is usually 0.03 or larger, preferably 0.05 or larger, more preferably 0.07 or larger, and usually 0.4 or smaller, preferably 0.3 or smaller, more preferably 0.2 or smaller.

In the present invention, the median particle diameter ($D_{50}$) and particle size distribution (QD) can be obtained from a mass-standard particle size distribution curve. The mass-standard particle size distribution curve can be obtained from the measurement of particle size distribution by laser diffraction/scattering method, as described, for example, concretely in the following.

[Method of Measuring Mass-Standard Particle Size Distribution Curve]

(1) Phosphor particles are dispersed in such a solvent as ethylene glycol under the condition of 25° C. temperature and 70% humidity.
(2) Particle size distribution is measured by laser diffraction particle size analyzer (LA-300, manufactured by HORIBA, Ltd) at particle diameter range of 0.1 μm to 600 μm.
(3) The particle diameter whose integrated value is 50% in this mass-standard particle size distribution curve is represented by "median particle diameter $D_{50}$". The particle diameters of 25% and 75% integrated values are represented by $D_{25}$ and $D_{75}$ respectively. QD is defined as $(D_{75}-D_{25})/(D_{75}+D_{25})$. Small value of QD means a narrow particle size distribution.

Also, the shape of the phosphor particles is not particularly limited as long as formation of the semiconductor light-emitting device members is not affected. For example, it not limited as long as the fluidity or the like of the phosphor part formation liquid (namely, liquid for forming the semiconductor light-emitting device member containing phosphor, which has the same meaning as phosphor component) is not affected.

[III-1-3. Surface Treatment of Phosphor]

A surface treatment may be performed to the phosphor used in the present invention, for the purpose of enhancing the water resistance or preventing unnecessary aggregation of the phosphor in the semiconductor light-emitting device member. As examples of such a surface treatment can be cited and known various surface treatment such as using organic, inorganic, glass and the like materials as defined in Japanese Patent Laid-Open Publication (Kokai) No. 2002-223008, a coating treatment with metal phosphate as defined in Japanese Patent Laid-Open Publication (Kokai) No. 2000-96045 or the like, a coating treatment with metal oxide.

For example, when metal phosphate is coated on the surface of phosphors, the following steps (i) to (iii) of surface treatment is performed concretely. (i) Predetermined amounts of water-soluble salt phosphate such as potassium phosphate and sodium phosphate and water-soluble metallic salt of at least one metal element selected from alkaline earth metals such as calcium chloride, strontium sulfate, manganese chloride and zinc nitrate, Zn and Mn are mixed in the phosphor suspension liquid and stirred. (ii) Salt phosphate of at least one metal element, selected from alkaline earth metals, Zn and Mn, is formed in the suspension, and simultaneously the metal phosphate formed is deposited on the surface of the phosphors.
(iii) Water is removed.

As other preferable examples of surface treatment can be cited, for example as silica coating, a method in which $SiO_2$ is deposited by neutralizing a liquid glass, and a method of surface treatment with hydrolyzed alkoxysilane (for example, Japanese Patent Laid-Open Publication (Kokai) No. Hei 3-231987). Of these, the method of surface treatment with hydrolyzed alkoxysilane is preferable from the standpoint of enhancing the dispersibility.

[III-1-4. Mixing Method of Phosphor]

In the present invention, the method of adding phosphor particles is not particularly limited. If phosphor particles are in a good dispersion state, it is sufficient only to post-mix phosphor particles into the above liquid for forming the semiconductor light-emitting device member. That is, it is sufficient to prepare a phosphor part formation liquid, by mixing the liquid for forming the semiconductor light-emitting device member of the present invention and the phosphor, and to form the semiconductor light-emitting device member by using this phosphor part formation liquid. If phosphor particles tend to aggregate, it is preferable to perform hydrolysis and polycondensation in the presence of phosphor particles, mixed in advance into the reaction solution (hereinafter referred to as a "solution before hydrolysis" when appropriate) containing material compounds not yet subjected to hydrolysis. With this procedure, silane coupling processing is conducted in a part of the particles' surfaces and the dispersion state of the phosphor particles is improved.

Some types of phosphor are hydrolyzable. However, in the semiconductor light-emitting device member of the present invention, moisture content exists potentially as silanol products and almost no liberated moisture content exists in a liquid state (liquid for forming the semiconductor light-emitting device member) before the coating process, and therefore such phosphors can also be used without being hydrolyzed. Also an advantage of easily using such phosphors together can be obtained, by using the liquid for forming the semiconductor light-emitting device member, already hydrolyzed and polycondensated, after performing dehydration and dealcoholization processes.

Further, when phosphor particles or inorganic particles (to be described later) are dispersed in the semiconductor light-emitting device member of the present invention, it is possible to modify the surface of the particles with organic ligands in order to improve dispersibility. Addition type silicone resin, which has previously been used as semiconductor light-emitting device member, was liable to undergo curing impairment by these organic ligands and could not be mixed/cured with particles which had been surface-treated. This is because platinum series curing catalyst used in addition reaction type silicone resin interacts strongly with organic ligands and loses capability of hydrosilylation, resulting in poor curing. Examples of these damaging substances include organic compounds containing N, P and S, ionic compounds of heavy metals such as Sn, Pb, Hg, Bi and As, and organic compounds containing multiple bond such as acetylene group (flux, amines, vinyl chloride, sulfur vulcanized rubber). On the other hand, the semiconductor light-emitting device member of the present invention is related to condensing-type curing mechanism, which is less liable to undergo inhibition by these damaging substances. Therefore, the semiconductor light-emitting device member of the present invention can be used more freely in combination with phosphor particles or inorganic particles, whose surfaces have been improved with organic ligands, or, further, with phosphor components such as complex phosphors. This means an excellent property as transparent material that is capable of introducing binders for phosphors or nano particles with high refractive indexes.

[III-1-5. Content of Phosphor]

The content of the phosphor in the semiconductor light-emitting device member of the present invention can be selected arbitrary insofar as the advantage of the present invention is not significantly impaired. Actually, it can be selected freely depending on its form of applications. As regards a semiconductor light-emitting device emitting white light, which is used for white LED, white-light lighting system or the like, if the entire recess of the package including the semiconductor luminous element is filled by means of potting, with the phosphor dispersed uniformly, the total content of the phosphor is usually 0.1 weight % or more, preferably 1 weight % or more, more preferably 5 weight % or more, and usually 35 weight % or less, preferably 30 weight % or less, more preferably 28 weight % or less.

In the same application form, but when a material with phosphor dispersed in a high concentration is coated as a thin film, at the portion apart from the emission surface (for example, the opening surface of the package with which recess, containing the semiconductor luminous element, is filled with transparent sealant, or the light-exiting surface of an external optical element such as glass lid for an air-tight sealing of LED, lens and optical waveguide) of the semiconductor luminous element of the semiconductor light-emitting device, the total content is usually 5 weight % or more, preferably 7 weight % or more, more preferably 10 weight % or more, and usually 90 weight % or less, preferably 80 weight % or less, more preferably 70 weight % or less.

When a white light is intended to be obtained by mixing the luminescent colors of the semiconductor luminous element and phosphor, generally a part of the light emitted from the semiconductor luminous element passest. Therefore, in such a case, the concentration of the phosphor tends to be as low as close to the lower limit of the above-mentioned range. On the other hand, when a white light is obtained by converting all of the light emitted from the semiconductor luminous element into the light with luminescent color of the phosphor, it is preferable that the concentration of the phosphor is high. Therefore, in such a case, the concentration of the phosphor tends to be as high as close to the upper limit of the above-mentioned range. If the content of the phosphor is above this range, coating properties may be lowered, or low efficiency of phosphor utilization, due to an optical interference, may reduce brightness of the semiconductor light-emitting device. If the content of the phosphor is below this range, the wavelength conversion by the phosphor will be insufficient and therefore the intended luminescent color may not be obtained.

An example of the content of phosphor, which is used in the semiconductor light-emitting device emitting white light, is shown above. However, the concrete content of the phosphor is not limited to that and varies widely depending on the intended color, emission efficiency of the phosphor, color mixing method, specific gravity of the phosphor, film thickness of coating, shape of the device or the like.

The liquid for forming the semiconductor light-emitting device member of the present invention has such advantages as low viscosity, high misciblility with phosphors or inorganic particles and good coating properties that can be maintained even when high concentration of phosphors or inorganic particles are dispersed therein, in comparison with the conventional liquid for forming the semiconductor light-emitting device such as epoxy resin and silicone resin. Moreover, it can be of high viscosity as needed by such a method of adjusting the degree of polymerization and adding thixotropic agent like aerosil. Namely, it is very flexible in adjustment of viscosity according to the intended content of phosphors. Therefore, it can provide a coating liquid that can correspond very flexibly to not only the kinds or shapes of coating objects but also the various coating methods such as potting, spin coating and printing.

The content of the phosphor in the semiconductor light-emitting device member can be determined by the following procedure, if the composition of the phosphor can be identified. A phosphor-containing sample is prebaked after being pulverized so as to remove carbon components, followed by removing silicon components as hydrofluorosilicic acid by hydrofluoric acid treatment. By dissolving the residue in diluted sulfuric acid, the metal elements, which are the main components, are made into water solution and the quantity thereof is determined by such known elemental analyses as ICP, flame analysis and fluorescent X-ray analysis. Then the content of the phosphor can be determined by a calculation. If the shapes and particle diameters of the phosphors are uniform and the specific gravity thereof is known, the content of phosphor can be determined, by a simplified method, namely, by conversion from the number of the particles per unit area, obtained by image analysis of the cross section of the coating.

The phosphor content in the phosphor part formation liquid can be set so that the phosphor content in the semiconductor light-emitting device member falls within the above range. Namely, when the weight of the phosphor part formation liquid is not changed in the drying process, the phosphor content in the phosphor part formation liquid will be equal to the phosphor content in the semiconductor light-emitting device member. On the other hand, when the weight of the phosphor part formation liquid is changed in the drying process, for example because the phosphor part formation liquid contains a solvent or the like, the phosphor content in the phosphor part formation liquid other than the solvent or the like can be considered the same as the phosphor content in the semiconductor light-emitting device member.

[III-2. Combined Use of Inorganic Particles (Fillers)]

The semiconductor light-emitting device member of the present invention, for example when it is used for a semiconductor light-emitting device, may further contain inorganic particles for the purpose of improving the optical characteristics and workability, or obtaining any of effects <1> to <5> shown below.

<1> By mixing inorganic particles as a light scattering substance into the semiconductor light-emitting device member to cause light from the semiconductor light-emitting device to scatter, the amount of light from the semiconductor luminous element incident on the phosphor is increased. This improves the efficiency of wavelength conversion and also widens the angle of spreading light from the semiconductor light-emitting device to the outside.

<2> By blending the semiconductor light-emitting device member with inorganic particles as a binder, crack generations are prevented.

<3> By blending the liquid for forming the semiconductor light-emitting device member with inorganic particles as a viscosity modifier, viscosity of the liquid is hightened.

<4> By blending the semiconductor light-emitting device member with inorganic particles, the shrinkage thereof is reduced.

<5> By blending the semiconductor light-emitting device member with inorganic particles, the refractive index thereof is adjusted so as to improve the efficiency of extracting light.

In this case, it is only necessary to mix an appropriate amount of inorganic particles into the liquid for forming the semiconductor light-emitting device member, similarly to the phosphor powders, according to purposes. Effects that can be obtained in this case depend on the type and the amount of inorganic particles to be mixed.

When, for example, an ultrafine particle silica (manufactured by Nippon Aerosil Co., Ltd., commercial name: AEROSIL#200) with particle diameter of about 10 nm is used as the inorganic particle, the effect of the above <3> is noticeable because thixotropy of the liquid for forming the semiconductor light-emitting device member increases.

When a fractured silica or spherical silica whose particle diameter is about several μm is used as the inorganic oxide particle, it functions mainly as the aggregate for the semiconductor light-emitting device member and increase in thixotropy is little. Therefore, in such a case, the effects of the above <2> and <4> are noticeable.

Also, if inorganic particles of about 1 μm in diameter, whose refractive index is different from that of the semiconductor light-emitting device member, are used, the effect of the above <1> is noticeable because the light scattering at the interface between the semiconductor light-emitting device member and the inorganic particles increases.

If inorganic particles, whose refractive index is larger than that of the semiconductor light-emitting device member and diameter is 3 to 5 nm, more specifically, is equal to or less than the luminous wavelength, are used, the refractive index of the semiconductor light-emitting device member can be improved while maintaining transparency thereof. Therefore, in such a case, the effect of the above <5> is noticeable.

Therefore, the type of inorganic particles to be mixed may be selected according to the purposes. Only one type of the inorganic particles may be selected or a plurality of types of inorganic particles may be combined. Also, in order to improve the dispersibility thereof, a surface treatment may be applied on the particles with a surface treatment agent such as a silane coupling agent.

[III-2-1. Type of Inorganic Particles]

Exemplified types of inorganic particles to be used include: inorganic oxide particles such as silica, barium titanate, titanium oxide, zirconium oxide, niobium oxide, aluminum oxide, cerium oxide and yttrium oxide; and diamond particles. However, other materials can be also selected depending on the purposes and thus the above examples are not limited.

Inorganic particles may be in any form, depending on the purposes, such as powder and slurry. However, if the transparency must be maintained, it is preferable to equalize the refractive indexes of the inorganic particles and the semiconductor light-emitting device member of the present invention or to add the particles as transparent sol, which is aqueous or of solvent, to the liquid for forming the semiconductor light-emitting device member.

Inorganic particles may be used either as a single kind of them or as a mixture of more than one kind in any combination and in any ratio.

[III-2-2. Median Particle Diameter of Inorganic Particles]

There is no special limitation on the median particle diameter of these inorganic particles (primary particles). Usually, it is about 1/10 or less that of phosphor particles. More concretely, the following median particle diameter is adopted depending on the use. For example when the inorganic particle is used as light scattering agent, the median particle diameter thereof falls within preferably 0.01 μm to 10 μm. For example when the inorganic particle is used as aggregate, the median particle diameter thereof falls within preferably 1 nm to 10 μm. For example when the inorganic particle is used as thickener (thixotropic agent), the median particle diameter thereof falls within preferably 10 nm to 100 nm. For example when the inorganic particle is used as refractive index adjusting agent, the median particle diameter thereof falls within preferably 1 nm to 10 nm.

[III-2-3. Mixing Method of Inorganic Particle]

There is no special limitation on the method of mixing inorganic particles in the present invention. Usually, it is recommended that mixing is performed with a planetary mixer, similarly to phosphor, while defoaming is done. When small particles which are liable to aggregate like aerosil are mixed, aggregated particles are crushed after mixing, as needed, using a beads mill or three axis roll mill, and then large particles which are easy to mix, such as phosphor, can be mixed.

[III-2-4. Content of Inorganic Particle]

The content of the inorganic particle in the semiconductor light-emitting device member of the present invention can be selected arbitrary insofar as the advantage of the present invention is not significantly impaired. Actually, it can be selected freely depending on its form of applications. For example when the inorganic particle is used as light scattering agent, the content thereof falls within preferably 0.01 to 10 weight %. As another example, when the inorganic particle is used as aggregate, the content thereof falls within preferably 1 to 50 weight %. As still another example, when the inorganic particle is used as thickener (thixotropic agent), the content thereof falls within preferably 0.1 to 20 weight %. As still another example, when the inorganic particle is used as refractive index adjusting agent, the content thereof falls within preferably 10 to 80 weight %. When the amount of inorganic particle is too small, the desired advantageous effects may be unobtainable. When the amount is too large, various characteristics such as adhesion of the cured product, transparency and hardness may be affected adversely.

The liquid for forming the semiconductor light-emitting device member of the present invention has such advantages as low viscosity, high miscibility with phosphors or inorganic particles and good coating properties that can be maintained even when high concentration of inorganic particles are dispersed therein, in comparison with the conventional liquid for forming the semiconductor light-emitting device such as epoxy resin and silicone resin. Moreover, it can be of high viscosity as needed by such a method of adjusting the degree of polymerization or adding thixotropic agent like aerosil. Namely, it is very flexible in adjustment of viscosity according to the intended content of inorganic particles. Therefore, it can provide a coating liquid that can correspond very flexibly to not only the kinds or shapes of coating objects but also the various coating methods such as potting, spin coating and printing.

The content of the inorganic particles in the semiconductor light-emitting device member can be measured by the same method as that of the above-described content of phosphor.

The inorganic particle content in the liquid for forming the semiconductor light-emitting device member can be set so that the inorganic particle content in the semiconductor light-emitting device member falls within the above range. Namely, when the weight of the liquid for forming the semiconductor light-emitting device member is not changed in the drying process, the inorganic particle content in the liquid for forming the semiconductor light-emitting device member will be equal to the inorganic particle content in the semiconductor light-emitting device member. On the other hand, when the weight of the liquid for forming the semiconductor light-emitting device member is changed in the drying process, for example because the liquid for forming the semiconductor light-emitting device member contains a solvent or the like, the inorganic particle content in the liquid for forming the semiconductor light-emitting device member other than the solvent or the like can be considered the same as the inorganic particle content in the semiconductor light-emitting device member.

[III-3. Combined Use of Conductive Filler]

Conductive filler may be also contained, for example when the semiconductor light-emitting device member of the present invention is used for a semiconductor light-emitting device, for the purpose of adding conductivity and forming an electric circuit at lower temperature than the soldering temperature by means of printing, potting or the like.

As type of conductive filler to be used can be cited precious metal powder such as silver powder, gold powder, platinum powder and palladium powder, base metal powder such as copper powder, nickel powder, aluminum powder, brass powder and stainless steel powder, precious or base metal powder plated and alloyed with precious metal such as silver, organic resin powder or silica powder coated with precious metal or base metal, and carbon series filler such as carbon black or graphite. However, other materials can also be selected depending on the purposes and thus the above examples are not limited. Conductive filler may be used either as a single kind of them or as a mixture of more than one kind in any combination and in any ratio.

Conductive filler may be supplied in any form such as powder or slurry, depending on the purpose. When transparency needs to be maintained or print formation with fine wiring is necessary, it is preferably added to the liquid for forming the semiconductor light-emitting device member as transparent sol which is aqueous or of solvent with no aggregation or as nano particle powder with its surface modified to allow easy redispersion.

Examples of the form of these metal powders includes flake (scale), sphere, grain, dendrite, and three-dimensional aggregation of primary particles of sphere. Of these, the use of silver powder as main component is preferable from the standpoint of conductivity, cost and reliability. In terms of conductivity, combined use of silver powder and a small amount of carbon black and/or graphite is more preferable. Further, from the standpoint of conductivity and reliability, the use of silver powder in the form of flake or sphere is preferable, and the combined use of flake and sphere silver powder is most preferable. Further, inorganic filler such as silica, talc, mica, barium sulfate or indium oxide can be added in a small amount, if considered appropriate.

Preferable proportion (weight ratio) of silver powder and carbon black and/or graphite micropowder is as follows. On the supposition that the total amount of silver powder and carbon black and/or graphite micropowder is 100 weight ratio, the upper limit of silver powder is preferably 99.5 weight ratio or less, more preferably 99 weight ratio or less, and the lower limit is 85 weight ratio or more, preferably 90 weight ratio or more.

There is no special limitation on the median particle diameter of the conductive filler. Usually, it is 0.1 µm or larger, preferably 0.5 µm or larger, more preferably 1 µm or larger, and usually 50 µm or smaller, preferably 20 µm or smaller, more preferably 10 µm or smaller. Particularly when transparency or micro manipulation is required, it is usually 3 nm or larger, preferably 10 nm or larger, and usually 150 nm or smaller, preferably 100 nm or smaller.

The content of conductive filler is usually 50 weight % or more, preferably 75 weight % or more, and more preferably 80 weight % or more, assuming that the combined amount of the conductive filler and the binder resin is 100 weight %. From the standpoint of adhesiveness and ink viscosity, it is usually 95 weight % or less, preferably 93 weight % or less, and more preferably 90 weight % or less. When the amount of conductive filler is too small, the desired advantageous effects may be unobtainable. When the amount is too large, various characteristics such as adhesion of the cured product, transparency and hardness may be affected adversely.

The liquid for forming the semiconductor light-emitting device member of the present invention has such advantages as low viscosity, high miscibility with phosphors or inorganic particles and good coating properties that can be maintained even when high concentration of inorganic particles are dispersed therein, in comparison with the conventional liquid for forming the semiconductor light-emitting device such as epoxy resin and silicone resin. Moreover, it can be of high viscosity as needed by such a method of adjusting the degree of polymerization and adding thixotropic agent like aerosil. Namely, it is very flexible in adjustment of viscosity according to the intended content of inorganic particles. Therefore, it can provide a coating liquid that can correspond very flexibly to not only the kinds or shapes of coating objects but also the various coating methods such as potting, spin coating and printing.

The content of the inorganic particles in the semiconductor light-emitting device member can be measured by the same method as that of the above-described content of phosphor.

[III-4. Combined Use With Other Members]

The semiconductor light-emitting device member of the present invention may be used as sealing material singly. However, it may also be used together with other members for more complete cutoff of oxygen or moisture for example when it seals organic phosphor or phosphor or semiconductor light-emitting device, which are liable to deteriorate by oxygen or moisture, or the like. In such a case, an air-tight sealing, using such an air tight sealant as glass plate or epoxy resin, or vacuum sealing may be added from outside of the member of the present invention, provided for retention of the phosphor, sealing the semiconductor luminous element or extracting light. In this case, the structure of the device is not specially limited. Namely, it is enough for the sealant, coated body or coated layer, made of the semiconductor light-emitting device member of the present invention, to be substantially protected and blocked from outside by an air-tight material such as metal, glass or air-tight resin, so as to allow no passage of oxygen and moisture.

In addition, the semiconductor light-emitting device member of the present invention may be used as adhesive agent for a semiconductor light-emitting device because it excels in adhesion as described above. More specifically, for example, the semiconductor light-emitting device member of the present invention can be used for uniting a semiconductor element with a package, semiconductor element with a sub mount, package constituents together, a semiconductor light-emitting device with an external optical element, by means of coating, printing or potting. Since the semiconductor light-emitting device member of the present invention excels particularly in light resistance and heat resistance, it provides a semiconductor light-emitting device with high reliability enough to stand long-time use, when it is used as adhesive agent for a semiconductor light-emitting device with high output level, which is thus exposed to high temperature or ultraviolet rays for a long time.

The semiconductor light-emitting device member of the present invention can achieve sufficient adhesion singly. However, for more sufficient adhesion, various surface treatments for improving adhesion may be performed on the surface, which will be directly in contact with the semiconductor light-emitting device member. As examples of such surface treatment can be cited formation of an adhesion-improving layer using primer or silane coupling agent, chemical surface treatment using such an agent as acids or alkali, physical surface treatment using plasma irradiation, ion irradiation or electron beam irradiation, surface-roughening procedure by sandblasting, etching or microparticles coating. As other examples of surface treatment for improving adhesion can be cited known surface treatment methods described in Japanese Patent Laid-Open Publication (Kokai) No. Hei 5-25300, "Hyomen Kagaku", Vol. 18 No. 9, pp 21-26, written by Norihiro Inagaki, and "Hyomen Kagaku", Vol. 19 No. 2, pp 44-51 (1998), written by Kazuo Kurosaki.

[IV. Semiconductor Light-Emitting Device]

The semiconductor light-emitting devices using the semiconductor light-emitting device member of the present invention (namely, the semiconductor light-emitting device of the present invention) will be described below with reference to embodiments. In each embodiment below, the semiconductor light-emitting device is abbreviated as the "light emitting device" when appropriate. In which part of the semiconductor light-emitting device of the present invention the semiconductor light-emitting device member of the present invention is used will be summarized after all embodiments have been described. However, these embodiments are used only for convenience of description, and therefore, examples of the light emitting devices (the semiconductor light-emitting devices) to which the semiconductor light-emitting device member of the present invention is applied are not limited to these embodiments.

[IV-1. Basic Concepts]

Application examples A) and B) of the semiconductor light-emitting devices using the semiconductor light-emitting device member of the present invention are shown below. In any of the application examples, the semiconductor light-emitting device member of the present invention shows, compared to conventional semiconductor light-emitting device members, superiority in light and heat resistance, less frequent crack generations and peelings, as well as less degradation in brightness. Therefore, a member showing high reliability for a long period of time can be provided, by the semiconductor light-emitting device member of the present invention.

A) Semiconductor light-emitting devices utilizing the luminescent color of the luminous element as it is B) Semiconductor light-emitting devices that emit light of desired wavelengths utilizing fluorescence, by means of disposing a phosphor part near the luminous element so as to make the phosphor and the phosphor components in the phosphor part be excited by the light from the luminous element The semiconductor light-emitting device member of the present invention of application example A) can be used even singly as a highly durable sealant, light extracting film, and functional component retaining agent, by utilizing the high durability, transparency, and sealing properties of the semiconductor light-emitting device member of the present invention. Particularly when the semiconductor light-emitting device member of the present invention is used as functional component retaining agent for retaining the above inorganic particles for, enhancing the refractive index while maintaining transparency, the reflection on the light exiting surface of the luminous element can be reduced, which then leads to the enhancement in efficiency of extracting light, by using the semiconductor light-emitting device member of the present invention being in close contact with the light exiting surface of the luminous element and making the member have a refractive index approximately equal to that of the luminous element.

Also, the semiconductor light-emitting device member of the present invention of application example B) can demonstrate superior capabilities similar to those of the above application example A). In addition, it makes possible to form a phosphor part that is highly durable and can extract light with high efficiency, by retaining a phosphor or phosphor components as described above. Further, when the semiconductor light-emitting device member of the present invention retains a component for enhancing refractive index while maintaining transparency together with the phosphor or phosphor components, the interface reflection can be reduced, which then leads to the enhancement in efficiency of extracting light, by adjusting the refractive index of the semiconductor light-emitting device member of the present invention to be approximately equal to that of the luminous element or the phosphor.

A basic concept of each embodiment to which the semiconductor light-emitting device member of the present invention is applied will be described below with reference to FIG. 49(a) and FIG. 49(b). FIG. 49(a) and FIG. 49(b) are explanatory drawings of the basic concept of each embodiment. FIG. 49(a) corresponds to the above application example A) and FIG. 49(b) corresponds to the above application example B).

As shown in FIG. 49(a) and FIG. 49(b), light emitting devices (semiconductor light-emitting devices) 1A and 1B of each embodiment comprise luminous elements 2 comprised of LED chips and semiconductor light-emitting device members 3A and 3B of the present invention, disposed close to luminous elements 2.

However, in embodiments (Embodiments A-1 and A-2) corresponding to the above application example A), as shown in FIG. 49(a), light emitting device 1A does not contain any phosphor or phosphor component in semiconductor light-emitting device member 3A. In this case, semiconductor light-emitting device member 3A performs various functions such as sealing of luminous element 2, extracting light and functional components retaining. In the description below, semiconductor light-emitting device member 3A containing no phosphor or phosphor component will be called a "transparent member" when appropriate.

On the other hand, in embodiments (Embodiments B-1 to B-40) corresponding to the above application example B), as shown in FIG. 49(b), the light emitting device 1B contain a phosphor or phosphor component in semiconductor light-emitting device member 3B. In this case, semiconductor light-emitting device member 3B can perform a function of wavelength conversion, in addition to the functions that can be performed by semiconductor light-emitting device member 3A in FIG. 49(a). In the description below, semiconductor light-emitting device member 3B containing a phosphor or phosphor component will be called a "phosphor part" when appropriate. The phosphor part may be shown by numerals 33 and 34 according to its shape or functions when appropriate.

Luminous element 2 is comprised of an LED chip, for example, emitting blue light or ultraviolet light, but it may be an LED chip of other luminescent color.

Transparent member 3A performs various functions of such as a highly durable sealant for luminous element 2, light extracting film and various-functions adding film. Transparent member 3A may be used alone. Or otherwise, it can contain any additives, excluding the phosphor and phosphor components, as long as the advantage of the present invention is not significantly impaired.

Phosphor part 3B, on the other hand, can perform not only functions of such as a highly durable sealant for luminous element 2, light extracting film and various-functions adding film, but also a function of wavelength conversion, that is, a function to emit light of the desire wavelength after the excitation by the light from luminous element 2. Phosphor part 3B has only to contain at least a phosphor material that emits light of the desired wavelength after being excited by the light from luminous element 2. Examples of such a phosphor material include various phosphors exemplified above. Luminescent colors of the light that can be emitted by phosphor part 3B include white of a fluorescent lamp and yellow of a light bulb, as well as three primary colors red (R), green (G) and blue (B). In summary, phosphor part 3B has a wavelength conversion function for emitting light of the desired wavelength that is different from that of the excitation light.

In the above light emitting device 1A shown in FIG. 49(a), light 4 emitted from luminous element 2 passes through transparent member 3A before being emitted out of light emitting device 1A. Therefore, in light emitting device 1A, light 4 emitted from luminous element 2 will be used unchanged in luminescent color of the light emitted from luminous element 2.

In light emitting device 1B shown in FIG. 49(b), on the other hand, light 4a, a portion of the light emitted from luminous element 2, passes through phosphor part 3B unchanged before being emitted out of light emitting device 1B. Also in light emitting device 1B, light 4b, another portion of the light emitted from luminous element 2, is absorbed by phosphor part 3B, resulting in that phosphor part 3B is excited and light 5 having wavelengths specific to phosphor components contained in phosphor part 3B, such as phosphor particles, fluorescent ions and fluorescent dyes, is emitted out of light emitting device 1B.

Therefore, a synthesized light 6 synthesized from light 4a, which has passed through phosphor part 3B after being emitted from luminous element 2, and light 5, which is emitted from phosphor part 3B, will be radiated from light emitting device 1B as a light with converted wavelength. The luminescent color of the whole light emitted from light emitting device 1B will be determined by the luminescent color of luminous element 2 and that of phosphor part 3B. In this context, light 4a, which passes through phosphor part 3B after being emitted from luminous element 2, is not always necessary.

IV-2. Embodiments

A. Embodiments that do not Use Fluorescence

Embodiment A-1

In light emitting device 1A of the present embodiment, as shown in FIG. 1, luminous element 2 is surface-mounted on an insulating substrate 16 on which printed wiring 17 is carried out. In luminous element 2, a p-type semiconductor layer (not shown) and an n-type semiconductor layer (not shown) in a luminous layer part 21 are connected electrically to printed wirings 17 and 17 via conductive wires 15 and 15 respectively. Conductive wires 15 and 15 have a small cross section so that the light emitted from luminous element 2 may not be blocked.

As luminous element 2, one that emits light of any wavelengths, from ultraviolet to infrared regions, may be used. In this embodiment, a gallium nitride LED chip is assumed to be used. In luminous element 2, an n-type semiconductor layer (not shown) is formed on the lower side in FIG. 1 and a p-type semiconductor layer (not shown) is formed on the upper side in the same. The upper side of FIG. 1 is assumed to be the front side in the following description because light output is extracted from the side of the p-type semiconductor layer.

A frame-shaped frame 18 encircling luminous element 2 is fixed onto insulating substrate 16. A sealing part 19 for sealing and protecting luminous element 2 is provided inside frame 18. This sealing part 19 is formed of transparent member 3A, which is the semiconductor light-emitting device member of the present invention, and the formation thereof can be performed by potting with the above liquid for forming the semiconductor light-emitting device member.

Thus, because light emitting device 1A of the present embodiment is provided with luminous element 2 and transparent member 3A, the light resistance and heat resistance of light emitting device 1A can be improved. Moreover, since crack generations and peelings are less likely to occur in sealing part 3A, the transparency in sealing part 3A can be increased.

Further, the light color unevenness and light color fluctuations can be reduced and also the efficiency of extracting light to the outside can be enhanced, in comparison with conventional light emitting devices. This is because sealing part 3A can be made to be transparent without clouding and turbidity. For that reason, light emitting device 1A is superior in homogeneity of light color with almost no light color fluctuations among light emitting devices 1A, and also can enhance the efficiency of extracting light from luminous element 2 to the outside when compared with conventional light emitting devices. Also, the light resistance of the luminescent material can be enhanced and thus the lifetime of light emitting device 1A can be prolonged in comparison with conventional devices.

Embodiment A-2

Figure 2:
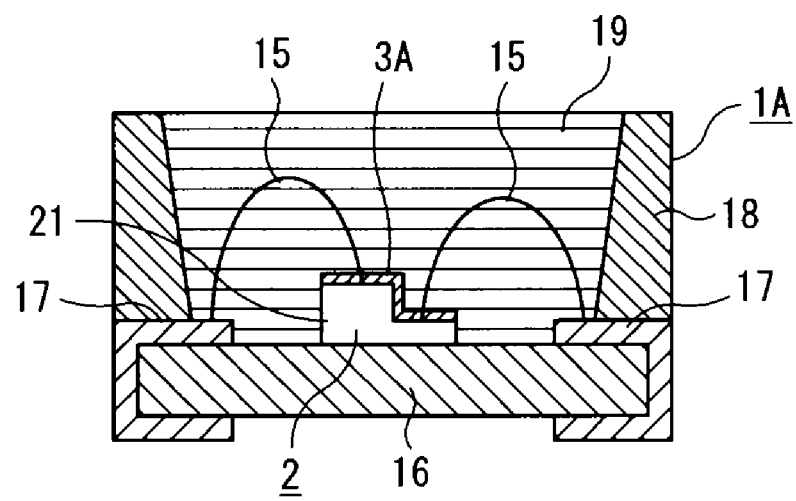
FIG. 2 is a schematic sectional view showing Embodiment A-2.

Light emitting device 1A of the present embodiment is structured, as shown in FIG. 2, in the same manner as the above embodiment A-1, except that the front side of luminous element 2 is covered with transparent member 3A and sealing part 19, formed on member 3A. Sealing part 19 is formed of a material different from that of transparent member 3A. Transparent member 3A on the surface of luminous element 2 is a transparent thin film, functioning as a light extracting film and sealing film. Transparent member 3A can be formed, for example, by coating the above liquid for forming the semiconductor light-emitting device member, by a method of spin coating or the like, during the formation process of a chip of luminous element 2. Meanwhile, the same components as in embodiment A-1 are designated by the same reference numerals to omit redundant explanations.

Thus, because light emitting device 1A of the present embodiment is also provided with luminous element 2 and transparent member 3A, like embodiment A-1, the light resistance and heat resistance of light emitting device 1A can be improved. Moreover, since crack generations and peelings are also less likely to occur in sealing part 3A, the transparency in sealing part 3A can be increased.

Further, other advantages, like those of embodiment A-1, can be also obtained.

B. Embodiments Using Fluorescence

Embodiment B-1

Figure 3A:
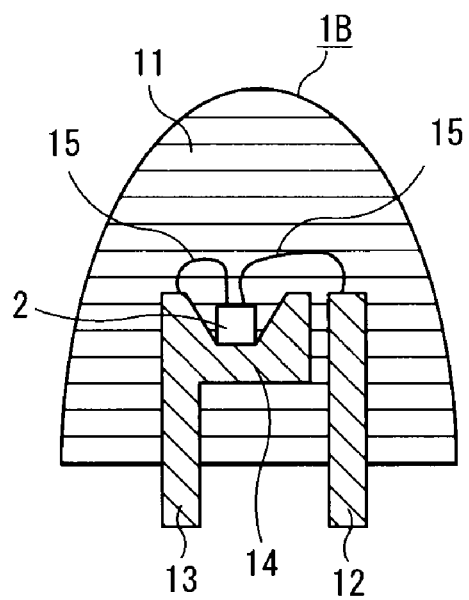
FIG. 3(a) is a schematic sectional view and FIG. 3(b) is an enlarged view of a substantial part of FIG. 3(a)

Light emitting device 1B of the present embodiment is provided, as shown in FIG. 3(a), with luminous element 2 comprised of an LED chip and a mold part 11 obtained by forming a light-transmissible and transparent material into a shell type shape. Mold part 11 covers luminous element 2. Luminous element 2 is electrically connected to lead terminals 12 and 13, formed of a conductive material. Lead terminals 12 and 13 are formed of a lead frame.

Figure 3B:
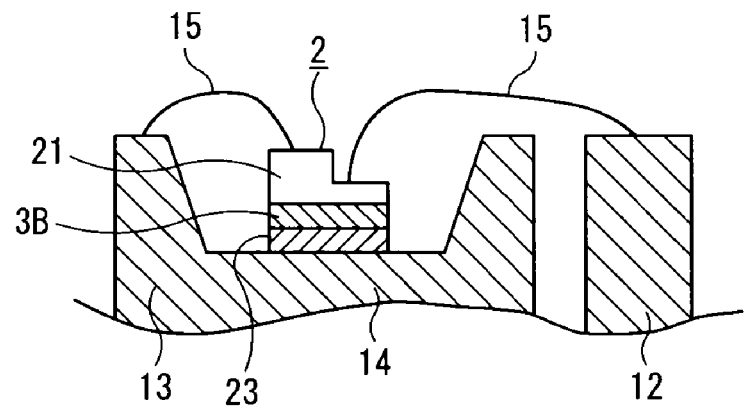

Luminous element 2 is comprised of a gallium nitride LED chip. In luminous element 2, an n-type semiconductor layer (not shown) is formed on the lower side in FIG. 3(a) and a p-type semiconductor layer (not shown) is formed on the upper side in the same. The upper sides of FIG. 3(a) and FIG. 3(b) are assumed to be the front sides in the following description because light output is extracted from the side of the p-type semiconductor layer. The rear surface of luminous element 2 is joined to a mirror (cup part) 14, which is attached to the front end portion of lead terminal 13 by die bonding. Luminous element 2, in which the above p-type semiconductor layer and n-type semiconductor layer are connected to conductive wires (for example, gold wires) 15 and 15 by bonding respectively, is electrically connected to lead terminals 12 and 13 via conductive wires 15 and 15. Conductive wires 15 and 15 have a small cross section so that the light emitted from luminous element 2 may not be blocked.

Mirror 14 has a function to reflect light emitted from both sides and the rear surface of luminous element 2 forward. The light emitted from the LED chip and that reflected by mirror 14 in the front direction are emitted forward via the front end portion of mold part 11, which functions as a lens. Mold part 11 covers luminous element 2 along with mirror 14, conductive wires 15 and 15, and a part of lead terminals 12 and 13, so that the degradation of various characteristics of luminous element 2, due to a reaction with moisture in the air or the like, is prevented. The rear ends of lead terminals 12 and 13 project from the rear surface of mold part 11.

In luminous element 2, as shown in FIG. 3(b), luminous layer part 21, composed of a gallium nitride semiconductor, is formed on phosphor part 3B by means of a semiconductor process. A reflecting layer 23 is formed on the rear surface of phosphor part 3B. Light emitted from luminous layer part 21 is radiated in all directions, but a part of that light, which is absorbed by phosphor part 3B, excites phosphor part 3B and induces a radiation of light having wavelength specific to the above-mentioned phosphor components. This light, emitted from phosphor part 3B, is reflected by reflecting layer 23 before being emitted forward. Therefore, a synthesized light, synthesized from the light emitted from luminous layer part 21 and that emitted from phosphor part 3B, is obtained by light emitting device 1B.

Thus, light emitting device 1B of the present embodiment is provided with luminous element 2 and phosphor part 3B, which emits light of the desired wavelength after being excited by the light from luminous element 2. Here, if phosphor part 3B is superior in light-transmission, a portion of the light emitted from luminous element 2 is emitted unchanged to the outside, and the phosphor components, which play the role of luminescent center, are excited by another portion of the light emitted from luminous element 2 and emits light, which is specific to the phosphor components, to the outside. Thus, it becomes possible to obtain a light, synthesized from the light emitted from luminous element 2 and that emitted from phosphor components of phosphor part 3B, and also to reduce the light color unevenness and light color fluctuations, as well as to enhance the efficiency of extracting light to the outside in comparison with conventional devices. That is, if phosphor part 3B is highly transparent without clouding and turbidity, light emitting device 1B is superior in homogeneity of light color with almost no light color fluctuations among light emitting devices 1B, and also can enhance the efficiency of extracting light from luminous element 2 to the outside when compared with conventional light emitting devices. Also, the light resistance of the luminescent material can be enhanced and thus the lifetime of light emitting device 1B can be prolonged in comparison with conventional devices.

Also in light emitting device 1B of the present embodiment, phosphor part 3B serves also as a substrate for forming luminous element 2, and therefore the phosphor components in the phosphor part, which play the role of luminescent center, can efficiently be excited by a part of the light from luminous element 2, leading to the enhancement in brightness of the emitted light specific to the phosphor components.

Embodiment B-2

Figure 4:
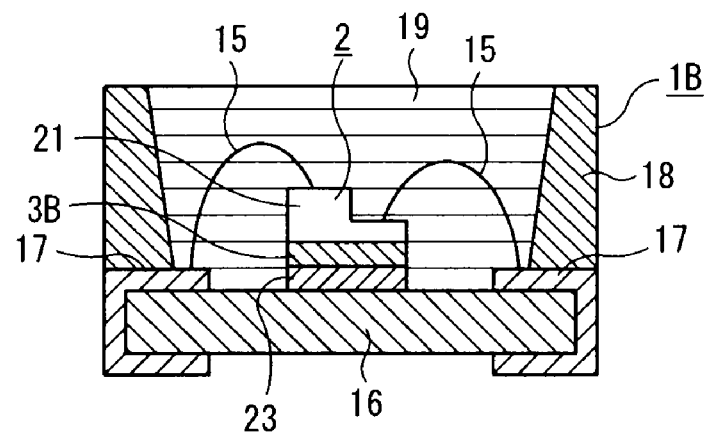
FIG. 4 is a schematic sectional view showing Embodiment B-2.

In light emitting device 1B of the present embodiment, as shown in FIG. 4, luminous element 2 is surface-mounted on an insulating substrate 16 on which printed wiring 17 is carried out. Here, luminous element 2 is structured in the same manner as in embodiment B-1, in which luminous layer part 21, composed of a gallium nitride semiconductor, is formed on phosphor part 3B and reflecting layer 23 is formed on the rear surface of phosphor part 3B. In luminous element 2, a p-type semiconductor layer (not shown) and an n-type semiconductor layer (not shown) in a luminous layer part 21 are connected electrically to printed wirings 17 and 17 via conductive wires 15 and 15 respectively.

A frame-shaped frame 18 encircling luminous element 2 is fixed onto insulating substrate 16. A sealing part 19 for sealing and protecting luminous element 2 is provided inside frame 18.

Thus, since light emitting device 1B in the present embodiment is also provided with luminous element 2 and phosphor part 3B, which emits light of the desired wavelength after being excited by the light from luminous element 2, similarly to Embodiment B-1, a light, synthesized from the light from luminous element 2 and the light from the phosphor, can be obtained. Also, like Embodiment B-1, it becomes possible to reduce the light color unevenness and light color fluctuations, enhance the efficiency of extracting light to the outside, and as well as prolong the lifetime, in comparison with conventional devices.

Embodiment B-3

Figure 5:
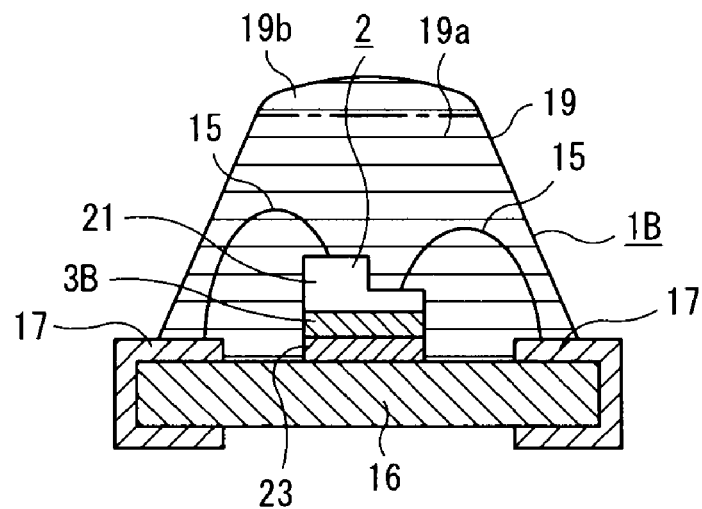
FIG. 5 is a schematic sectional view showing Embodiment B-3.

Light emitting device 1B of the present embodiment has a basic structure that is approximately the same as that in Embodiment B-2. However, frame 18 (see FIG. 4) described in Embodiment B-2 is not used and, as shown in FIG. 5, the shape of sealing part 19 is different. Meanwhile, the same components as in embodiment B-2 are designated by the same reference numerals to omit redundant explanations.

Sealing part 19 of the present embodiment comprises a sealing function part 19a in a truncated cone shape for sealing luminous element 2 and a lens function part 19b in a lens shape to function as a lens at the front end portion of sealing part 19.

Thus, light emitting device 1B of the present embodiment can reduce the number of components, compared with Embodiment B-2, allowing the miniaturization and weight reduction. Moreover, by providing lens function part 19b functioning as a lens at one portion of sealing part 19, distribution of light that is superior in directivity can be obtained.

Embodiment B-4

Figure 6:
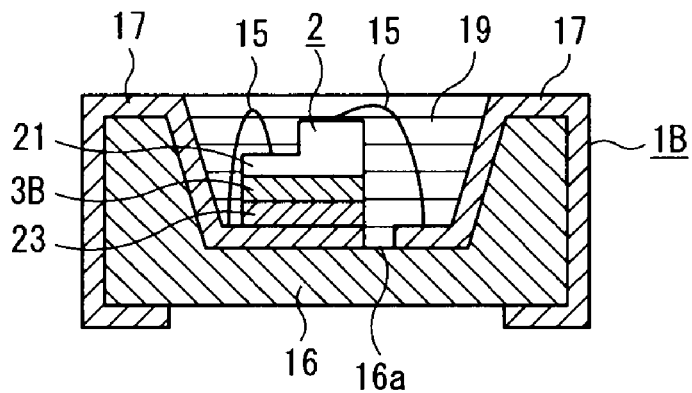
FIG. 6 is a schematic sectional view showing Embodiment B-4.

Light emitting device 1B of the present embodiment has a basic structure that is approximately the same as that in Embodiment B-2. As shown in FIG. 6, it is characterized in that a hollow 16a for accommodating luminous element 2 is provided on one surface (upper surface in FIG. 6) of insulating substrate 16, luminous element 2 is mounted at the bottom of hollow 16a, and sealing part 19 is provided inside hollow 16a. Here, printed wirings 17 and 17, formed on insulating substrate 16, are extended to the bottom of hollow 16a, and connected electrically to luminous layer part 21, composed of a gallium nitride semiconductor, in luminous element 2 via conductive wires 15 and 15. Meanwhile, the same components as in embodiment B-2 are designated by the same reference numerals to omit redundant explanations.

Thus, sealing part 19 of light emitting device 1B of the present embodiment is formed by filling hollow 16a, formed on the upper surface of insulating substrate 16, and therefore sealing part 19 can be formed without using frame 18 (see FIG. 5) described in Embodiment B-2 or the molding die described in Embodiment B-3. This advantageously simplifies the sealing process of luminous element 2, compared with Embodiments B-2 and B-3.

Embodiment B-5

Figure 7:
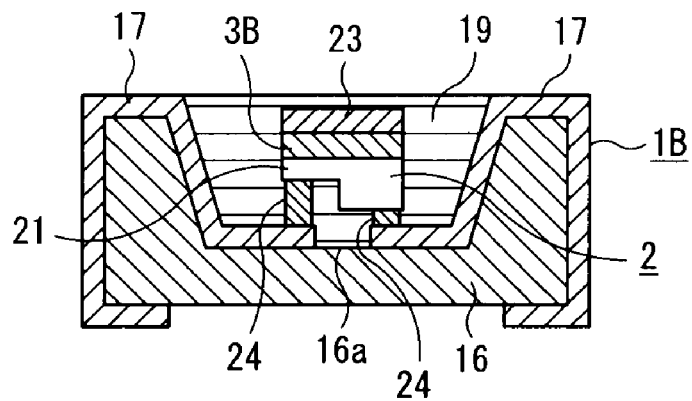
FIG. 7 is a schematic sectional view showing Embodiment B-5.

Light emitting device 1B of the present embodiment has a basic structure that is approximately the same as that in Embodiment B-4. As shown in FIG. 7, it is characterized in that luminous element 2 is so-called flip-chip-mounted on insulating substrate 16. That is, luminous element 2 is provided with bumps 24 and 24, made of conductive material, on the respective surface side of the p-type semiconductor layer (not shown) and n-type semiconductor layer (not shown) in luminous layer part 21, and luminous layer part 21 is electrically connected to printed wiring 17 and 17 of insulating substrate 16, with its face down, via bumps 24 and 24. Accordingly, in luminous element 2 of the present embodiment, luminous layer part 21 is disposed on the side nearest to insulating substrate 16, reflecting layer 23 is disposed on the side farthest from insulating substrate 16, and phosphor part 3B is sandwiched by luminous layer part 21 and reflecting layer 23. Meanwhile, the same components as in Embodiment B-4 are designated by the same reference numerals to omit redundant explanations.

In light emitting device 1B of the present embodiment, the light reflected by reflecting layer 23 to the downward (back) direction in FIG. 7 is then reflected by the inner circumferential surface of hollow 16a, and then being radiated in the upward (front) direction in FIG. 7. In this context, it is desirable to provide separately a reflecting layer that is made of material whose reflectance is high, at a site in the inner circumferential surface of hollow 16a, except at printed wirings 17 and 17.

Thus, light emitting device 1B of the present embodiment does not require conductive wires 15 and 15 like those in Embodiment B-4 for connecting printed wirings 17 and 17 provided on insulating substrate 16 and luminous element 2. This enables improvement in mechanical strength and reliability, compared with Embodiment B-4.

Embodiment B-6

Figure 8:
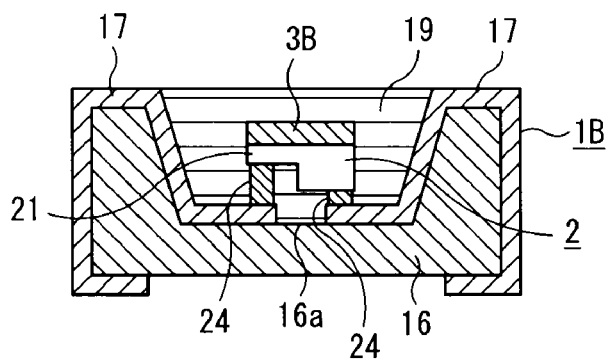
FIG. 8 is a schematic sectional view showing Embodiment B-6.

Light emitting device 1B of the present embodiment has a basic structure that is approximately the same as that in Embodiment B-5. However, as shown in FIG. 8, it is different in that reflecting layer 23, described in Embodiment B-5, is not provided. In other words, in light emitting device 1B of the present embodiment, the light emitted from luminous layer part 21 and that emitted from phosphor part 3B are radiated in the front direction directly after passing through sealing part 19. Meanwhile, the same components as in Embodiment B-5 are designated by the same reference numerals to omit redundant explanations.

Thus, light emitting device 1B of the present embodiment can reduce the number of components, compared with Embodiment B-5, which results in facilitating the manufacture thereof.

Embodiment B-7

Figure 9:
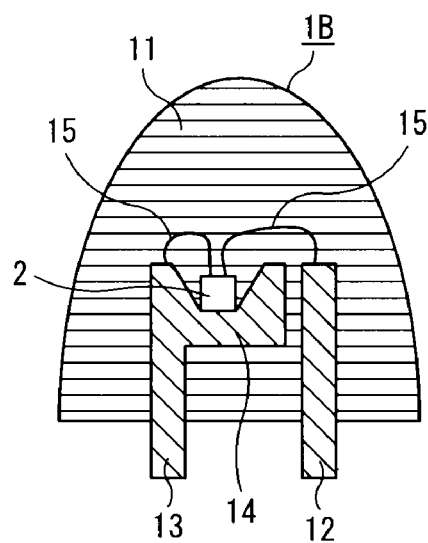
FIG. 9 is a schematic sectional view showing Embodiment B-7.

Light emitting device 1B of the present embodiment has a basic structure that is approximately the same as that in Embodiment B-1. As shown in FIG. 9, it is characterized in that mold part 11, covering luminous element 2, is provided and mold part 11 is formed integrally with the phosphor part. Meanwhile, the same components as in Embodiment B-1 are designated by the same reference numerals to omit redundant explanations.

While producing light emitting device 1B of the present embodiment, mold part 11 is formed by a method, in which a product without mold part 11 is immersed in a molding die storing a phosphor part formation liquid and the phosphor part formation liquid (polycondensation product) is cured.

Since mold part 11 and the phosphor part are integrally formed in the present embodiment, it becomes possible to enhance sealing properties, transparency, light resistance and heat resistance of mold part 11 and to suppress crack generations and peelings accompanying a long-term use, by means of using the semiconductor light-emitting device member of the present invention as phosphor part, as described later.

Embodiment B-8

Figure 10:
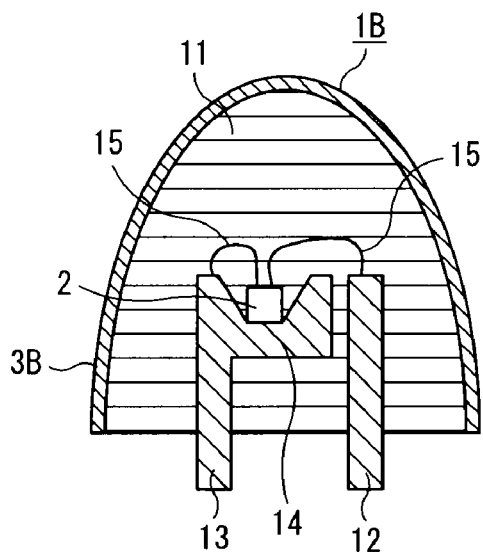
FIG. 10 is a schematic sectional view showing Embodiment B-8.

Light emitting device 1B of the present embodiment has a basic structure that is approximately the same as that in Embodiment B-1. As shown in FIG. 10, it is characterized in that a cup-shaped phosphor part 3B whose rear surface is open is mounted on then outer surface of mold part 11. That is, in the present embodiment, instead of providing phosphor part 3B in luminous element 2 like Embodiment B-1, phosphor part 3B in a shape along an outer circumference of mold part 11 is provided. Meanwhile, the same components as in Embodiment B-1 are designated by the same reference numerals to omit redundant explanations.

Phosphor part 3B in the present embodiment may be formed as a thin film by the method of curing the phosphor part formation liquid (polycondensation product) as described in Embodiment B-7. Or otherwise, it may be formed by mounting a member, which is a solid phosphor part molded in a cup-shape in advance, on mold part 11.

Thus, in light emitting device 1B of the present embodiment, the amount of the material used for the phosphor part can be reduced, compared with the case of light emitting device 1B of Embodiment B-7, in which the whole mold part 11 is formed integrally with the phosphor part. And this enables the cost reduction.

Embodiment B-9

Figure 11:
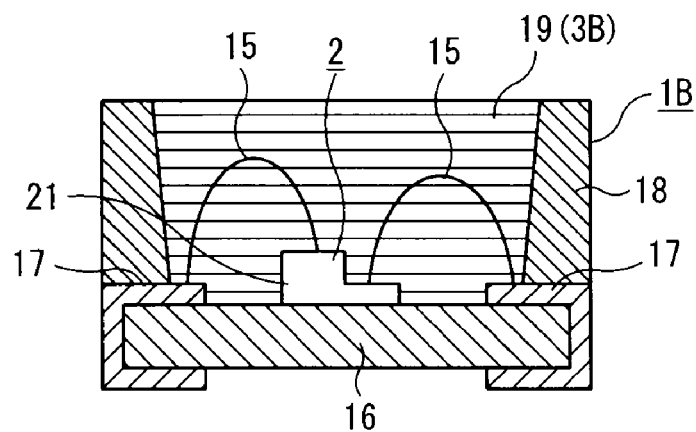
FIG. 11 is a schematic sectional view showing Embodiment B-9.

Light emitting device 1B of the present embodiment has a basic structure that is approximately the same as that in Embodiment B-2. As shown in FIG. 11, it is characterized in that a frame-shaped frame 18, encircling luminous element 2 on one surface (upper surface in FIG. 11) of insulating substrate 16, is provided and sealing part 19 inside frame 18 is formed of a phosphor part the same as that of phosphor part 3B described in Embodiment B-2. Meanwhile, the same components as in Embodiment B-2 are designated by the same reference numerals to omit redundant explanations.

Since sealing part 19 is formed of the phosphor part in the present embodiment, it becomes possible to enhance sealing properties, transparency, light resistance and heat resistance of sealing part 19 and to suppress crack generations and peelings accompanying a long-term use, by means of using the semiconductor light-emitting device member of the present invention as phosphor part, as described later.

Embodiment B-10

Figure 12:
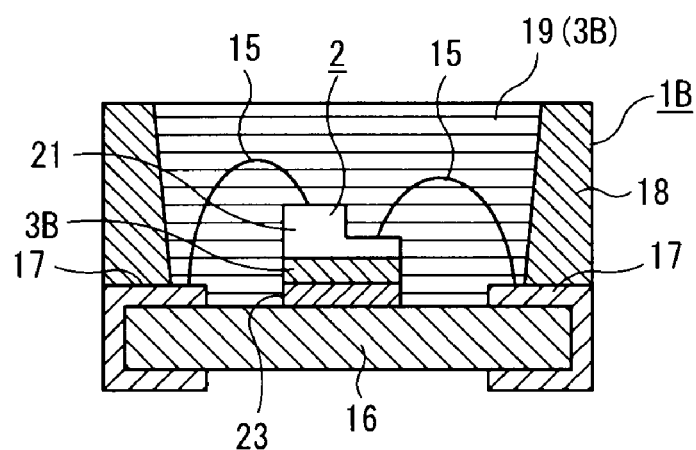
FIG. 12 is a schematic sectional view showing Embodiment B-10.

Light emitting device 1B of the present embodiment has a basic structure that is approximately the same as that in Embodiment B-2. As shown in FIG. 12, it is characterized in that a frame-shaped frame 18, encircling luminous element 2 on one surface (upper surface in FIG. 12) of insulating substrate 16, is provided and sealing part 19 inside frame 18 is formed of a phosphor part the same as that of phosphor part 3B described in Embodiment B-2. Meanwhile, the same components as in Embodiment B-2 are designated by the same reference numerals to omit redundant explanations.

Since sealing part 19 is formed of the phosphor part in the present embodiment, it becomes possible to enhance sealing properties, transparency, light resistance and heat resistance of sealing part 19 and to suppress crack generations and peelings accompanying a long-term use, by means of using the semiconductor light-emitting device member of the present invention as phosphor part, as described later.

Furthermore, in the present embodiment, phosphor part 3B is formed on the rear surface of luminous layer part 21 contained in luminous element 2, and sealing part 19 covering luminous element 2 is formed of a phosphor part. This results in that the phosphor parts are present in all directions from luminous layer part 21 of luminous element 2. This structure leads to the advantageous effect that excitation and light emission of the phosphor parts can be performed more efficiently than Embodiment B-9.

Embodiment B-11

Figure 13:
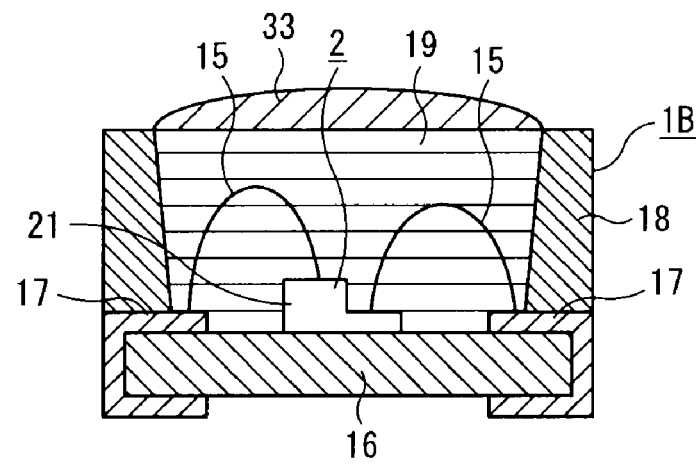
FIG. 13 is a schematic sectional view showing Embodiment B-11.

Light emitting device 1B of the present embodiment has a basic structure that is approximately the same as that in Embodiment B-2. As shown in FIG. 13, it is characterized in that phosphor part 33 formed in advance in a lens shape is disposed on the upper surface of sealing part 19, which is made of light-transmissible material. Here, phosphor part 33 is made of the same material as that of phosphor part 3B described in Embodiment B-2 and is used to emit light of the desired wavelength after being excited by the light from luminous element 2. Meanwhile, the same components as in Embodiment B-2 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission.

Embodiment B-12

Figure 14:
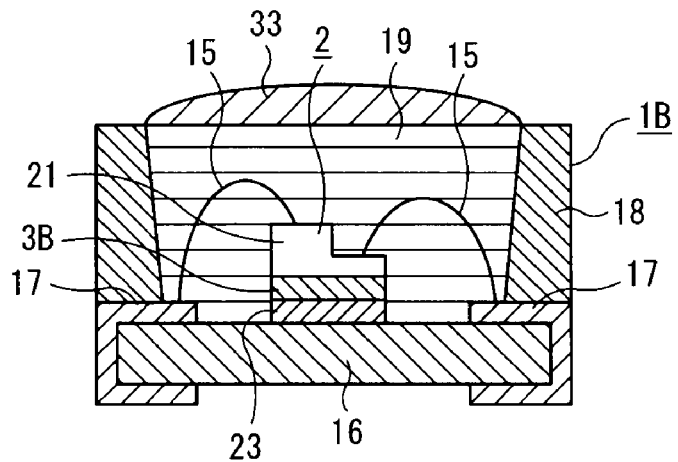
FIG. 14 is a schematic sectional view showing Embodiment B-12.

Light emitting device 1B of the present embodiment has a basic structure that is approximately the same as that in Embodiment B-2. As shown in FIG. 14, it is characterized in that phosphor part 33 formed in advance in a lens shape is disposed on the upper surface of sealing part 19, which is made of light-transmissible material. Here, phosphor part 33 is made of the same material as that of phosphor part 3B described in Embodiment B-2 and is used to emit light of the desired wavelength after being excited by the light from luminous element 2. Meanwhile, the same components as in Embodiment B-2 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission. Furthermore, in the present embodiment, phosphor part 3B is formed on the rear surface of luminous layer part 21 contained in luminous element 2. This structure leads to the advantageous effect that excitation and light emission of the phosphor parts can be performed more efficiently than Embodiment B-11.

Embodiment B-13

Figure 15:
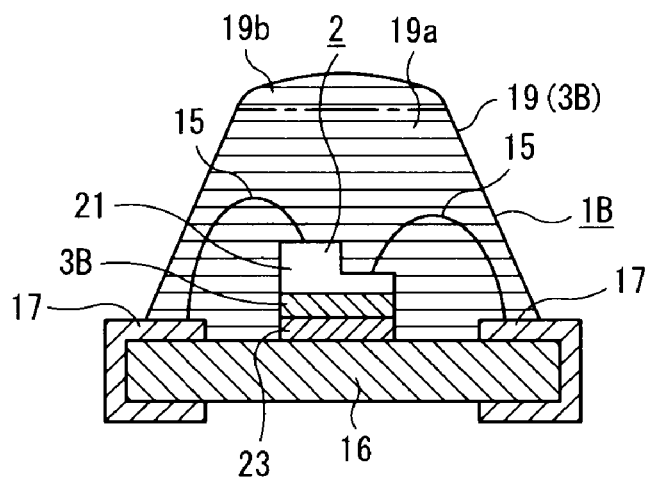
FIG. 15 is a schematic sectional view showing Embodiment B-13.

Light emitting device 1B of the present embodiment has a basic structure that is approximately the same as that in Embodiment B-3. However, as shown in FIG. 15, it is characterized in that sealing part 19, covering the luminous element 2 and provided on the upper surface side of insulating substrate 16, is formed of the phosphor part. Here, sealing part 19 of the present embodiment comprises, like Embodiment B-3, a sealing function part 19a in a truncated cone shape for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, sealing part 19 has functions of, not only sealing/protecting luminous element 2, but also converting the wavelength of the light from luminous element 2 and being a lens to control the directivity of light emission. Also, the light resistance of sealing part 19 can be enhanced and thus the lifetime of light emitting device 1B can be prolonged. Furthermore, in the present embodiment, phosphor part 3B is formed on the rear surface of luminous layer part 21 contained in luminous element 2, and sealing part 19, covering luminous element 2, is formed of a phosphor part. This results in that the phosphor parts are present in all directions from luminous layer part 21 of luminous element 2. This structure leads to the advantageous effect that excitation and light emission of the phosphor parts can be performed more efficiently than Embodiment B-12.

Embodiment B-14

Figure 16:
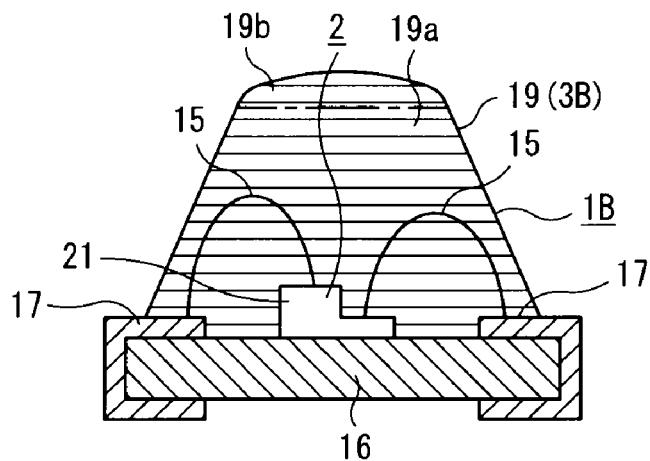
FIG. 16 is a schematic sectional view showing Embodiment B-14.

Light emitting device 1B of the present embodiment has a basic structure that is approximately the same as that in Embodiment B-3. However, as shown in FIG. 16, it is characterized in that sealing part 19, covering the luminous element 2 and provided on one surface (the upper surface in FIG. 16) side of insulating substrate 16, is formed of phosphor part 3B. Here, sealing part 19 of the present embodiment comprises, like Embodiment B-3, a sealing function part 19a in a truncated cone shape for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, sealing part 19 has functions of, not only sealing/protecting luminous element 2, but also converting the wavelength of the light from luminous element 2 and being a lens to control the directivity of light emission. Also, the light resistance of sealing part 19 can be enhanced and thus the lifetime of light emitting device 1B can be prolonged.

Embodiment B-15

Figure 17:
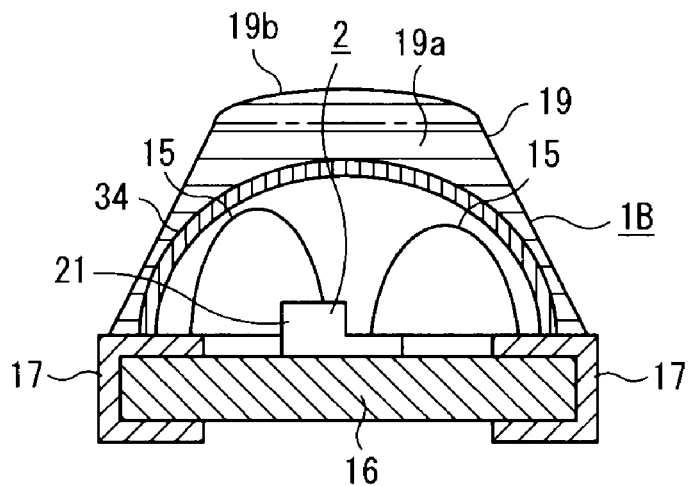
FIG. 17 is a schematic sectional view showing Embodiment B-15.

Light emitting device 1B of the present embodiment has a basic structure that is approximately the same as that in Embodiment B-3. As shown in FIG. 17, it is characterized in that dome-shaped phosphor part 34 covering luminous element 2 is disposed on the upper surface side of insulating substrate 16 and sealing part 19, made of light-transmissible resin, is formed on the outer surface side of phosphor part 34. Here, sealing part 19 of the present embodiment comprises, like Embodiment B-3, a sealing function part 19a for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, the amount of the material used for phosphor part 34 can be reduced, compared with Embodiments B-13 and B-14. In addition, since dome-shaped phosphor part 34 covering luminous element 2 is disposed in the present embodiment, the degradation of luminous element 2, due to moisture from outside or the like, can be prevented more reliably, by means of using the semiconductor light-emitting device member of the present invention as phosphor part, as described later. This enables the lifetime of light emitting device 1B to be prolonged.

Embodiment B-16

Figure 18:
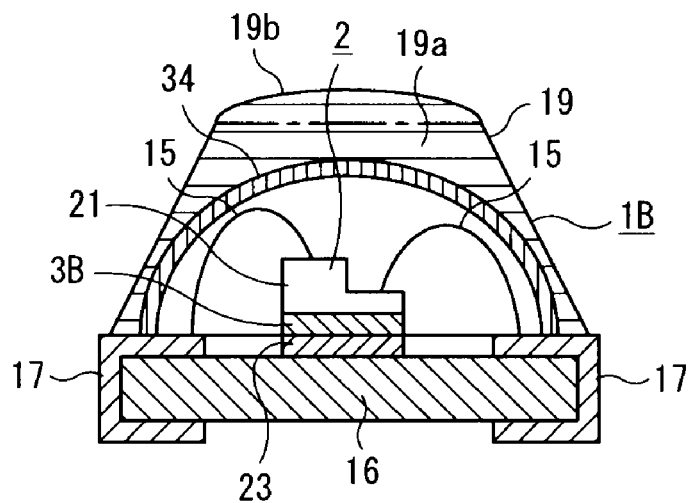
FIG. 18 is a schematic sectional view showing Embodiment B-16.

Light emitting device 1B of the present embodiment has a basic structure that is approximately the same as that in Embodiment B-3. As shown in FIG. 18, it is characterized in that dome-shaped phosphor part 34 covering luminous element 2 is disposed on the upper surface side of insulating substrate 16 and sealing part 19 is formed on the outer surface side of phosphor part 34. Here, sealing part 19 of the present embodiment comprises, like Embodiment B-3, a sealing function part 19a for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, the amount of the material used for phosphor part 34 can be reduced, compared with Embodiments B-13 and B-14. In addition, since dome-shaped phosphor part 34 covering luminous element 2 is disposed in the present embodiment, the degradation of luminous element 2, due to moisture from outside or the like, can be prevented more reliably, by means of using the semiconductor light-emitting device member of the present invention as phosphor part, as described later. This enables the lifetime of light emitting device 1B to be prolonged. Furthermore, in the present embodiment, phosphor part 3B is formed on the rear surface of luminous layer part 21 contained in luminous element 2, and sealing part 19, covering luminous element 2, is formed of a phosphor part. This results in that the phosphor parts are present in all directions from luminous layer part 21 of luminous element 2. This structure leads to the advantageous effect that excitation and light emission of the phosphor parts can be performed more efficiently than Embodiment B-15.

Embodiment B-17

Figure 19:
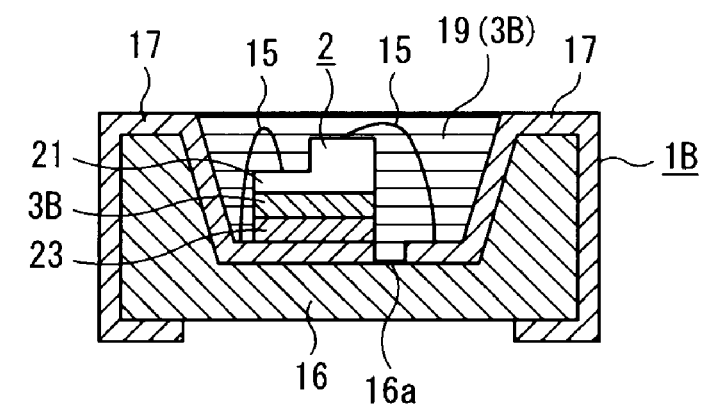
FIG. 19 is a schematic sectional view showing Embodiment B-17.

Light emitting device 1B of the present embodiment has a basic structure that is approximately the same as that in Embodiment B-4. As shown in FIG. 19, it is characterized in that sealing part 19 for sealing luminous element 2, disposed at the bottom of hollow 16a formed on one surface (upper surface in FIG. 19) of insulating substrate 16, is provided and that sealing part 19 is formed of the phosphor part. Here, the phosphor part is used to emit light of the desired wavelength after being excited by the light from luminous element 2, just like phosphor part 3B described in Embodiment B-1. Meanwhile, the same components as in Embodiment B-4 are designated by the same reference numerals to omit redundant explanations.

Since sealing part 19 is formed of the phosphor part in light emitting device 1B of the present embodiment, it becomes possible to enhance sealing properties, transparency, light resistance and heat resistance of sealing part 19 and to suppress crack generations and peelings accompanying a long-term use, by means of using the semiconductor light-emitting device member of the present invention as phosphor part, as described later. Furthermore, in the present embodiment, phosphor part 3B is formed on the rear surface of luminous layer part 21 contained in luminous element 2, and sealing part 19, covering luminous element 2, is formed of a phosphor part 3B. This results in that the phosphor parts are present in all directions from luminous layer part 21 of luminous element 2. This structure leads to the advantageous effect that excitation and light emission of the phosphor parts can be performed more efficiently than Embodiment B-15.

Embodiment B-18

Figure 20:
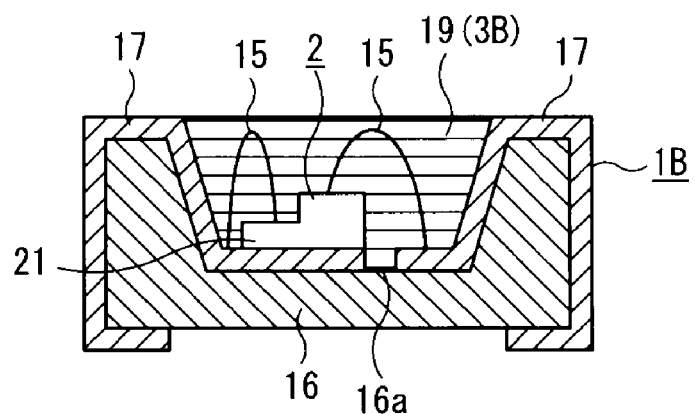
FIG. 20 is a schematic sectional view showing Embodiment B-18.

Light emitting device 1B of the present embodiment has a basic structure that is approximately the same as that in Embodiment B-4. As shown in FIG. 20, it is characterized in that sealing part 19 for sealing luminous element 2, disposed at the bottom of hollow 16a formed on one surface (upper surface in FIG. 20) of insulating substrate 16, is provided and that sealing part 19 is formed of the phosphor part 3B. Here, that phosphor part 3B is used to emit light of the desired wavelength after being excited by the light from luminous element 2, just like phosphor part 3B described in Embodiment B-1. Meanwhile, the same components as in embodiment B-4 are designated by the same reference numerals to omit redundant explanations.

Since sealing part 19 is formed of the phosphor part in light emitting device 1B of the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part 3B, as described later.

Embodiment B-19

Figure 21:
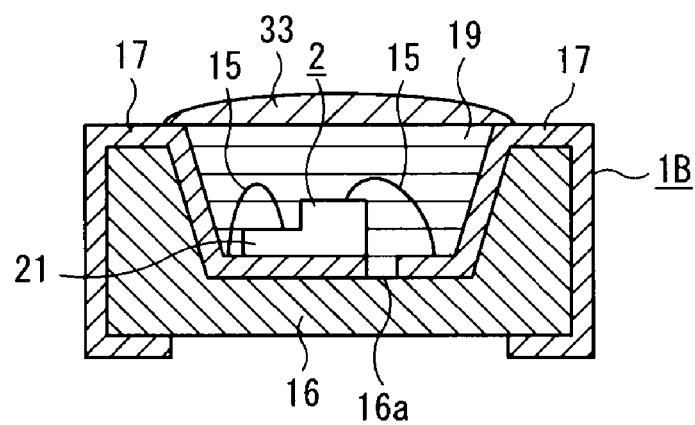
FIG. 21 is a schematic sectional view showing Embodiment B-19.

Light emitting device 1B of the present embodiment has a basic structure that is approximately the same as that in Embodiment B-4. As shown in FIG. 21, it is characterized in that phosphor part 33 formed in a lens shape in advance is disposed on the upper surface (which is, the light extraction surface) of sealing part 19. Here, that phosphor part 33 is used to emit light of the desired wavelength after being excited by the light from luminous element 2, just like phosphor part 3B described in Embodiment B-1. Meanwhile, the same components as in Embodiment B-4 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission.

Embodiment B-20

Figure 22:
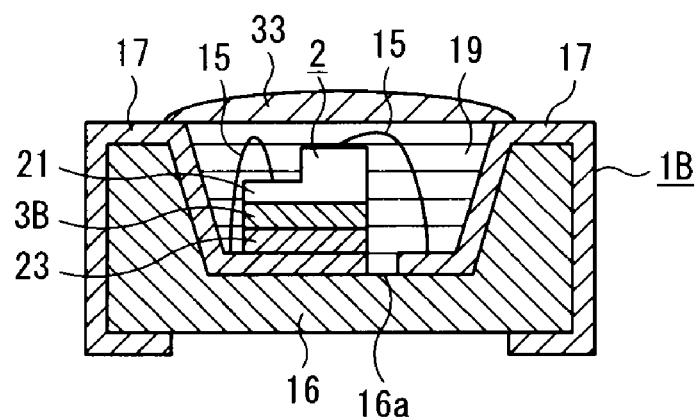
FIG. 22 is a schematic sectional view showing Embodiment B-20.

Light emitting device 1B of the present embodiment has a basic structure that is approximately the same as that in Embodiment B-4. As shown in FIG. 22, it is characterized in that phosphor part 33 formed in a lens shape in advance is disposed on the upper surface (which is, the light extraction surface) of sealing part 19. Here, that phosphor part 33 is used to emit light of the desired wavelength after being excited by the light from luminous element 2, just like phosphor part 3B described in Embodiment B-1. Meanwhile, the same components as in embodiment B-4 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission. Furthermore, in the present embodiment, since phosphor part 3B is formed also on the rear surface of luminous layer part 21 contained in luminous element 2, the excitation and light emission of the phosphor part is performed more efficiently than Embodiment B-19.

Embodiment B-21

Figure 23:
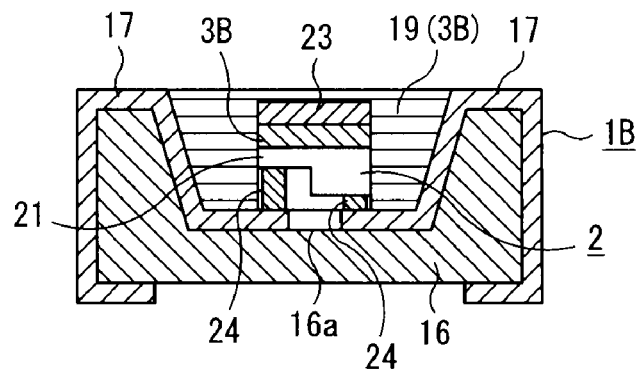
FIG. 23 is a schematic sectional view showing Embodiment B-21.
Figure 24:
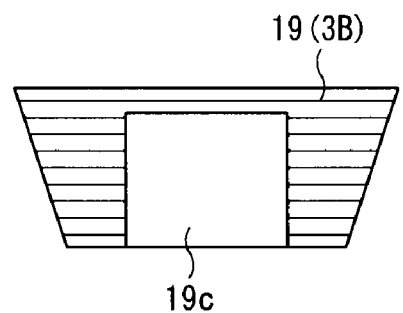
FIG. 24 is a sectional view of a substantial part, showing Embodiment B-21.

Light emitting device 1B of the present embodiment has a basic structure that is approximately the same as that in Embodiment B-5. As shown in FIG. 23, it is characterized in that sealing part 19 for sealing luminous element 2 disposed at the bottom of hollow 16a formed on one surface (upper surface in FIG. 23) of insulating substrate 16 is provided and that sealing part 19 is formed of phosphor part 3B. Sealing part 19 is, as shown in FIG. 24, mounted in hollow 16a of insulating substrate 16 on which luminous element 2 is mounted, after it is processed in advance to have the outer circumferential, the shape of which corresponds to hollow 16a, and a recess 19c, at a position corresponding to luminous element 2, for accommodating luminous element 2. This structure enables the sealing process to be simplified. Here, phosphor part 3B, constituting sealing part 19, is used to emit light of the desired wavelength after being excited by the light from luminous element 2, just like phosphor part 3B described in Embodiment B-1. Meanwhile, the same components as in embodiment B-5 are designated by the same reference numerals to omit redundant explanations.

Since sealing part 19 is formed of the phosphor part in light emitting device 1B of the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part 3B, as described later. In addition, in the present embodiment, light emitted in the front direction from luminous layer part 21 of luminous element 2 is once reflected by reflecting layer 23 toward the inner bottom surface of hollow 16a. Therefore, if reflecting layers are provided on the inner bottom surface and inner circumferential surface of hollow 16a, the reflected light will be reflected further by that inner bottom surface and inner circumferential surface, and then being radiated in the front direction. With this structure, length of the optical path can be extended, and therefore, the advantageous effect of more efficient excitation and light emission by phosphor part 3B can be realized.

Embodiment B-22

Figure 25:
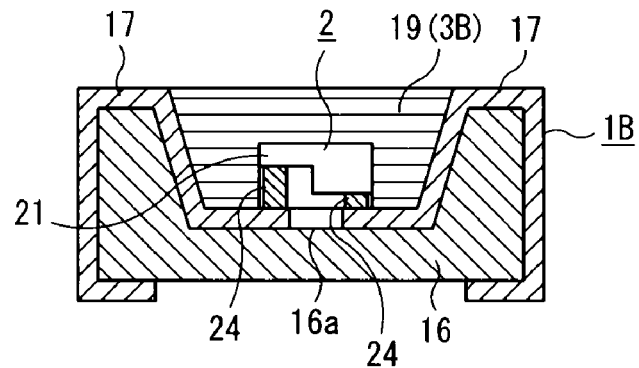
FIG. 25 is a schematic sectional view showing Embodiment B-22.
Figure 26:
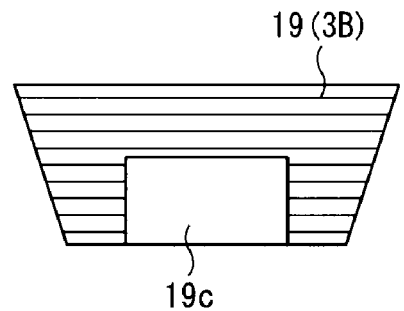
FIG. 26 is a sectional view of a substantial part, showing Embodiment B-22.

Light emitting device 1B of the present embodiment has a basic structure that is approximately the same as that in Embodiment B-5. As shown in FIG. 25, it is characterized in that sealing part 19 for sealing luminous element 2 disposed at the bottom of hollow 16a formed on one surface (upper surface in FIG. 25) of insulating substrate 16 is provided and that sealing part 19 is formed of phosphor part 3B. Sealing part 19 is, as shown in FIG. 26, mounted in hollow 16a of insulating substrate 16 on which luminous element 2 is mounted, after it is processed in advance to have the outer circumferential, the shape of which corresponds to hollow 16a, and a recess 19c, at a position corresponding to luminous element 2, for accommodating luminous element 2. This structure enables the sealing process to be simplified. Here, phosphor part 3B, constituting sealing part 19, is used to emit light of the desired wavelength after being excited by the light from luminous element 2, just like phosphor part 3B described in Embodiment B-1. Meanwhile, the same components as in embodiment B-5 are designated by the same reference numerals to omit redundant explanations.

Since sealing part 19 is formed of phosphor part 3B in light emitting device 1B of the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part 3B, as described later.

Embodiment B-23

Figure 27:
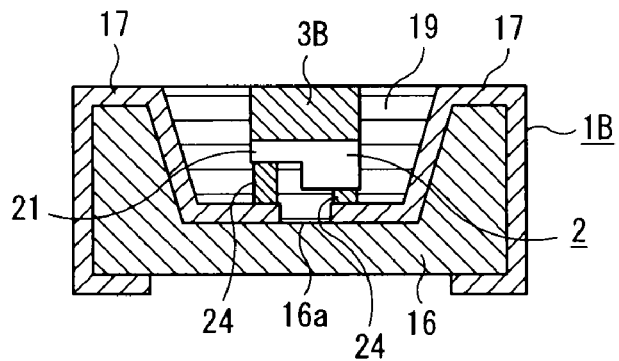
FIG. 27 is a schematic sectional view showing Embodiment B-23.

Light emitting device 1B of the present embodiment has a basic structure that is approximately the same as that in Embodiment B-6. As shown in FIG. 27, it is characterized in that phosphor part 3B that is processed like a rod in advance is disposed on the upper surface of luminous element 2. Around luminous element 2 and phosphor part 3B, sealing part 19, made of light-transmissible material, is formed. As regards phosphor part 3B, one end surface (lower end surface in FIG. 27) thereof is in close contact with luminous layer part 21 of luminous element 2, and another end surface (upper end surface in FIG. 27) thereof is exposed. Meanwhile, the same components as in Embodiment B-6 are designated by the same reference numerals to omit redundant explanations.

Figure 28:
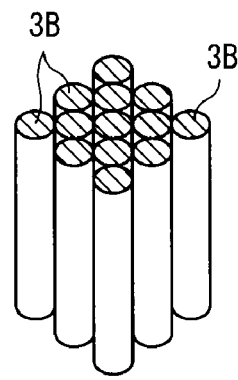
FIG. 28 is a perspective view of a substantial part, showing Embodiment B-23.

Thus, in light emitting device 1B of the present embodiment, since phosphor part 3B, whose one end surface is in close contact with luminous layer part 21 of luminous element 2, is formed like a rod, the light emitted from luminous layer part 21 can be absorbed efficiently into phosphor part 3B through the one end surface described above, of phosphor part 3B. Then phosphor part 3B emits light, when excited by the absorbed light, to the outside efficiently through another end surface described above, of phosphor part 3B. In the present embodiment, only one phosphor part 3B, formed to be like a rod having a relatively large diameter, is used. Or otherwise, a plurality of phosphor parts 3B, formed to be like a bundle of fibers having relatively small diameters respectively, can be disposed, as shown in FIG. 28. In addition, the sectional shape of phosphor part 3B is not limited to a round shape, but may be, for example, a rectangular shape, or other.

Embodiment B-24

Figure 29:
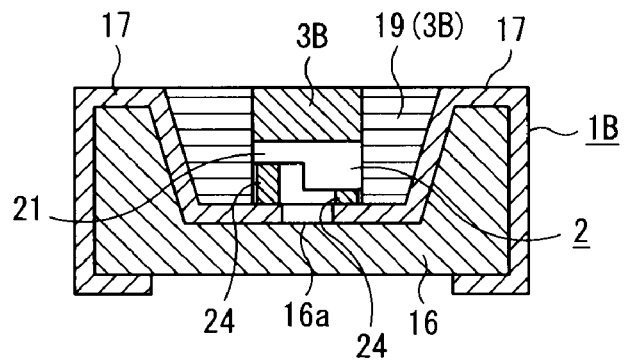
FIG. 29 is a schematic sectional view showing Embodiment B-24.
Figure 30:
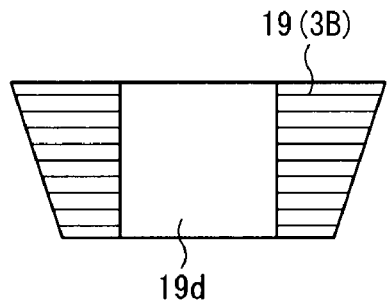
FIG. 30 is a sectional view of a substantial part, showing Embodiment B-24.

Light emitting device 1B of the present embodiment has a basic structure that is approximately the same as that in Embodiment B-23. As shown in FIG. 29, it is characterized in that the sealing part 19, provided inside hollow 16a of insulating substrate 16, is provided and that sealing part 19 is formed of phosphor part 3B. Sealing part 19 is, as shown in FIG. 30, mounted in hollow 16a of insulating substrate 16 on which luminous element 2 is mounted, after it is processed in advance to have outer circumferential, the shape of which corresponds to hollow 16a, and a through-hole 19d, at a position corresponding to luminous element 2, for accommodating luminous element 2. This structure enables the sealing process to be simplified. Here, phosphor part 3B, constituting sealing part 19, is used to emit light of the desired wavelength after being excited by the light from luminous element 2, just like phosphor part 3B described in Embodiment B-1. Meanwhile, the same components as in Embodiment B-23 are designated by the same reference numerals to omit redundant explanations.

Figure 31:
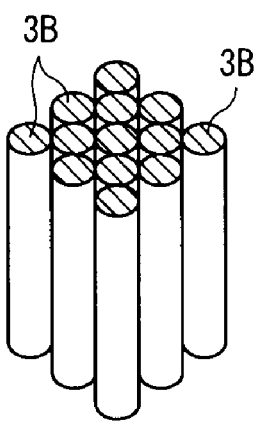
FIG. 31 is a perspective view of a substantial part, showing Embodiment B-24.

Thus, in light emitting device 1B of the present embodiment, since sealing part 19 is also formed of phosphor part 3B, it becomes possible to prolong the lifetime and enhance in efficiency of the light emission. Though, in the present embodiment, only one phosphor part 3B, formed to be like a rod having a relatively large diameter, is used, a plurality of phosphor parts 3B, formed to be like a bundle of fibers having relatively small diameters, can be disposed, as shown in FIG. 31. In addition, the sectional shape of phosphor part 3B is not limited to a round shape, but may be, for example, a rectangular shape, or other.

Embodiment B-25

Figure 32:
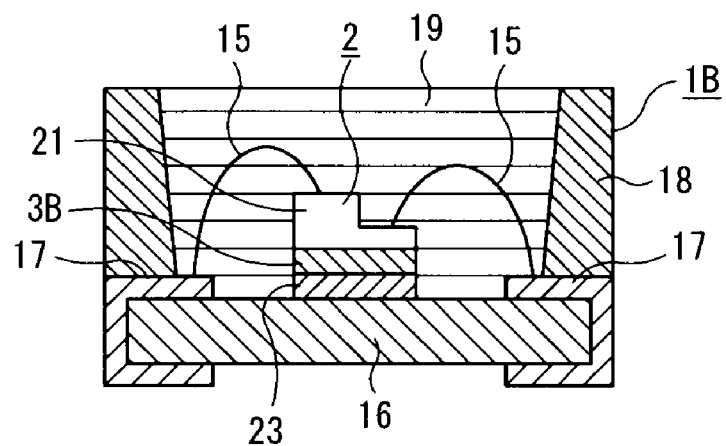
FIG. 32 is a schematic sectional view showing Embodiment B-25.

Light emitting device 1B of the present embodiment has a basic structure that is approximately the same as that in Embodiment B-2. As shown in FIG. 32, it is characterized in that frame 18 is disposed on one surface (the upper surface in FIG. 32) of insulating substrate 16, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19 disposed inside frame 18. In the present embodiment, salt fluorophosphate glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in embodiment B-2 are designated by the same reference numerals to omit redundant explanations.

Thus, in light emitting device 1B of the present embodiment, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained.

Consequently, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights.

In the present embodiment, a blue light is emitted from phosphor part 3B and a yellow light is emitted from the phosphor powder, so as to obtain a white light, which is different from both luminescent colors.

Light-emitting materials for existing phosphor particles in the phosphor part or for existing phosphor powders are limited, and therefore sometimes the desired light color may not be obtainable by using either the phosphor powder or phosphor part. The present embodiment is very effective in such a case. That is, even if the desired characteristics of light color cannot be obtained from phosphor part 3B alone, light emitting device 1B of the desired characteristics of light color can be realized just by using a phosphor powder having suitable, complementary light-color characteristics, which lacks in phosphor part 3B. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B. In this context, when the luminescent colors of phosphor part 3B and the phosphor powder are set to be approximately identical, for example, by using $P_2O_5.SrF_2.BaF_2$:$Eu^{3+}$ and $Y_2O_2S$:$Eu^{3+}$, both emitting red light, as phosphor particles of phosphor part 3B and the phosphor powder respectively, an efficient red emission light can be obtained. This combination of phosphor part 3B and the phosphor powder is only an example, and any other combination may naturally be adopted.

Embodiment B-26

Figure 33:
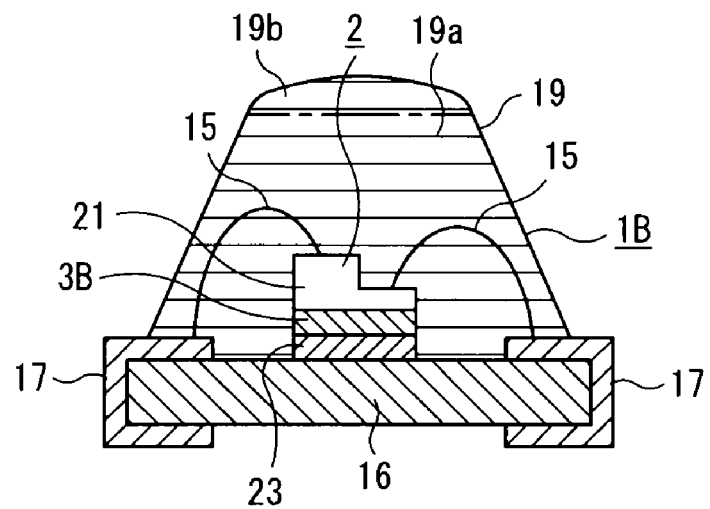
FIG. 33 is a schematic sectional view showing Embodiment B-26.

Light emitting device 1B of the present embodiment has a basic structure that is approximately the same as that in Embodiment B-3. As shown in FIG. 33, it is characterized in that sealing part 19 for sealing luminous element 2 on one side (the upper side in FIG. 33) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light)

is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2BaCl_2:Eu^{2+}$ emitting blue light after being excited by near ultraviolet light) is used as phosphor particles in phosphor part 3B. Meanwhile, the same components as in Embodiment B-3 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-27

Figure 34:
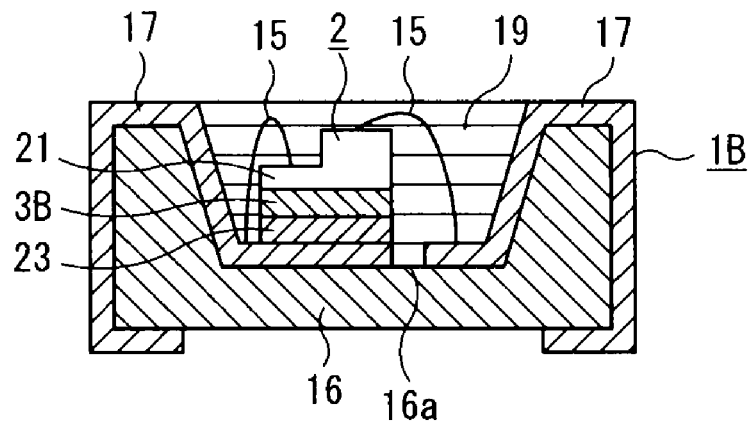
FIG. 34 is a schematic sectional view showing Embodiment B-27.

Light emitting device 1B of the present embodiment has a basic structure that is approximately the same as that in Embodiment B-4. As shown in FIG. 34, it is characterized in that sealing part 19 for sealing luminous element 2 by filling up hollow 16a formed on the upper surface of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in embodiment B-4 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-28

Figure 35:
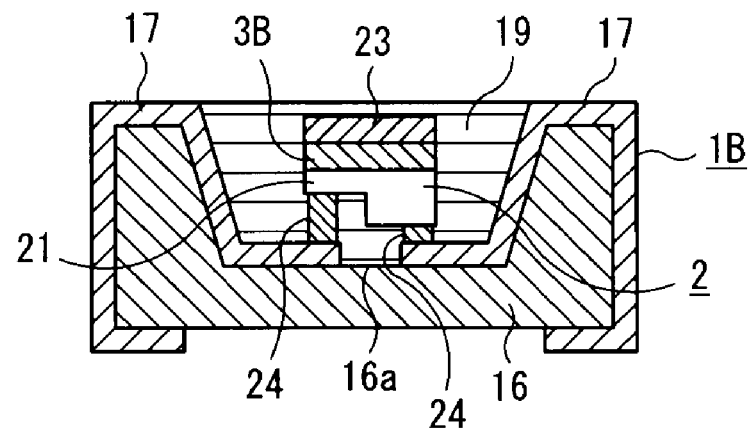
FIG. 35 is a schematic sectional view showing Embodiment B-28.

Light emitting device 1B of the present embodiment has a basic structure that is approximately the same as that in Embodiment B-5. As shown in FIG. 35, it is characterized in that sealing part 19 for sealing luminous element 2 by filling up hollow 16a formed on one surface (the upper surface in FIG. 35) of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in embodiment B-5 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-29

Figure 36:
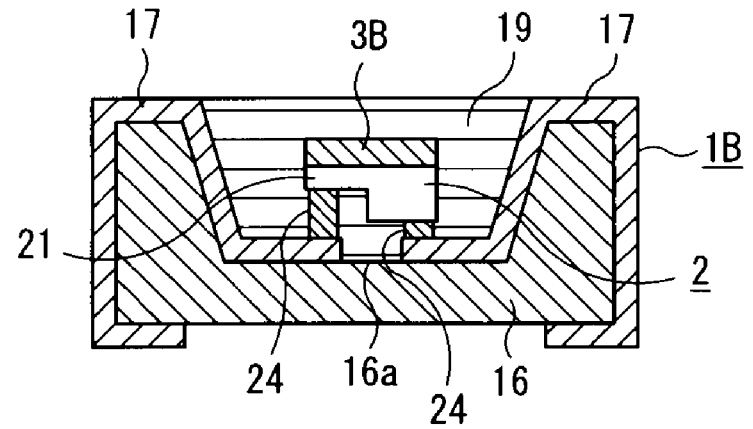
FIG. 36 is a schematic sectional view showing Embodiment B-29.

Light emitting device 1B of the present embodiment has a basic structure that is approximately the same as that in Embodiment B-6. As shown in FIG. 36, it is characterized in that sealing part 19 for sealing luminous element 2 by filling up hollow 16a formed on one surface (the upper surface in FIG. 36) of insulating substrate 16 is provided, luminous layer part 21 in luminous element 2 is based on AlGaN and emits near ultraviolet light, and phosphor powder (for example, powder of a YAG:CCe$^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiment B-6 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-30

Figure 37A:
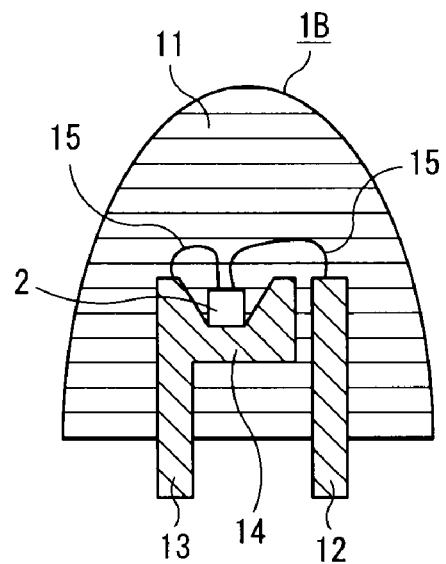
FIG. 37 shows Embodiment B-30, and FIG. 37(*a*) is a schematic sectional view and FIG. 37(*b*) is an enlarged view of a substantial part of FIG. 37(*a*)
Figure 37B:
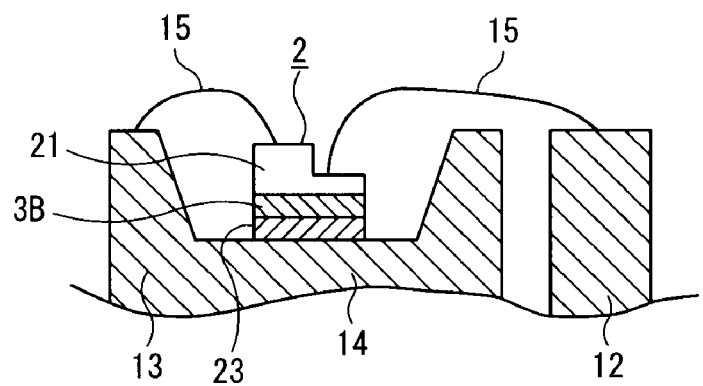

Light emitting device 1B of the present embodiment has a basic structure that is approximately the same as that in Embodiment B-1. As shown in FIG. 37(*a*) and FIG. 37(*b*), it is characterized in that the shell type shape mold part 11 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as mold part 11, and mold part 11 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiment B-1 are designated by the same reference numerals to omit redundant explanations.

Thus, in light emitting device 1B of the present embodiment, just as in Embodiment B-25, since a phosphor powder that emits light after being excited by the light from luminous element 2 is dispersed in mold part 11, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in mold part 11 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-31

Figure 38:
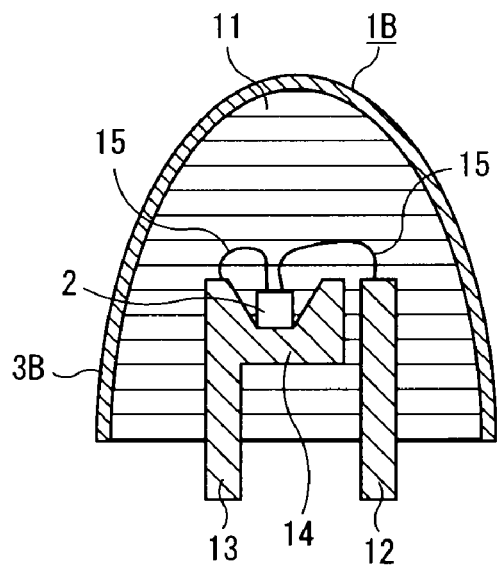
FIG. 38 is a schematic sectional view showing Embodiment B-31.

Light emitting device 1B of the present embodiment has a basic structure that is approximately the same as that in Embodiment B-8. As shown in FIG. 38, it is characterized in that the shell type shape mold part 11 is provided, luminous layer part 21 (not shown in FIG. 38) in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as mold part 11, and mold part 11 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiment B-8 are designated by the same reference numerals to omit redundant explanations.

Thus, in light emitting device 1B of the present embodiment, just as in Embodiment B-25, since a phosphor powder that emits light after being excited by the light from luminous element 2 is dispersed in mold part 11, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in mold part 11 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-32

Figure 39:
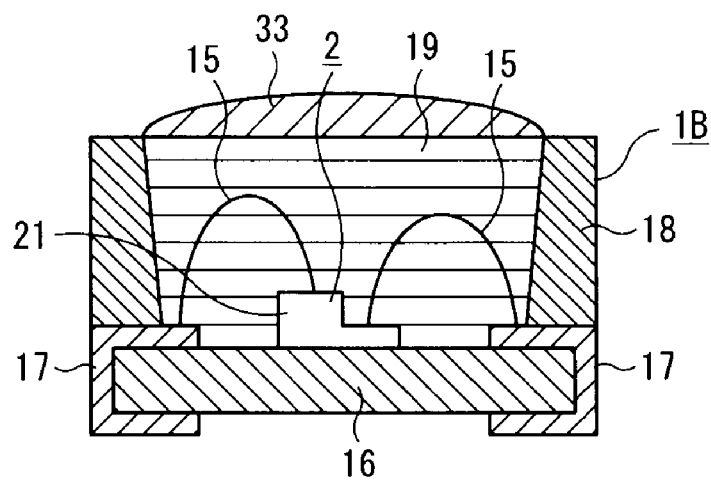
FIG. 39 is a schematic sectional view showing Embodiment B-32.

Light emitting device 1B of the present embodiment has a basic structure that is approximately the same as that in Embodiment B-11. As shown in FIG. 39, it is characterized in that sealing part 19 for sealing luminous element 2 on one side (the upper side in FIG. 39) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 33. Meanwhile, the same components as in Embodiment B-11 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 33 and the light emitted from the phosphor powder is obtained. That is, just as in Embodiment B-25, by selecting material that emits near ultraviolet light as material of luminous layer part 21 in luminous element 2, both phosphor part 33 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 33, differently from the case in the present embodiment. With that configuration, it becomes possible to increase the light output and enhance the emission efficiency because the light emitted from the phosphor powder is superimposed on the light emitted from phosphor part 33.

Embodiment B-33

Figure 40:
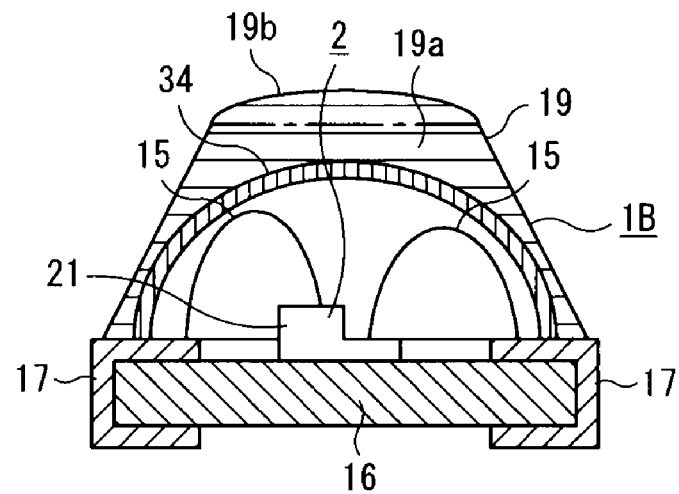
FIG. 40 is a schematic sectional view showing Embodiment B-33.

Light emitting device 1B of the present embodiment has a basic structure that is approximately the same as that in Embodiment B-15. As shown in FIG. 40, it is characterized in that sealing part 19 for sealing luminous element 2 on one side (the upper side in FIG. 40) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 34. Meanwhile, the same components as in embodiment B-15 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 34 and the light emitted from the phosphor powder is obtained. That is, just as in Embodiment B-25, by selecting material that emits near ultraviolet light as material of luminous layer part 21 in luminous element 2, both phosphor part 34 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 34, differently from the case in the present embodiment. With that configuration, it becomes possible to increase the light output and enhance the emission efficiency because the light emitted from the phosphor powder is superimposed on the light emitted from phosphor part 34.

Embodiment B-34

Figure 41:
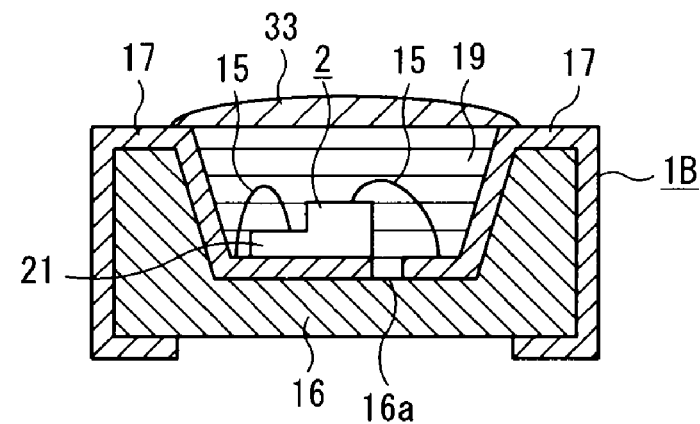
FIG. 41 is a schematic sectional view showing Embodiment B-34.

Light emitting device 1B of the present embodiment has a basic structure that is approximately the same as that in Embodiment B-19. As shown in FIG. 41, it is characterized in that sealing part 19 for sealing luminous element 2 by filling up hollow 16a formed on one surface (the upper surface in FIG. 41) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 33. Meanwhile, the same components as in embodiment B-19 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 33 and the light emitted from the phosphor powder is obtained. That is, just as in Embodiment B-25, by selecting material that emits near ultraviolet light as material of luminous layer part 21 in luminous element 2, both phosphor part 33 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 33, differently from the case in the present embodiment. With that configuration, it becomes possible to increase the light output and enhance the emission efficiency because the light emitted from the phosphor powder is superimposed on the light emitted from phosphor part 33.

Embodiment B-35

Figure 42:
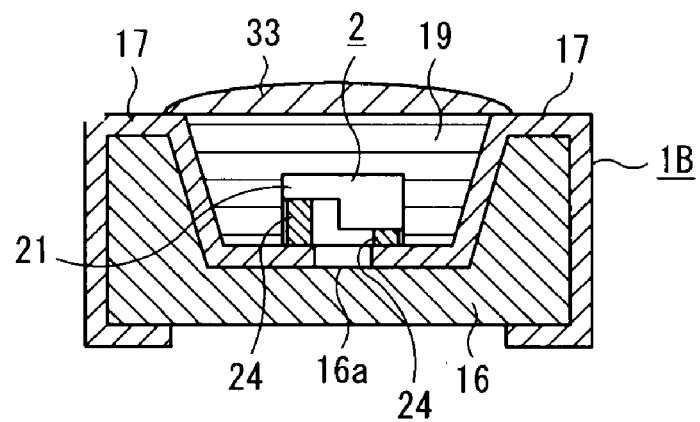
FIG. 42 is a schematic sectional view showing Embodiment B-35.

Light emitting device 1B of the present embodiment has a basic structure that is approximately the same as that in Embodiments B-12 and B-22. As shown in FIG. 42, it is characterized in that sealing part 19 for sealing luminous element 2 by filling up hollow 16a formed on one surface (the upper surface in FIG. 42) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 33. Meanwhile, the same components as in Embodiments B-12 and B-22 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 33 and the light emitted from the phosphor powder is obtained. That is, just as in Embodiment B-25, by selecting material that emits near ultraviolet light as material of luminous layer part 21 in luminous element 2, both phosphor part 33 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 33, differently from the case in the present embodiment. With that configuration, it becomes possible to increase the light output and enhance the emission efficiency because the light emitted from the phosphor powder is superimposed on the light emitted from phosphor part 33.

Embodiment B-36

Figure 43:
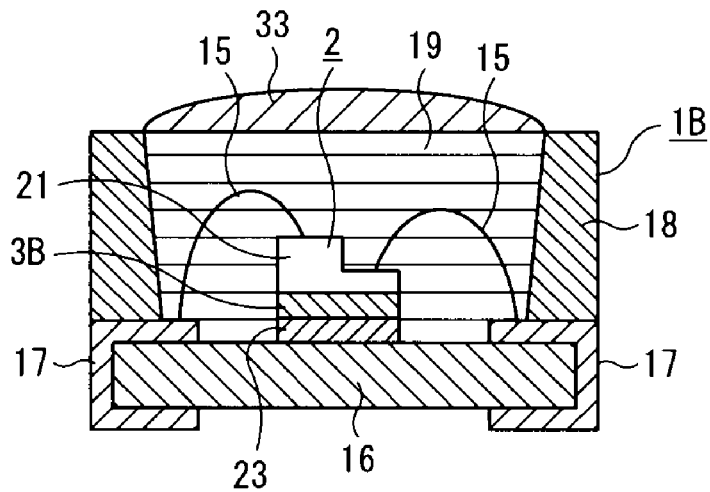
FIG. 43 is a schematic sectional view showing Embodiment B-36.

Light emitting device 1B of the present embodiment has a basic structure that is approximately the same as that in Embodiment B-12. As shown in FIG. 43, it is characterized in that sealing part 19 for sealing luminous element 2 on upper side of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5$.$AlF_3$.MgF.$CaF_2$.$SrF_2$.$BaCl_2$:$Eu^{2+}$ emitting blue light after being excited by near ultraviolet light) is used as phosphor particles in phosphor part 3B. Meanwhile, the same components as in embodiment B-12 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-37

Figure 44:
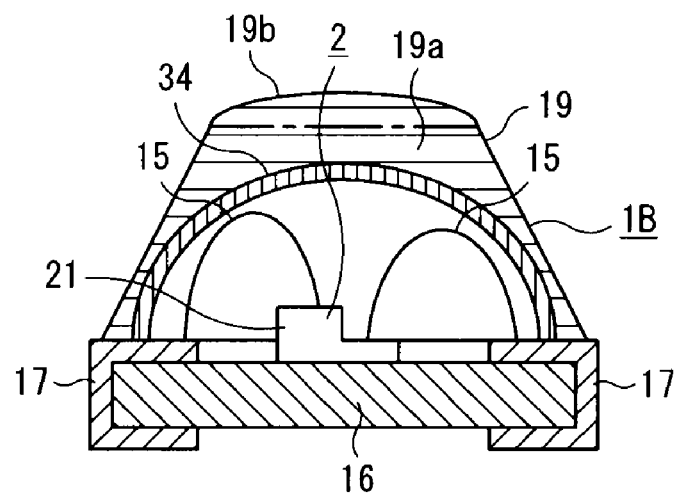
FIG. 44 is a schematic sectional view showing Embodiment B-37.

Light emitting device 1B of the present embodiment has a basic structure that is approximately the same as that in Embodiment B-16. As shown in FIG. 44, it is characterized in that sealing part 19 for sealing luminous element 2 on one side (the upper side in FIG. 44) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5$.$AlF_3$.MgF.$CaF_2$.$SrF_2$.$BaCl_2$:$Eu^{2+}$ emitting blue light after being excited by near ultraviolet light) is used as phosphor particles in phosphor part 34. Meanwhile, the same components as in Embodiment B-16 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 34 and the light emitted from the phosphor powder is obtained. That is, just as in Embodiment B-25, by selecting material that emits near ultraviolet light as material of luminous layer part 21 in luminous element 2, both phosphor part 34 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 34, differently from the case in the present embodiment. With that configuration, it becomes possible to increase the light output and enhance the emission efficiency because the light emitted from the phosphor powder is superimposed on the light emitted from phosphor part 34.

Embodiment B-38

Figure 45:
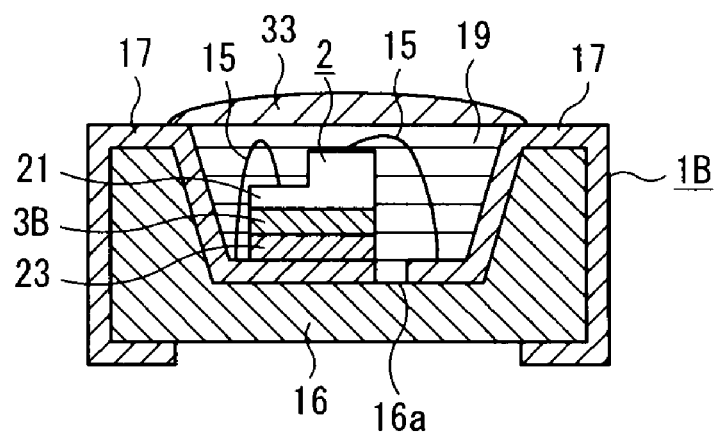
FIG. 45 is a schematic sectional view showing Embodiment B-38.

Light emitting device 1B of the present embodiment has a basic structure that is approximately the same as that in Embodiment B-20. As shown in FIG. 45, it is characterized in that sealing part 19 for sealing luminous element 2 by filling up hollow 16a formed on one surface (the upper surface in FIG. 45) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5$.$AlF_3$.MgF.$CaF_2$.$SrF_2$.$BaCl_2$:$Eu^{2+}$ emitting blue light after being excited by near ultraviolet light) is used as phosphor particles in phosphor part 3B. Meanwhile, the same components as in Embodiment B-20 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-39

Figure 46:
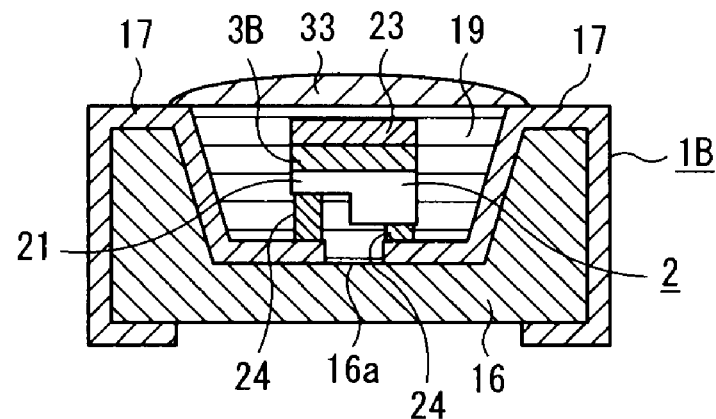
FIG. 46 is a schematic sectional view showing Embodiment B-39.

Light emitting device 1B of the present embodiment has a basic structure that is approximately the same as that in Embodiments B-5 and B-12. As shown in FIG. 46, it is characterized in that sealing part 19 for sealing luminous element 2 by filling up hollow 16a formed on one surface (the upper surface in FIG. 46) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5$.$AlF_3$.MgF.$CaF_2$.$SrF_2$.$BaCl_2$:$Eu^{2+}$ emitting blue light after being excited by near ultraviolet light) is used as phosphor particles in phosphor part 3B. Meanwhile, the same components as in Embodiments B-5 and B-12 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Embodiment B-40

Figure 47:
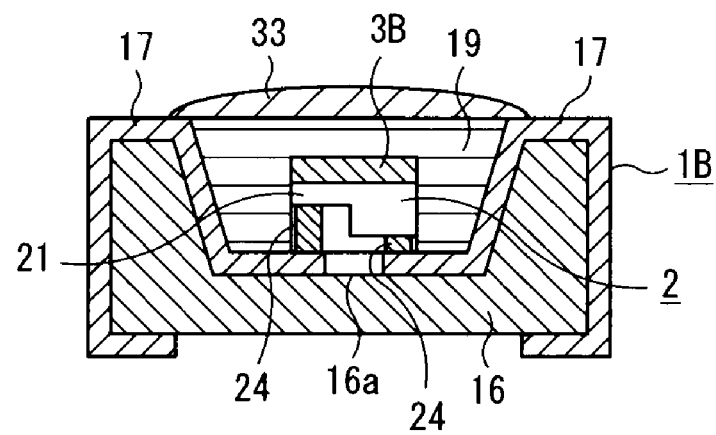
FIG. 47 is a schematic sectional view showing Embodiment B-40.

Light emitting device 1B of the present embodiment has a basic structure that is approximately the same as that in Embodiments B-20 and B-21. As shown in FIG. 47, it is characterized in that sealing part 19 for sealing luminous element 2 by filling up hollow 16a formed on one surface (the upper surface in FIG. 47) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, salt fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiments B-20 and B-21 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. That is, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

Meanwhile, phosphor parts 3B may be formed spherical with diameters a little larger than the visible wavelengths and a large number of them may be dispersed in a solid medium 35 made of light-transmissible material, as shown in FIG. 48, unlike the above embodiments, in which phosphor part 3B is processed into respective desired forms. By using this phosphor parts 3B in place of the phosphor parts described above, the amount of the material used for the phosphor part can be reduced while maintaining transparency of the phosphor part with respect to the visible wavelength range, which also leads to cost reduction.

Of course, a plurality of luminous elements 2 may constitute one unit of module and a phosphor part as luminous material may be disposed close to, at least a part of, the module, unlike the above embodiments, in which light emitting device 1B has only one luminous element 2. In such a case, for example for a light emitting device provided with mold part 11 in a shell-type shape, like the one described in Embodiment B-1, a plurality of light emitting devices may be mounted on the same printed board so as to constitute one unit of module. As another example, for a surface-mount type light emitting device, like the one described in Embodiment B-2, a plurality of luminous elements 2 may be mounted on the same insulating substrate 16 so as to constitute one unit of module.

[Application of Semiconductor Light-Emitting Device Member]

The portion to which the semiconductor light-emitting device member of the present invention is applied in the light emitting devices (semiconductor light-emitting devices) 1A and 1B, of each Embodiment A-1, A-2, and B-1 to B-40 described above, is not particularly limited. In the above embodiments, the semiconductor light-emitting device member of the present invention is applied, as an example, as transparent member 3A, or as phosphor parts 3B, 33, 34. However, as other examples, the semiconductor light-emitting device member of the present invention can also be suitably used as members constituting the above-mentioned mold part 11, frame 18, sealing part 19 and the like. By using the semiconductor light-emitting device member of the present invention as these members, it becomes possible to obtain the above-mentioned various advantageous effects such as superior sealing properties, transparency, light resistance, heat resistance, film-formation capability and suppression of crack generations and peelings accompanying a long-term use.

When applying the semiconductor light-emitting device member of the present invention, it is preferable to make a modification thereto as appropriate, which is suitable for the portion to which the present invention is applied. For example, when the present invention is applied to phosphor part 3B, 33 or 34, the above-mentioned phosphor components such as phosphor particles, phosphor ions and fluorescent dyes may be mixed into the semiconductor light-emitting device member of the present invention. Such modification brings about an advantageous effect of enhancing retention capacity of the phosphor, in addition to the above-mentioned various advantageous effects.

Since the semiconductor light-emitting device member of the present invention is highly durable, the member can seal a luminous element (such as an LED chip) as a sealing material (, which is used as inorganic adhesive) superior in light resistance (UV resistance) and heat resistance, even when the member is used alone without including a phosphor.

If the above-mentioned inorganic particles are mixed into the semiconductor light-emitting device member of the present invention, it becomes possible to obtain the advantageous effects mentioned above in the explanation for the combined use of inorganic particles, in addition to the above-mentioned various advantageous effects. Particularly, by the combined use of inorganic particles, a semiconductor light-emitting device member of the present invention adjusted to have a refractive index close to that of the luminous element can act as a suitable light extracting film.

[Uses or the Like of Semiconductor Light-Emitting Device]

The semiconductor light-emitting device can be used, for example, for a light emitting device. In order to use the semiconductor light-emitting device for a light emitting device, it is possible to place a phosphor-containing layer containing a mixture of red phosphor, blue phosphor and green phosphor, over a light source. In this case, it is not always necessarily for the red, blue and green phosphors to be mixed in the same layer, and, for example, a layer containing the red phosphor may be stacked on the top of a layer containing the blue and green phosphor.

In a light emitting device, a phosphor-containing layer can be provided over the light source. The phosphor-containing layer can be provided as a contact layer located between the light source and sealing-resin part, as a coating layer located outside the sealing resin part or as a coating layer located inside an outside cap. The sealing resin may contain a phosphor.

As the sealing resin to be used, the semiconductor light-emitting device member of the present invention can be used. Or otherwise, other kinds of resins can also be used. As such kinds of resins can be cited usually thermoplastic resin, thermosetting resin, light curing resin and the like. More specifically, the examples include: methacrylic resin such as polymethacrylate methyl; styrene resin such as polystyrene, styrene-acrylonitrile copolymers; polycarbonate resin; polyester resin; phenoxy resin; butyral resin; polyvinyl alcohol; cellulose resin such as ethyl cellulose, cellulose acetate, and cellulose acetate butyrate; epoxy resin; phenol resin; and silicone resin. Also, inorganic material, for example, metal alkoxide and ceramic precursor polymer, a solution obtained after hydrolysis/polymerization of a solution containing metal alkoxide by the sol gel method, or inorganic material obtained by curing a combination of such inorganic material such as inorganic material containing siloxane bond may be used. Sealing resins may be used either as a single kind of them or as a mixture of more than one kind in any combination and in any ratio.

The amount of phosphor to be used, to the sealing resin, is not particularly limited. However, it is usually 0.01 weight parts or more, preferably 0.1 weight parts or more, more preferably 1 weight parts or more, and usually 100 weight parts or less, preferably 80 weight parts or less, more preferably 60 weight parts or less, with respect to 100 weight parts of sealing resin.

The sealing resin may contain substances other than phosphors or inorganic particles. These substances include a dye used for correcting color tone, antioxidant, processing oxidation and heat stabilizer such as phosphorus processing stabilizer, light-resistant stabilizer such as UV absorbing agent and silane coupling agent. These substances can be used either as a single kind or as a mixture of more than one kind in any combination and in any ratio.

No particular limitation is imposed on the light source, but the one having peak wavelength in the range of 350 nm to 500 nm can be preferably used. Concrete examples of the light source include a light-emitting diode (LED) and laser diode (LD). Of these, GaN LED and GaN LD, using GaN compound semiconductors, are preferable. This is because GaN LED and GaN LD have light output and external quantum efficiency of far greater than those of SiC LED which emits the light in this range and therefore they can give very bright luminescence with very low electric power when used in combination with the above-mentioned phosphors. For example, for current load of 20 mA, GaN LED and GaN LD usually have emission intensity 100 times or higher than that of SiC LED. Among GaN LEDs and GaN LDs, the one having an $Al_XGa_YN$ luminous layer, GaN luminous layer or $In_XGa_YN$ luminous layer is preferable. Among GaN LEDs, the one having $In_XGa_YN$ luminous layer is particularly preferable because emission intensity thereof is very high. Among GaN LDs, the one having a multiple quantum well structure of $In_XGa_YN$ luminous layer and GaN luminous layer is particularly preferable because emission intensity thereof is very high.

The value of X+Y shown above usually takes a value in the range of 0.8 to 1.2. A GaN LED having such kind of luminous layer, doped with Zn or Si or without any dopant, is preferable when adjusting luminescent characteristics.

GaN LED contains a such kind of luminous layer, p layer, n layer, electrode and substrate, as its basic components. Of these, the one having a heterostructure in which a luminous layer is sandwiched by layers such as n-type and p-type $Al_XGa_YN$ layer, GaN layer and $In_XGa_YN$ layer is preferable because it can have high emission efficiency. Moreover, the one whose heterostructure is replaced by a quantum well structure is more preferable because it can have higher emission efficiency.

The light emitting device emits white light. The emission efficiency of the light emitting device is 20 lm/W or more, preferably 22 lm/W or more, more preferably 25 lm/W or more, and particularly preferably 28 lm/W or more. The general color rendering evaluation index Ra thereof is 80 or more, preferably 85 or more, and more preferably 88 or more.

The light emitting device can be used as various kinds of lighting systems and an image display device, for example, a lighting lamp, a back-lighting for liquid crystal panel or the like, ultra-thin-type lighting system, by using it alone or a plurality of them in combination.

EXAMPLE

The present invention will be described more specifically below by using some examples, but these examples are for explaining the present invention and do not intend to limit the present invention to these aspects.

[I. Analysis Method]

Analyses were performed according to the following procedure for semiconductor light-emitting device members of each Example and each Comparative Example described later.

[I-1. Solid Si-Nmr Spectrum Measurement]

The solid Si-NMR spectrum measurement and waveform separation analysis of the semiconductor light-emitting device member of each Example and each Comparative Example were performed under the following conditions. The half width of each peak and the ratio of the silanol content were determined for the semiconductor light-emitting device member of each Example and each Comparative Example, from the obtained waveform data.

<Device Conditions>

Device: Infinity CMX-400 nuclear magnetic resonance spectroscope manufactured by Chemagnetics Co.

$^{29}$Si resonance frequency: 79.436 MHz

Probe: 7.5 mm φ CP/MAS probe

Temperature: Room temperature

Rotational frequency of sample: 4 kHz
Measurement method: Single pulse method
$^1$H decoupling frequency: 50 kHz
$^{29}$Si flip angle: 90°
$^{29}$Si 90° pulse width: 5.0 μs
Repetition time: 600 s
Total count: 128 times
Observation width: 30 kHz
Broadening factor: 20 Hz
<Data Processing Method>

For the semiconductor light-emitting device member of Example 1 and Comparative Examples 1 and 3, 512 points were taken in as measured data and zero-filled to 8192 points, and then Fourier transformation was performed. For the semiconductor light-emitting device member of Comparative Example 2, composed of silicone resin, 2048 points were taken in as measured data, because its peak was very sharp, and zero-filled to 8192 points, and then Fourier transformation is performed.

<Waveform Separation Analysis Method>

For each peak after Fourier transformation, an optimization calculation as performed by the nonlinear least square method using the center position, height, and half width of a peak shape, created by a Lorentz waveform, Gauss waveform or a mixture of both, as variable parameters.

For identification of a peak, AIChE Journal, 44(5), p. 1141, 1998 or the like was referred to.

[I-2. Measurement of the Ratio of Total Content of Specific Metal Elements]

The ratio of the total content of the specific metal elements (Si, Al, Zr, Ti, Y, Nb and B) was calculated by summing up the content of each element, which was measured by the methods (a) and (b) described in the following.

(a) Measurement of the Ratio of Silicon Content:

A singly cured product of the semiconductor light-emitting device member of each Example and each Comparative Example was ground to pieces of about 100 μm and kept in a platinum crucible in the air at 450° C. for 1 hour and then at 750° C. for 1 hour and at 950° C. for 1.5 hours for burning. After removal of carbon components, the small amount of residue obtained was added with a 10-fold amount or more of sodium carbonate, and then heated by a burner to melt it. Then the melted product was cooled and added with desalted water, being diluted to several ppm in silicon while adjusting pH value to around neutrality using hydrochloric acid. Then the ICP spectrometry was performed.

(b) Measurement of the Ratio of Content of Metals Other than Silicon:

A singly cured product of the semiconductor light-emitting device member of each Example and each Comparative Example was ground to pieces of about 100 μm and kept in a platinum crucible in the air at 450° C. for 1 hour and then at 750° C. for 1 hour and at 950° C. for 1.5 hours for burning. After removal of carbon components, the small amount of residue obtained was added with fluorinated acid, and then heated in order to desiccate it. Then the residue was dissolved with diluted sulfuric acid and added with desalted water, being diluted to several ppm in each metal element. Then the ICP emission spectrometry was performed using the obtained solution.

[I-3. Measurement Of Refractive Index]

A singly cured product of the semiconductor light-emitting device member of each Example and each Comparative Example was ground to pieces of about several tens of micrometers and was observed under natural light after dispersed in a refractive index standard solution (refractive solution) with a refractive index of the binder close to the anticipated refractive index. Refractive index was defined as the one of the liquid in which the floating powders came to be transparent and of no light scattering in the results and could not recognized by visual inspection (liquid immersion method).

[I-4. Measurement Of Transmittance]

Transmittance was measured using a singly cured film of the semiconductor light-emitting device member, of each Example and each Comparative Example, with a smooth surface of about 0.5 mm in thickness and without scattering by defects or unevenness, by means of an ultraviolet spectrophotometer (UV-3100 manufactured by Shimadzu Corporation) at wavelengths of 300 nm to 700 nm. Table 2 shows the transmittances at wavelength of 400 nm.

[I-5. Heat Test]

A sample of 5 cm in diameter and about 1.0 mm in film thickness of each semiconductor light-emitting device member of Example and Comparative Example, prepared by using a Teflon (registered trademark) petri dish, was kept in a forced-air drier at temperature of 200° C.

[I-6. Uv Test]

A sample of 5 cm in diameter and about 1.0 mm in film thickness of each semiconductor light-emitting device member of Example and Comparative Example, prepared by using a Teflon (registered trademark) petri dish, was used. The sample was irradiated with ultraviolet rays under the following conditions and the film conditions before and after the irradiation were compared.

Condition: A mercury-xenon lamp UV irradiation device (Aicure SPOT TYPE ANUP5204, manufactured by Matsushita Electric Works, Ltd., 28000 W/m$^2$ of output at light exiting surface of the optical fiber), incorporated with UV cut filter for cutting out wavelength of 385 nm or shorter. Irradiation was performed for 24 hours without gaps neither between end of the irradiation fiber and the UV cut filter nor between the filter and the surface of the sample. The measurement value of illumination intensity of the light radiated on the irradiated surface was 4500 W/m$^2$, by measuring with 436-nanometer light receiving element illuminance meter (UVD-436PD, manufactured by Ushio Inc., sensitivity wavelength range of 360 nm to 500 nm).

The illuminance meter, used for illumination intensity measurement of the light-receiving surface of the sample, should be calibrated using a standard light source, having an evaluated illumination intensity based on national/international standards or should be indirectly calibrated using a referential light source or illuminance meter, having a value transferred from the standard light source, according to JISZ8103, "standard instruments or measuring instruments are calibrated in order based on the higher measurement standard and the path leading to national/international standards is achieved". The deterioration can be evaluated relatively by visual inspection when the change is evident by visual inspection. When the difference in the results is very subtle, existence or nonexistence of the change can be determined numerically by using such means complementarily as measurements of transmittance or yellowness index (YI value) by means of transmittance meter or microspectroscope, measurement of turbidity by means of hazemeter or quantification of chromaticity by means of calorimeter. In these measurement means, when the area of ultraviolet-ray irradiated surface of the sample is minute due to such means as spot irradiation, an apparatus that can measure even with such minute area of irradiated surface should be selected.

[I-7. Method Of Evaluating Adhesion]

(1) A hydrolyzed/polycondensated liquid (liquid for forming the semiconductor light-emitting device member) before curing of each semiconductor light-emitting device member of Example and Comparative Example was dropped into a copper cup whose surface is Ag-plated with a diameter of 9 mm and a depth at the recess of 1 mm and then cured under a predetermined curing conditions to prepare a sample for measurement (semiconductor light-emitting device member).

(2) The obtained samples for measurement were placed on an aluminum plate, applied with a thin layer of silicone grease for heat release, of 1 mm thickness, 25 mm length and 70 mm width, and made to absorb moisture in an atmosphere (hereinafter referred to as "moisture absorption environment" as appropriate) of temperature 85° C. and humidity 85% for 1 hour.

(3) The samples for measurement, which absorbed moisture, were taken out from the moisture absorption environment of above (2) and then cooled (20° C. to 25° C.). The samples for measurement, which absorbed moisture and were cooled to room temperature, were put on a hot plate, whose temperature was set at 260° C., together with the aluminum plate and kept for 1 minute. Under this condition, the temperature of the samples for measurement itself reached 260° C. in 50 seconds, and then they were kept at 260° C. for 10 seconds.

(4) The samples after heated were then put on a cooling plate, made of stainless and kept at room temperature, together with the aluminum plate to cool them to room temperature. Then the existence of peelings of the samples for measurement from the above-mentioned copper cup were observed both by visual inspection and microscope. The sample observed to have even a little peeling was labeled as "peeling generated".

(5) The ratio of peeling of the above samples for measurement were determined by conducting the above operations (2), (3) and (4) with 10 samples for measurement. In this context, the ratio of peeling can be calculated as "the number of samples for measurement in which a peeling is generated/the total number of samples for measurement".

[I-8. Brightness Improvement Rate Test]

A semiconductor light-emitting device was prepared using the sealant liquid obtained in Example and Comparative Example. LED chips having face-up type GaN semiconductors of 405 nm and 460 nm emission peak wavelengths, as luminous layer, were used. Different semiconductor light-emitting device were prepared, having the above different LED chips respectively. A driving current of 20 mA was passed through each semiconductor light-emitting device, and their brightnesses before and after the sealing were compared. The brightness improvement ratio was calculated by the formula below.

Brightness improvement ratio=(brightness after the sealing/brightness before the sealing)×100(%)

In the above test, the semiconductor light-emitting devices were prepared by the following procedure. Namely, a surface-mount type LED element 103, comprised of a cup 101 and an LED chip 102, was first prepared as LED light source, as shown in FIG. 50. Cup 101 was formed of polyphthalamide, and an electrode (not shown) was provided on the bottom thereof. LED chip 102 was then attached by die bonding on the surface of the electrode that is inside cup 101, using die bonding device ("Manual Die Bonder" manufactured by Westbond) and epoxy resin as die bonding agent. Another electrode (not shown), provided on LED chip 102 was electrically connected to the electrode of cup 101 by wire bonding using a wire bonder "MB-2200" manufactured by Nippon Avionics Co., Ltd. with gold wire. The hydrolyzed/polycondensated liquid, prepared in Example and Comparative Example, was dropped using a micro pipet in cup 101 until the height thereof reached the upper edge of the cup. Then the sealant liquid was cured under a predetermined temperature condition, so as to obtain a semiconductor light-emitting device comprising a transparent sealing layer (semiconductor light-emitting device member).

[I-9. Addition type catalyst content ratio Determining test]

By using a sample of semiconductor light-emitting device member produced, the ratio of total content of Pt and Rh in the sample was measured by the same method as the one for measuring the content of specific metal elements other than ratio of silicon.

[II. Producing of semiconductor light-emitting device Member]

Example 1

Phenyltrimethoxysilane, 6.7 g, dimethyldimethoxysilane, 2.0 g, water, 1.5 g, titanium sol, having silica zirconia coating with particle diameter of 5 nm, as refractive index adjusting agent, 28.0 g (methanol dispersion with 20 weight % solid portion), and 5% methanol solution of acetylacetone aluminum salt, 1.80 g as catalyst were transferred to a vessel that can be closed tightly, and, after tight closure, the mixture was heated in a hot water bath at 50° C. for 8 hours under stirring with a stirrer. The mixture was then returned to room temperature and a hydrolyzed/polycondensated liquid was thus prepared. The ratio of hydrolysis of this liquid was 120%.

The above hydrolyzed/polycondensated liquid, 4.1 ml was placed in a Teflon (registered trademark) petri dish with the diameter of 5 cm and the petri dish was kept in an explosion-proof furnace in a gentle breeze at 40° C. for 4 hours. After that, the temperature was raised from 40° C. to 65° C. in 3 hours to perform the first drying, and then kept at 150° C. for 3 hours to perform the second drying. By this procedure, an independent, circular, and semitransparent glass film with thickness of about 0.5 mm was obtained. With this sample, the above-mentioned transmittance measurement, heat test and UV test were performed. Further, this sample was pounded in a mortar, and the Solid Si-NMR spectrum, refractive index and the ratio of content of specific metal elements were measured. Furthermore, using the hydrolyzed/polycondensated liquid obtained in the process of producing the circular semi-transparent glass film, rate of peeling was measured by the method of evaluating adhesion, and rate of improvement in brightness after elapse of 500 hours was measured by a continuous lighting test. The ratio of content of Pt and Rh in the sample was also measured by the addition type catalyst content rate determining test. The results are shown in Table 2.

Example 2

Double-ended silanol dimethyl silicone oil (XC96-723 manufactured by Toshiba Silicones Co., Ltd.), 50.0 g, phenyltrimethoxysilane, 5.0 g, and zirconium tetra n-propoxide solution (5 weight parts of 75 weight % n-propanol solution of zirconium tetra n-propoxide was diluted with 95 weight parts of toluene), 11.0 g, as a catalyst were weighed into a three-necked flask fitted with a capacitor and stirrer, and the mixture was stirred at room temperature for 15 minutes under atmospheric pressure to perform initial hydrolysis. The mixture was then heated under stirring at about 50° C. for 8 hours. And then the reaction solution was allowed to cool to room temperature, transferred to a round-bottomed flask, and the solvent, alcohol and water produced during the reaction, and silicone component of low boiling point were distilled off using an evaporator at 50° C. and 1 mPa for 30 minutes to obtain a sealant liquid without solvent. Zirconia particle powder (the ratio of content of $ZrO_2$: 73 weight %, average particle diameter when dispersed in solvent: 4 nm), surface-treated with caprylic acid for hydrophobization, 1.0 g, was weighed into a round-bottomed flask fitted with a condenser tube of 50 ml, and toluene, 10 g, was added to obtain a completely solubilized to transparent liquid. Diphenyldimethoxysilane (AZmax), 0.1 g, was further added and the mixture was heated under stirring at 90° C. for 3 hours in a nitrogen atmosphere. The solution was cooled and 3.9 g of the above sealant liquid was added. White turbidity was temporarily observed but soon a transparent solution resulted. This solution was further heated under stirring at 90° C. for 3 hours in a nitrogen atmosphere, and then the solvent was distilled off in vacuo at 50° C. An organic/inorganic hybrid sealant was thus prepared. This liquid, 2 g was placed in a Teflon (registered trademark) petri dish with the diameter of 5 cm and the petri dish was held at 110° C. for 1 hour and then 150° C. for 3 hours in an explosion-proof furnace under a mild stream of air. By this procedure, an independent, circular, and elastomer-like transparent film with thickness of about 1 mm was obtained.

With this sample, the above-mentioned transmittance measurement, heat test and UV test were performed. Further, this sample was pounded in a mortar, and the Solid Si-NMR spectrum, refractive index and content of specific metal elements were measured. Furthermore, using the hydrolyzed/polycondensated liquid obtained in the process of producing the circular semitransparent glass film, rate of peeling was measured by the method of evaluating adhesion, and rate of improvement in brightness was measured by the brightness improvement rate test. The ratio of content of Pt and Rh in the sample was also measured by the addition type catalyst content rate determining test. The results are shown in Table 2.

Example 3

Double-ended silanol dimethyl silicone oil (XC96-723, manufactured by GE Toshiba Silicones Co., Ltd.), 70 g, double-ended silanol methylphenyl silicone oil YF3804, 70 g, phenyltrimethoxysilane, 14 g, and zirconium tetraacetylacetonate powder, 0.308 g, as a catalyst, were weighed into a three-necked flask fitted with a stirrer and condenser, and the mixture was stirred thoroughly for 15 minutes at room temperature until the catalyst dissolved completely. Thereafter, the reaction solution was heated until the temperature reached 120° C. and kept at this temperature under total reflux for 2 hours, while stirring, for initial hydrolysis.

Then, nitrogen gas was blown in by means of SV20, and methanol formed, water and silicone components of low boiling point, produced as by-products, were distilled off, while stirring was continued at 120° C., to conduct polymerization reaction further for 6 hours.

Nitrogen gas was stopped and the reaction solution was cooled to room temperature and transferred to a round-bottomed flask. Then the methanol, water and silicone components of low boiling point, which were just a little amount of residues, were distilled off at 120° C., 1 kPa and for 20 minutes in an oil bath using a rotary evaporator. A sealant liquid without solvent was thus obtained.

This liquid, 2 g was placed in a Teflon (registered trademark) petri dish with the diameter of 5 cm and the petri dish was held at 110° C. for 1 hour and then 150° C. for 3 hours in an explosion-proof furnace under a mild stream of air. By this procedure, an independent, circular, and elastomer-like transparent film with thickness of about 1 mm was obtained.

With this sample, the above-mentioned transmittance measurement, heat test and UV test were performed. Further, this sample was pounded in a mortar, and the Solid Si-NMR spectrum, refractive index and the ratio of content of specific metal elements were measured. Furthermore, using the hydrolyzed/polycondensated liquid obtained in the process of producing the circular semitransparent glass film, rate of peeling was measured by the method of evaluating adhesion, and rate of improvement in brightness was measured by the brightness improvement rate test. The ratio of content of Pt and Rh in the sample was also measured by the addition type catalyst content rate determining test. The results are shown in Table 2.

Comparative Example 1

Methyl silicate (MKC silicate MS51 manufactured by Mitsubishi Chemical Corporation) 30.80 g, methanol 56.53 g, water 6.51 g, titanium sol, having silica zirconia coating with particle diameter of 5 nm, as refractive index adjusting agent 19.6 g (methanol dispersion with 20 weight % solid portion), and 5% methanol solution of acetylacetone aluminum salt 6.16 g as catalyst were transferred to a vessel that can be closed tightly and then mixed. After tight closure, the mixture was heated in a hot water bath at 50° C. for 8 hours under stirring and then returned to room temperature. A hydrolyzed/polycondensated liquid was thus prepared. The ratio of hydrolysis of this liquid was 113%.

The above-mentioned hydrolyzed/polycondensated liquid 10 ml was placed in a Teflon (registered trademark) petri dish of 5 cm in diameter and dried under the same condition as in Example 1, and a glass film of about 0.3 mm in thickness was obtained. However, in the process of its drying, a large amount of cracks was generated and the glass film broke into pieces, and a circular, transparent glass film could not be isolated. By using this film, the Solid Si-NMR spectrum, refractive index and the ratio of content of specific metal elements were measured. Furthermore, using the hydrolyzed/polycondensated liquid obtained in the process of producing the circular semitransparent glass film, rate of peeling was measured by the method of evaluating adhesion, and rate of improvement in brightness was measured by the brightness improvement rate test. The content of Pt and Rh in the sample was also measured by the addition type catalyst content rate determining test. The results are shown in Table 2.

Comparative Example 2

Commercially available silicone resin (JCR6101UP manufactured by Toray Dow Corning Company, Limited) which is used as molding agent to be used for a semiconductor light-emitting device was applied onto a Teflon (registered trademark) plate using an applicator, and, after vacuum deaeration at 25° C. for 1 hour, was cured by heating at 150° C. for 2 hours. An elastomer-like film with the thickness of about 1.0 mm was obtained by peeling off the film from the Teflon plate. This film was subjected to the UV test, heat test and transmittance measurement. The above-mentioned measurements of solid Si-NMR spectrum, refractive index and the ratio of content of specific metal elements were performed using a sample obtained by crushing the film sample by means of a freezer mill. Furthermore, using the above-mentioned silicone resin, rate of peeling was measured by the method of evaluating adhesion, and rate of improvement in brightness was measured by the brightness improvement rate test. The content of Pt and Rh in the sample was also measured by the addition type catalyst content rate determining test. The results are shown in Table 2.

Comparative Example 3

Commercially available two-component curing aromatic epoxy resin which is used as molding agent to be used for a semiconductor light-emitting device was transferred into a Teflon (registered trademark) petri dish of 5 cm in diameter and, after vacuum deaeration at 25° C. for 1 hour, was cured by heating at 120° C. for 4 hours. By this procedure, a bluish, circular and transparent resin film with thickness of about 1.0 mm was obtained as an independent film. This film was subjected to the UV test, heat test and transmittance measurement. The above-mentioned measurements of solid Si-NMR spectrum, refractive index and the ratio of content of specific metal elements were performed using a sample obtained by crushing this film sample by means of a freezer mill. Furthermore, using the above-mentioned two-component curing aromatic epoxy resin, rate of peeling was measured by the method of evaluating adhesion, and rate of improvement in brightness was measured by the brightness improvement rate test. The content of Pt and Rh in the sample was also measured by the addition type catalyst content rate determining test. The results are shown in Table 2.

Comparative Example 4

Commercially available silicone resin (IVS5332 manufactured by GE Toshiba Silicones Co., Ltd.) which is used as molding agent to be used for a semiconductor light-emitting device was transferred into a Teflon (registered trademark) petri dish of 5 cm in diameter and, after vacuum deaeration at 25° C. for 1 hour, was cured by heating at 150° C. for 1 hour. An elastomer-like film with the thickness of about 1.0 mm was obtained by peeling off the film from the Teflon petri plate. This film was subjected to the UV test, heat test and transmittance measurement. The above-mentioned measurements of solid Si-NMR spectrum, refractive index and the ratio of content of specific metal elements were performed using a sample obtained by crushing the film sample by means of a freezer mill. Furthermore, using the above-mentioned silicone resin, rate of peeling was measured by the method of evaluating adhesion, and rate of improvement in brightness was measured by the brightness improvement rate test. The content of Pt and Rh in the sample was also measured by the addition type catalyst content rate determining test. The results are shown in Table 2.

Comparative Example 5

Silicone resin used in Comparative Example 2, 10 g, was mixed with zirconia sol particle powder, surface-treated for hydrophobization and used in Example 2, 2 g, and cured at 150° C. for 2 hours but no curing occurred. The reason was considered to be that the platinum complex, which is a curing catalyst of silicone resin, was deactivated by the reaction with caprylic acid, which was used for surface treatment of zirconia sol, and did not function as curing catalyst. In general, in order to disperse metal oxide particles having high refractive indexes in resin, ligands such as organic acid and detergents are often used for surface treatment of particles, for the purpose of hydrophobization or improvement in dispersibility. The semiconductor light-emitting device member of the present invention is not inhibited of curing by such ligands and wide selection of surface treatment method is, therefore, possible.

SUMMARY

As shown in the following Table 2, the semiconductor light-emitting device members of Examples 1 to 3, satisfying requirements of the present invention, has a structure comprised mainly of inorganic components with metalloxane bonds and not only excel in heat resistance and UV resistance, but also is less likely to generate cracks and thus easy to form in a thick film, compared with the semiconductor light-emitting device member of Comparative Example 1, which was made of only tetrafunctional silane. In addition, since nano particles of metal oxides having high refractive indexes can be dispersed easily therein, compared with conventional resins such as epoxy resin and silicone resin, and thus the refractive index thereof can be adjusted easily, the semiconductor light-emitting device members of Examples 1 to 3 can be used as useful light-extracting materials.

TABLE 2

Results of Example and Comparative Example

| | | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| Solid Si-NMR | 0 to −40 (ppm) | two or more | two or more | two or more | 0 | one | 0 | two or more | (**) |
| | −40 to −80 (ppm) | two or more | two or more | two or more | 0 | 0 | 0 | two or more | (**) |
| The ratio of silicon content (weight %) | | 13 | 30 | 31 | 35 | 38 | 0 | 22 | (**) |
| Refractive index | | 1.63 | 1.47 | 1.47 | 1.52 | 1.41 | 1.53 | 1.53 | (**) |
| The ratio of silanol content (weight %) | | 0.6 | 0.5 | 0.6 | 12 | 0 | 0 | 0 | (**) |
| The ratio of content of specific metal elements other than silicon (weight %) | | 33 | 10 | 0.1 | 12 | 0 | 0 | 0 | (**) |
| The ratio of silicon and specific metal elements (weight %) | | 46 | 40 | 31 | 47 | 38 | 0 | 22 | (**) |
| Whether addition type catalyst is contained or not (○ = The content of Pt and Rh is less than 0.1 ppm, x = 0.1 ppm or more) | | ○ | ○ | ○ | ○ | x | ○ | X | (**) |
| Transmittance (%) at 400 nm | | 62 | 89 | 87 | (*) | 70 | 84 | 71 | (**) |

TABLE 2-continued

Results of Example and Comparative Example

| | | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| Heat resistance at 200° C. for 500 hr | Weight maintenance rate (%) | 95 | 82 | 94 | (*) | 94 | 80 | 81 | (**) |
| | Transmittance maintenance rate at 400 nm(%) | 93 | 83 | 100 | (*) | 93 | 0 | 60 | (**) |
| UV resistance (irradiated with beam) 2800 mW, for 24 hr, with filter cutting out 385 nm or shorter; by visual inspection | | no change | no change | no change | (*) | slight white-turbidity | carbonization | yellowing and crack generation | (**) |
| Adhesion (reflow test) metal, rate of peeling (%) | | 90 | 10 | 0 | (*) | 20 | 80 | 50 | (**) |
| Rate of improvement in brightness at 405 nm (%) | | 68 | 151 | 152 | (*) | 131 | 132 | 165 | (**) |
| Rate of improvement in brightness at 460 nm (%) | | 135 | 158 | 162 | (*) | 145 | 152 | 172 | (**) |

(*) Not measurable because the sample was crushed into pieces
(**) Not measurable because the sample was not cured

INDUSTRIAL APPLICABILITY

The semiconductor light-emitting device member of the present invention is not particularly limited in its use and can be used preferably for various purposes represented by a member for sealing (namely, a sealant) a semiconductor light-emitting device or the like.

The present invention has been explained in detail above with reference to specific embodiments. However, it is evident to those skilled in the art that various modifications can be added thereto without departing from the intention and the scope of the present invention.

The present application is based on Japanese Patent Application (No. 2005-276756) filed on Sep. 22, 2005 and Japanese Patent Application (No. 2006-256973) filed on Sep. 22, 2006, and their entireties are incorporated herewith by reference.

The invention claimed is:

1. A semiconductor light-emitting device member, wherein
(1) the semiconductor light-emitting device member comprises a functional group capable of forming a hydrogen bond with a hydroxyl group or an oxygen in a metalloxane bond,
(2) the maintenance rate of transmittance in a thickness of 1 mm with respect to the light having a wavelength of 400 nm before and after being left at temperature of 200° C. for 500 hours is 80% or more and 110% or less,
(3) no change is observed by visual inspection after being irradiated with light having a wavelength range of longer than 385 nm and 500 nm or less, whose center wavelength is located at between 400 nm and 450 nm both inclusive, for 24 hours with illumination intensity of 4500 W/m² with respect to the wavelength of 436 nm, and
(4) the refractive index with respect to the light having 550 nm wavelength is 1.45 or larger.

2. A semiconductor light-emitting device member, wherein
(5) in the solid Si-nuclear magnetic resonance spectrum, the semiconductor light-emitting device member comprises at least one peak selected from a group consisting of
(i) a peak whose peak top position is in an area of a chemical shift of −40 ppm or more and 0 ppm or less, and whose half width is 0.3 ppm or more and 3 ppm or less, and
(ii) a peak whose peak top position is in an area of a chemical shift of −80 ppm or more and less than −40 ppm, and whose half width is 0.3 ppm or more and 5 ppm or less,
(4) the refractive index with respect to the light having 550 nm wavelength is 1.45 or larger, and
(2) the maintenance rate of transmittance in a thickness of 1 mm with respect to the light having a wavelength of 400 nm before and after being left at temperature of 200° C. for 500 hours is 80% or more and 110% or less.

3. A semiconductor light-emitting device member, wherein
(5) in the solid Si-nuclear magnetic resonance spectrum, the semiconductor light-emitting device member comprises at least one peak selected from a group consisting of
(i) a peak whose peak top position is in an area of a chemical shift of −40 ppm or more and 0 ppm or less, and whose half width is 0.3 ppm or more and 3 ppm or less, and
(ii) a peak whose peak top position is in an area of a chemical shift of −80 ppm or more and less than −40 ppm, and whose half width is 0.3 ppm or more and 5 ppm or less,
(4) the refractive index with respect to the light having 550 nm wavelength is 1.45 or larger, and
(6) the silanol content is 0.01 weight % or more and 10 weight % or less.

4. A semiconductor light-emitting device member, wherein
(5) in the solid Si-nuclear magnetic resonance spectrum, the semiconductor light-emitting device member comprises at least one peak selected from a group consisting of
(i) a peak whose peak top position is in an area of a chemical shift of −40 ppm or more and 0 ppm or less, and whose half width is 0.3 ppm or more and 3 ppm or less, and
(ii) a peak whose peak top position is in an area of a chemical shift of −80 ppm or more and less than −40 ppm, and whose half width is 0.3 ppm or more and 5 ppm or less, (4) the refractive index with respect to the light having 550 nm wavelength is 1.45 or larger, and (7) the total content of Pt and Rh is 0.1 ppm or less.

5. The semiconductor light-emitting device member according to claim 2, further comprising:

a plurality of the peaks.

6. The semiconductor light-emitting device member according to claim 1, wherein (8) the total content of Si, Al, Zr, Ti, Y, Nb and B is 20 weight % or more.

7. The semiconductor light-emitting device member according to claim 1, wherein the light transmittance with respect to a luminous wavelength of a semiconductor light-emitting device, when the film thickness is 1.0 mm, is 60% or more.

8. The semiconductor light-emitting device member according to claim 1, further comprising:

inorganic particles.

9. A producing method of a semiconductor light-emitting device member according to claim 1, comprising:

a process of drying a polycondensate obtained by performing hydrolysis and polycondensation of a compound represented by the following formula (1) and/or an oligomer thereof $$M^{m+}X_n Y^1_{m-n} \quad (1)$$

wherein

M represents at least one element selected from silicon, aluminum, zirconium, and titanium, X represents a hydrolyzable group, $Y^1$ represents a monovalent organic group, m represents an integer of 1 or larger representing the valence of M, and n represents an integer of 1 or larger representing the number of X groups, where m≧n.

10. A producing method of a semiconductor light-emitting device member according to claim 1, comprising:

a process of drying a polycondensate obtained by performing hydrolysis and polycondensation of a compound represented by the following formula (2) and/or an oligomer thereof $$(M^{s+}X_t Y^1_{s-t-1})_u Y^2 \quad (2)$$

wherein

M represents at least one element selected from silicon, aluminum, zirconium, and titanium, X represents a hydrolyzable group, $Y^1$ represents a monovalent organic group, $Y^2$ represents a u-valent organic group, s represents an integer of 1 or larger representing the valence of M, t represents an integer of 1 or larger and s-1 or smaller, and u represents an integer of 2 or larger.

11. The producing method of a semiconductor light-emitting device member, according to claim 9, wherein the ratio of hydrolysis is 80% or more and 500% or less.

12. The producing method of a semiconductor light-emitting device member, according to claim 9, wherein the process of drying the obtained polycondensate has a first drying process in which a solvent is substantially removed at a temperature below the boiling point of the solvent and a second drying process in which the polycondensate is dried at a temperature equal to or above the boiling point of the solvent.

13. The producing method of a semiconductor light-emitting device member, according to claim 9, further comprising:

a process of distilling off the solvent from the polycondensate before the polycondensate is dried.

14. The producing method of a semiconductor light-emitting device member, according to claim 9, wherein the hydrolysis and polycondensation are performed in the presence of a metal complex catalyst.

15. A semiconductor light-emitting device comprising at least a semiconductor light-emitting device member according to claim 1.

16. The producing method of a semiconductor light-emitting device member, according to claim 10, wherein the ratio of hydrolysis is 80% or more and 500% or less.

17. The producing method of a semiconductor light-emitting device member, according to claim 10, wherein the process of drying the obtained polycondensate has a first drying process in which the solvent is substantially removed at a temperature below the boiling point of the solvent and a second drying process in which the polycondensate is dried at a temperature equal to or above the boiling point of the solvent.

18. The producing method of a semiconductor light-emitting device member, according to claim 10, further comprising:

a process of distilling off the solvent from the polycondensate before the polycondensate is dried.

19. The producing method of a semiconductor light-emitting device member, according to claim 10, wherein the hydrolysis and polycondensation are performed in the presence of a metal complex catalyst.

* * * * *